United States Patent
Sakata et al.

(10) Patent No.: US 11,063,009 B2
(45) Date of Patent: Jul. 13, 2021

(54) SEMICONDUCTOR DEVICE

(71) Applicant: Renesas Electronics Corporation, Tokyo (JP)

(72) Inventors: Kenji Sakata, Tokyo (JP); Toshihiko Akiba, Tokyo (JP); Takuo Funaya, Tokyo (JP); Hideaki Tsuchiya, Tokyo (JP); Yuichi Yoshida, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 582 days.

(21) Appl. No.: 15/888,846

(22) Filed: Feb. 5, 2018

(65) Prior Publication Data
US 2018/0294239 A1   Oct. 11, 2018

(30) Foreign Application Priority Data

Apr. 10, 2017   (JP) .............................. JP2017-077264
Jul. 13, 2017   (JP) .............................. JP2017-136892

(51) Int. Cl.
*H01L 23/00*   (2006.01)
*H01L 23/498*   (2006.01)
(Continued)

(52) U.S. Cl.
CPC .......... *H01L 24/13* (2013.01); *H01L 23/3192* (2013.01); *H01L 23/49811* (2013.01);
(Continued)

(58) Field of Classification Search
CPC ... H01L 24/13; H01L 24/16; H01L 23/49816; H01L 2224/02206; H01L 2224/03912; H01L 2224/0401; H01L 2224/05555
See application file for complete search history.

(56) References Cited

U.S. PATENT DOCUMENTS 6,815,255 B2 * 11/2004 Nakaoka ................. H01L 24/29
                                                          438/108
7,709,957 B2   5/2010 Ishii
(Continued)

FOREIGN PATENT DOCUMENTS

JP   2009-164442 A    7/2009
JP   2013-211511 A   10/2013
(Continued)

OTHER PUBLICATIONS

P. Liu, A. Overson, and D. Goyal, "Key Parameters for Fast Ni Dissolution during Electromigration of Sn0.7Cu Solder Joint" 2015 Electronic Components & Technology Conference, pp. 99-105, 2015.
(Continued)

*Primary Examiner* — Zandra V Smith
*Assistant Examiner* — Abbigale A Boyle
(74) *Attorney, Agent, or Firm* — SGPatents PLLC

(57) ABSTRACT

There is a need to improve reliability of the semiconductor device.
A semiconductor device includes a printed circuit board and a semiconductor chip mounted over the printed circuit board. The semiconductor chip includes a pad, an insulation film including an opening to expose part of the pad, and a pillar electrode formed over the pad exposed from the opening. The printed circuit board includes a terminal and a resist layer including an opening to expose part of the terminal. The pillar electrode of the semiconductor chip and the terminal of the printed circuit board are coupled via a solder layer. Thickness $h_1$ of the pillar electrode is measured from the upper surface of the insulation film. Thickness $h_2$ of the solder layer is measured from the upper surface of the resist layer. Thickness $h_1$ is greater than or equal to a half of thickness $h_2$ and is smaller than or equal to thickness $h_2$.

18 Claims, 31 Drawing Sheets

(51) Int. Cl.
*H01L 23/31* (2006.01)
*H01L 23/29* (2006.01)
(52) U.S. Cl.
CPC ........ *H01L 23/49816* (2013.01); *H01L 24/05* (2013.01); *H01L 24/16* (2013.01); *H01L 24/81* (2013.01); *H01L 23/291* (2013.01); *H01L 23/293* (2013.01); *H01L 24/11* (2013.01); *H01L 2224/02206* (2013.01); *H01L 2224/02215* (2013.01); *H01L 2224/0345* (2013.01); *H01L 2224/0362* (2013.01); *H01L 2224/03912* (2013.01); *H01L 2224/0401* (2013.01); *H01L 2224/05014* (2013.01); *H01L 2224/05022* (2013.01); *H01L 2224/05083* (2013.01); *H01L 2224/05124* (2013.01); *H01L 2224/05166* (2013.01); *H01L 2224/05184* (2013.01); *H01L 2224/05186* (2013.01); *H01L 2224/05555* (2013.01); *H01L 2224/05572* (2013.01); *H01L 2224/05573* (2013.01); *H01L 2224/05582* (2013.01); *H01L 2224/05647* (2013.01); *H01L 2224/1147* (2013.01); *H01L 2224/11462* (2013.01); *H01L 2224/11849* (2013.01); *H01L 2224/11901* (2013.01); *H01L 2224/131* (2013.01); *H01L 2224/13005* (2013.01); *H01L 2224/13014* (2013.01); *H01L 2224/13022* (2013.01); *H01L 2224/13082* (2013.01); *H01L 2224/13083* (2013.01); *H01L 2224/13111* (2013.01); *H01L 2224/13147* (2013.01); *H01L 2224/13155* (2013.01); *H01L 2224/14131* (2013.01); *H01L 2224/14133* (2013.01); *H01L 2224/1601* (2013.01); *H01L 2224/16013* (2013.01); *H01L 2224/16058* (2013.01); *H01L 2224/16112* (2013.01); *H01L 2224/16227* (2013.01); *H01L 2224/16237* (2013.01); *H01L 2224/16238* (2013.01); *H01L 2224/1713* (2013.01); *H01L 2224/73204* (2013.01); *H01L 2224/814* (2013.01); *H01L 2224/81048* (2013.01); *H01L 2224/8191* (2013.01); *H01L 2224/81191* (2013.01); *H01L 2224/81193* (2013.01); *H01L 2224/81455* (2013.01); *H01L 2224/81815* (2013.01); *H01L 2224/83192* (2013.01); *H01L 2224/83862* (2013.01); *H01L 2224/92125* (2013.01); *H01L 2224/94* (2013.01); *H01L 2924/15311* (2013.01); *H01L 2924/15313* (2013.01); *H01L 2924/3512* (2013.01)

(56) References Cited

U.S. PATENT DOCUMENTS

| | | | | |
|---|---|---|---|---|
| 8,803,337 | B1* | 8/2014 | Lin | H01L 24/11 257/780 |
| 9,054,093 | B2 | 6/2015 | Ono et al. | |
| 9,159,607 | B2 | 10/2015 | Uno et al. | |
| 9,343,419 | B2* | 5/2016 | Yu | H01L 24/11 |
| 9,349,678 | B2 | 5/2016 | Ono et al. | |
| 9,536,849 | B2 | 1/2017 | Yajima et al. | |
| 9,831,202 | B2* | 11/2017 | Seo | H01L 24/13 |
| 2011/0068465 | A1* | 3/2011 | Shen | H01L 24/16 257/737 |
| 2011/0285013 | A1 | 11/2011 | Chuang et al. | |
| 2012/0025371 | A1* | 2/2012 | Matsui | H01L 24/05 257/737 |
| 2017/0084561 | A1 | 3/2017 | Seo et al. | |

FOREIGN PATENT DOCUMENTS

| | | |
|---|---|---|
| JP | 2014-239155 A | 12/2014 |
| JP | 2016-213222 A | 12/2016 |

OTHER PUBLICATIONS

Extended European Search Report dated Aug. 21, 2018, in European Patent Application No. 18165717.2.

Office Action dated Dec. 1, 2020, in Japanese Patent Application No. 2017-136892.

* cited by examiner

SEMICONDUCTOR DEVICE

CROSS-REFERENCE TO RELATED APPLICATIONS

The disclosure of Japanese Patent Application No. 2017-077264 filed on Apr. 10, 2017 and No. 2017-136892 filed on Jul. 13, 2017 including the specification, drawings and abstract is incorporated herein by reference in its entirety.

The present invention relates to a semiconductor device and is appropriately applicable to a semiconductor device including a semiconductor chip that is flip-chip bonded over a printed circuit board.

BACKGROUND

A semiconductor device can be manufactured by flip-chip bonding a semiconductor chip over a printed circuit board.

Japanese Unexamined Patent Application Publication No. 2013-211511 (patent literature 1) describes the technology concerning a semiconductor device including a Cu pillar formed over an electrode pad of a semiconductor chip and a connection terminal of a printed circuit board coupled with each other by soldering.

Non-Patent Literature 1: P. Liu, A. Overson, and D. Goyal, "Key Parameters for Fast Ni Dissolution during Electromigration of Sn0.7Cu Solder Joint" 2015 Electronic Components & Technology Conference, pp. 99-105, 2015, describes the technology concerning the electromigration at soldered joint parts.

SUMMARY

There is a need to improve reliability of a semiconductor device including a semiconductor chip flip-chip bonded over a printed circuit board.

These and other objects and novel features may be readily ascertained by referring to the following description of the present specification and appended drawings.

According to an embodiment, a semiconductor device includes a printed circuit board and a semiconductor chip mounted over the printed circuit board. The semiconductor chip includes: a first insulation film; a pad formed over the first insulation film; a second insulation including a first opening to expose part of the pad; and a pillar electrode formed over the pad exposed from the first opening. The printed circuit board includes a terminal and a third insulation film including a second opening to expose part of the terminal. The pillar electrode of the semiconductor chip and the terminal of the printed circuit board are coupled via a solder layer. A first thickness of the pillar electrode from the first principal surface of the second insulation film is greater than or equal to half a second thickness of the solder layer from the second principal surface and is smaller than or equal to the second thickness.

The embodiment can improve reliability of the semiconductor device.

DETAILED DESCRIPTION

The description below may divide the embodiment into a plurality of sections or embodiments as needed. Unless explicitly specified, the divisions are not unrelated to each other. One provides a modification, a detailed explanation, or a supplementary explanation about all or part of the others. The number of elements (including the number of items, values, quantities, and ranges) referred to in the following embodiment is not limited to a specific value and may be greater or smaller than or equal to the specific value except the number of elements is explicitly specified or is obviously limited to the specific value in principle. Constituent elements (including element steps) of the following embodiments are unquestionably not required unless explicitly specified or obviously required in principle. Similarly, shapes or positional relation of the constituent elements referred to in the following embodiments include those substantially approximate or similar to the shapes unless explicitly specified and obviously considered different in principle. The same applies to the above-mentioned values and range.

Embodiments will be described in further detail with reference to the accompanying drawings. Members having the same function are given the same reference symbol in all drawings to illustrate the embodiments and a repetitive description is omitted. In the following embodiments, the same or similar part is not repeatedly explained in principle unless specifically required.

In terms of drawings used for the embodiment, hatching may be omitted from even a sectional view for better visibility of drawings. Hatching may be used for even a plan view for better visibility of drawings.

Embodiment

Overall Structure of a Semiconductor Chip

Figure 1:
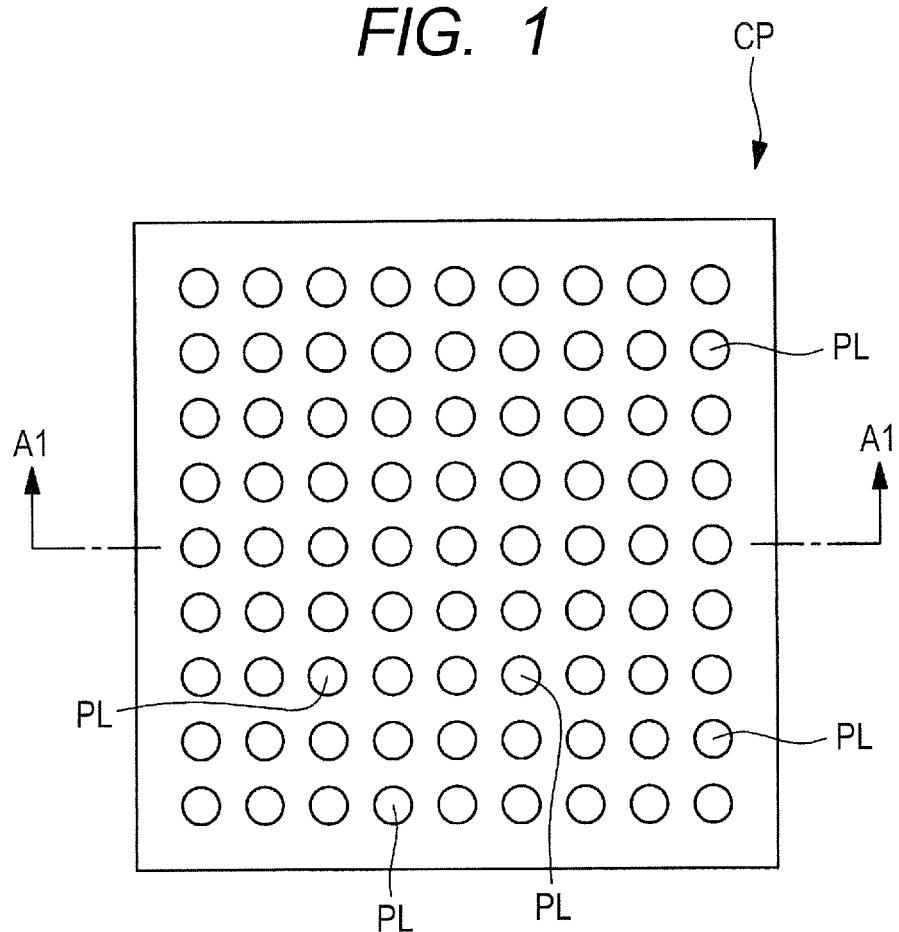
FIG. 1 is an overall plan view of a semiconductor chip according to an embodiment.
Figure 2:
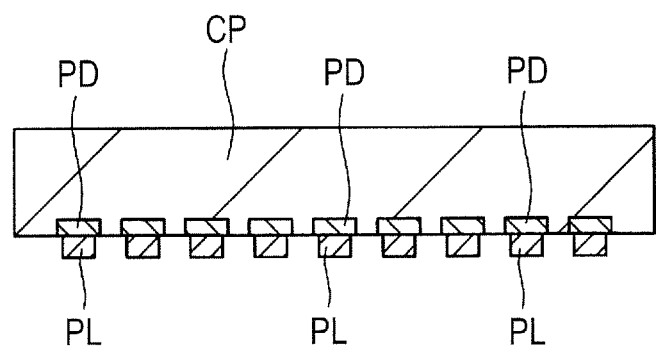
FIG. 2 is a sectional view of the semiconductor chip according to the embodiment.

FIG. 1 is an overall plan view of a semiconductor chip CP according to the embodiment and illustrates an exemplary layout of a pillar electrode PL in the semiconductor chip CP. FIG. 2 is a conceptual sectional view of the semiconductor chip CP. The sectional view taken along line A1-A1 of FIG. 1 approximately corresponds to FIG. 2.

The semiconductor chip CP according to the embodiment includes an upper surface as one principal surface and a rear surface (lower surface) as another principal surface opposite the upper surface. FIG. 1 illustrates the upper surface of the semiconductor chip CP. In the semiconductor chip CP, the upper surface of the semiconductor chip CP signifies the principal surface to form a pad PD or a pillar electrode PL over the pad PD. The rear surface of the semiconductor chip CP signifies the principal surface opposite the upper surface.

As illustrated in FIGS. 1 and 2, the semiconductor chip CP includes a plurality of pads (pad electrodes, electrode pads, or bonding pads) PD and a plurality of pillar electrodes (Cu pillars or columnar electrodes) PL formed over each of the pads PD at the upper surface side. Each pillar electrode PL protrudes from the upper surface of the semiconductor chip CP. The pillar electrode PL can be therefore assumed to be a protruded electrode.

The plurality of pillar electrodes PL are each formed on the plurality of pads PD of the semiconductor chip CP. As a plan view, the semiconductor chip CP includes the pad PD and the pillar electrode PL that are aligned similarly to each other. Namely, the pad PD and the pillar electrode PL formed over it are provided in pairs. The pad PD and the pillar electrode PL formed over it function as an external coupling terminal for the semiconductor chip CP. A solder layer SD1 (to be described) is formed over an apical surface (upper surface) of each pillar electrode PL. However, the solder layer SD1 is omitted from FIG. 2. In the pillar electrode PL, the surface (principal surface) opposite the side to couple the pad PD corresponds to an apical surface (upper surface) of the pillar electrode PL.

Alternatively, the pads PD of the semiconductor chip CP may include not only a pad (PD) over which the pillar electrode PL is formed, but also a pad (PD) over which no pillar electrode PL is formed. In this case, an insulation film PA (to be described) covers the entire of the pad (PD) over which no pillar electrode PL is formed. Namely, some of the pads PD included in the semiconductor chip CP can be entirely covered with the insulation film PA (to be described) based on electronic characteristics (such as ground characteristics) to provide pads not electrically coupled to a terminal TE of the printed circuit board CB (to be described).

As a plan view, the semiconductor chip CP has a rectangular shape. More specifically, the quadrangular shape may include rounded corners. In FIG. 1, the pillar electrodes PL are aligned in array (matrix) over the upper surface (almost all over the upper surface) of the semiconductor chip CP.

Namely, in FIG. 1, the pillar electrodes PL are provided in area array over the upper surface of the semiconductor chip CP.

Figure 3:
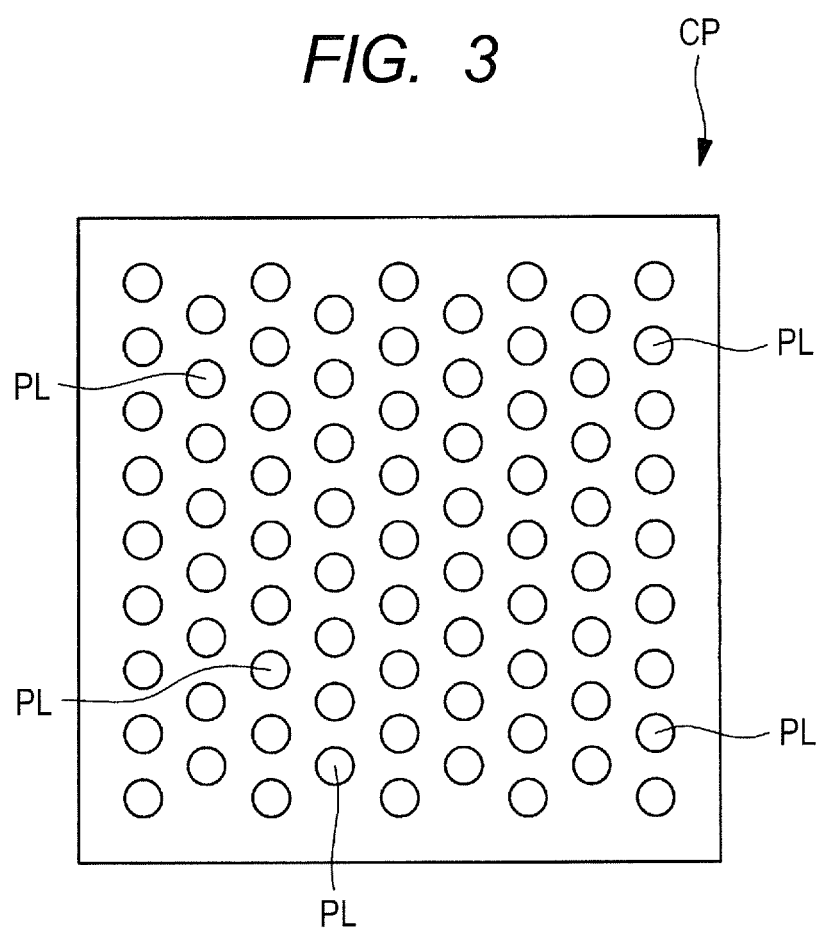
FIG. 3 is an overall plan view of the semiconductor chip according to the embodiment.

The pillar electrodes PL can be also aligned zigzag by shifting the alignment (in array) of the pillar electrodes PL by a half pitch on a column basis. FIG. 3 illustrates the zigzag alignment. Similarly to FIG. 1, FIG. 3 is also an overall plan view of the semiconductor chip CP illustrates another exemplary layout of the pillar electrode PL in semiconductor chip CP.

Structure of the Semiconductor Device

Figure 4:
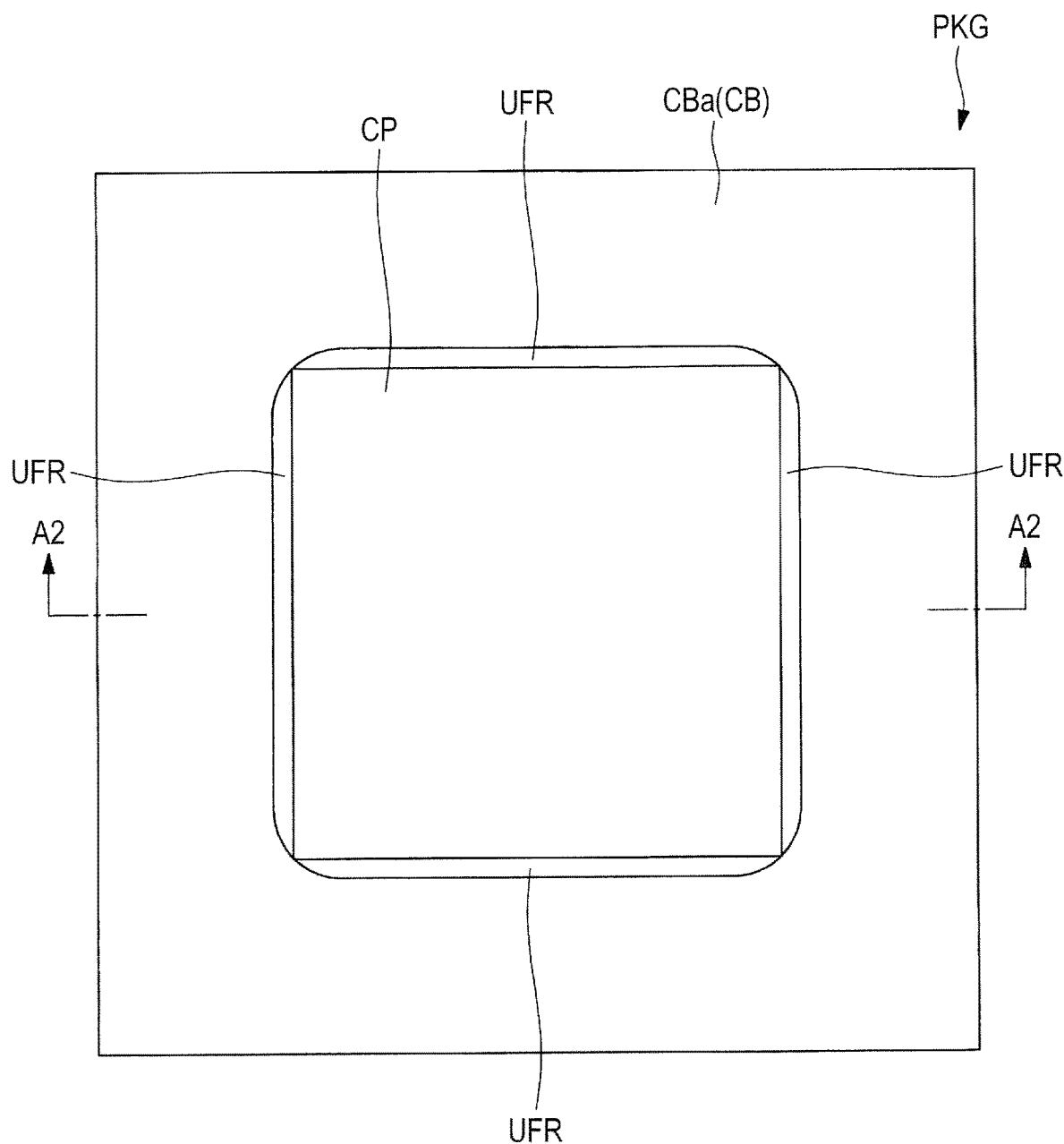
FIG. 4 is a top view of the semiconductor device according to the embodiment.
Figure 5:
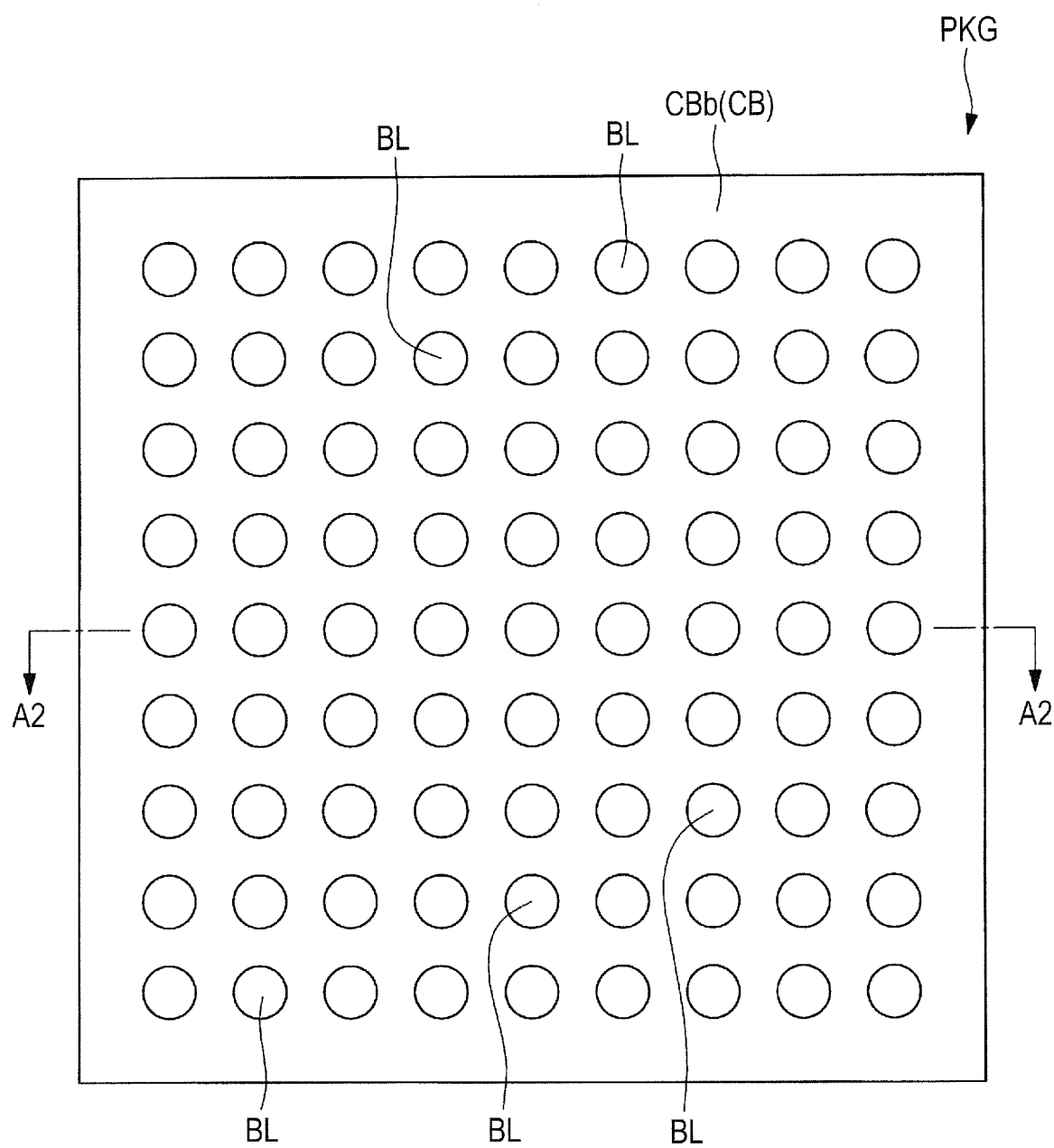
FIG. 5 is a bottom view of the semiconductor device in FIG. 4.
Figure 6:
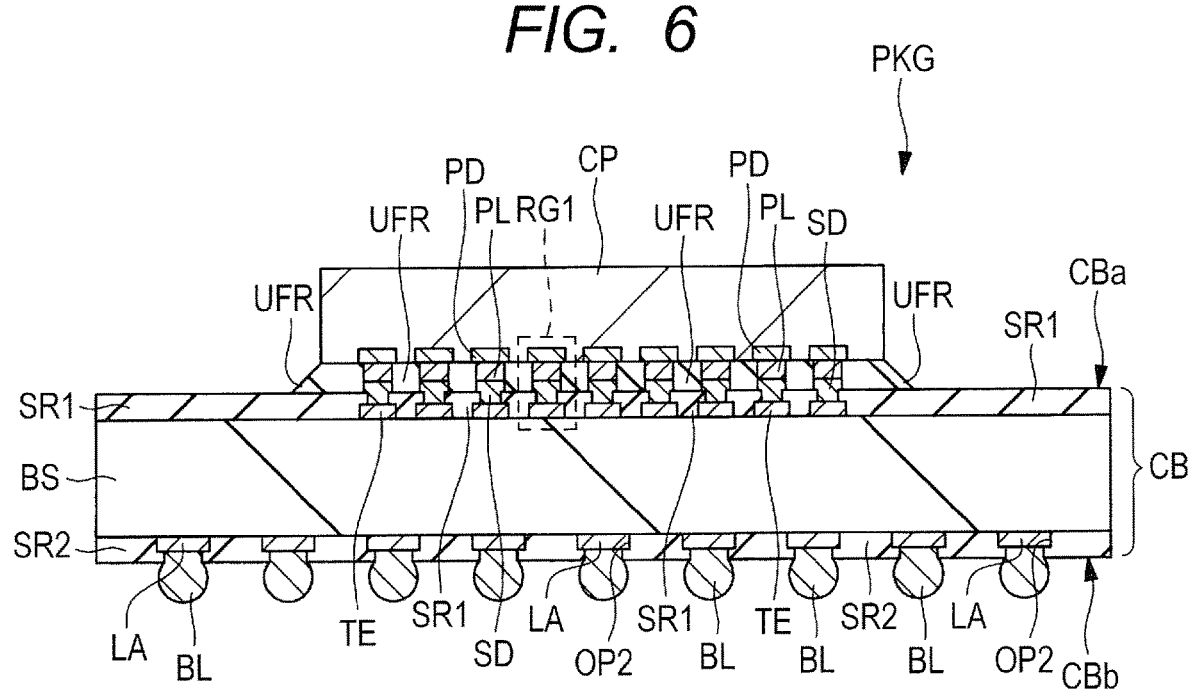
FIG. 6 is a sectional view of the semiconductor device in FIG. 4.
Figure 7:
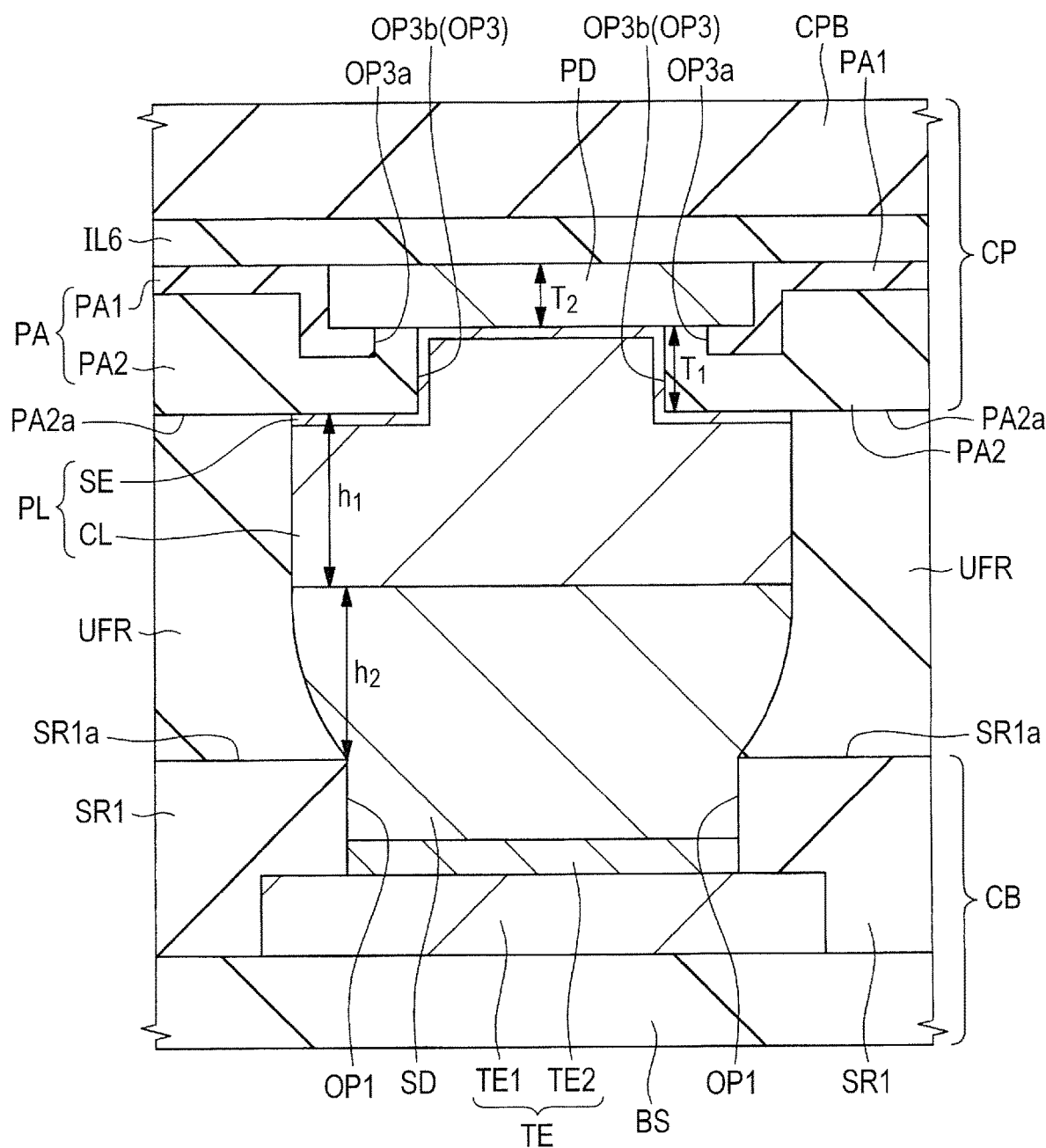
FIG. 7 is a partially sectional view of the semiconductor device in FIG. 4.
Figure 8:
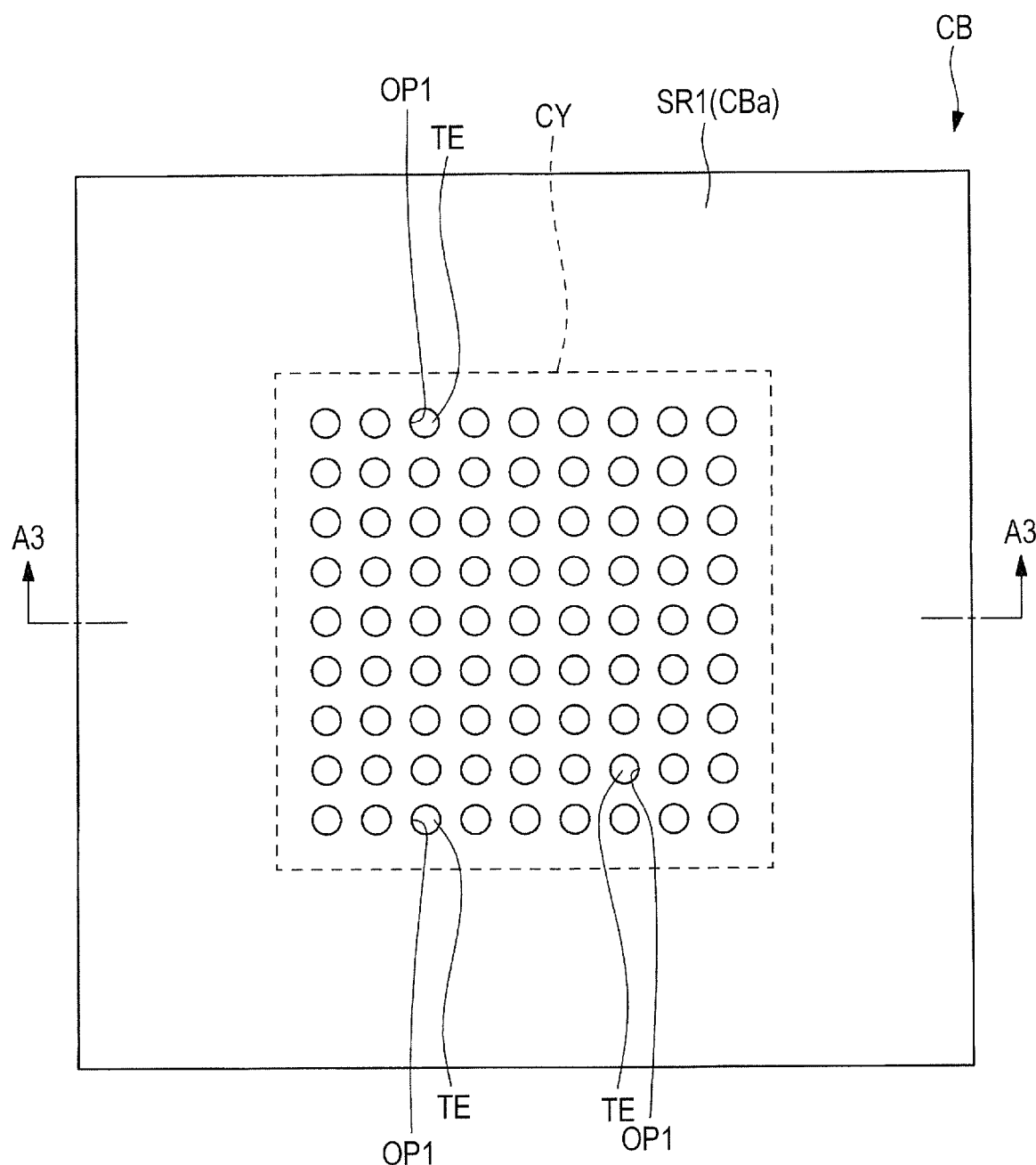
FIG. 8 is a top view of a printed circuit board used for the semiconductor device in FIG. 4.
Figure 9:
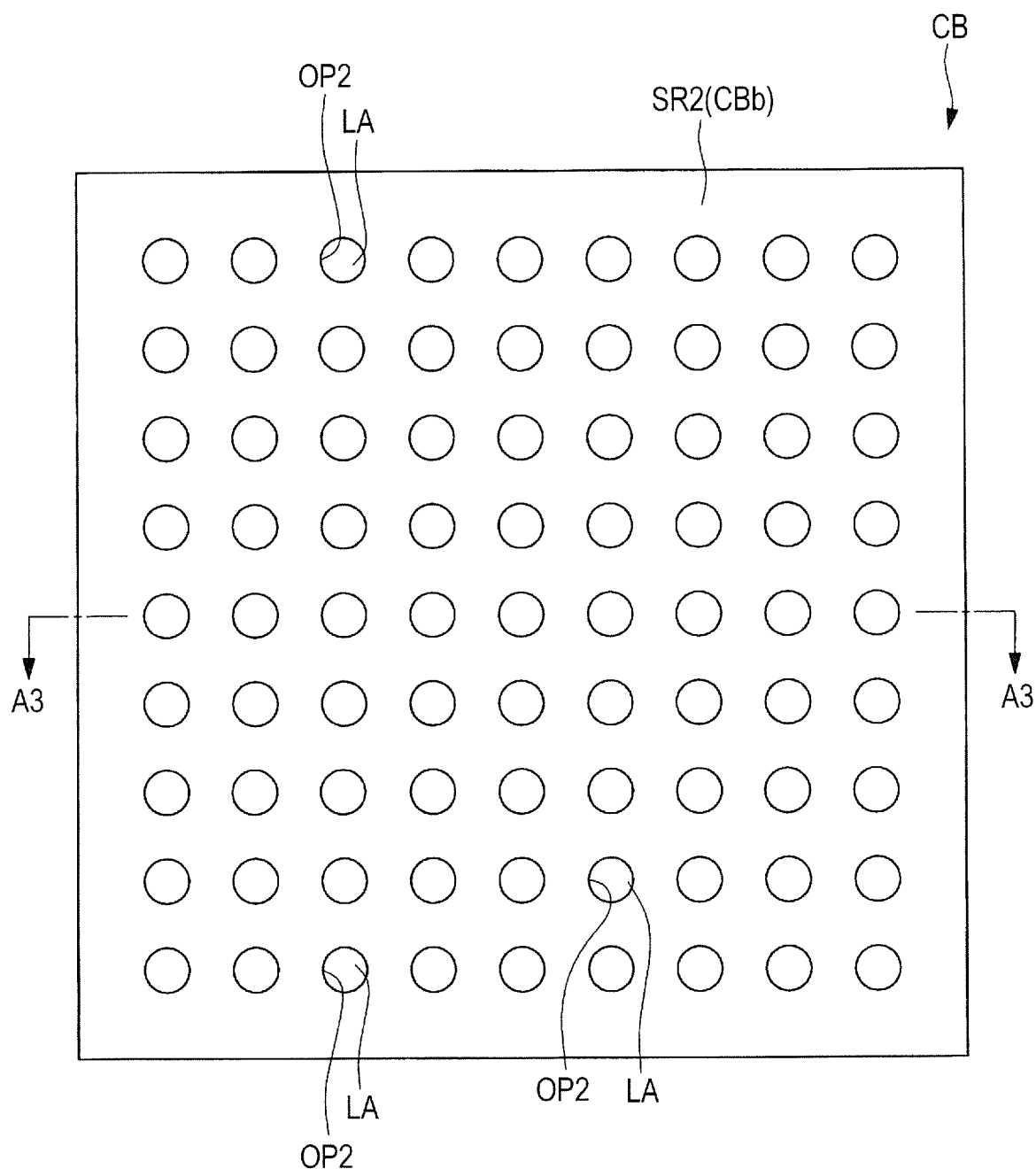
FIG. 9 is a top view of the printed circuit board in FIG. 8.
Figure 10:
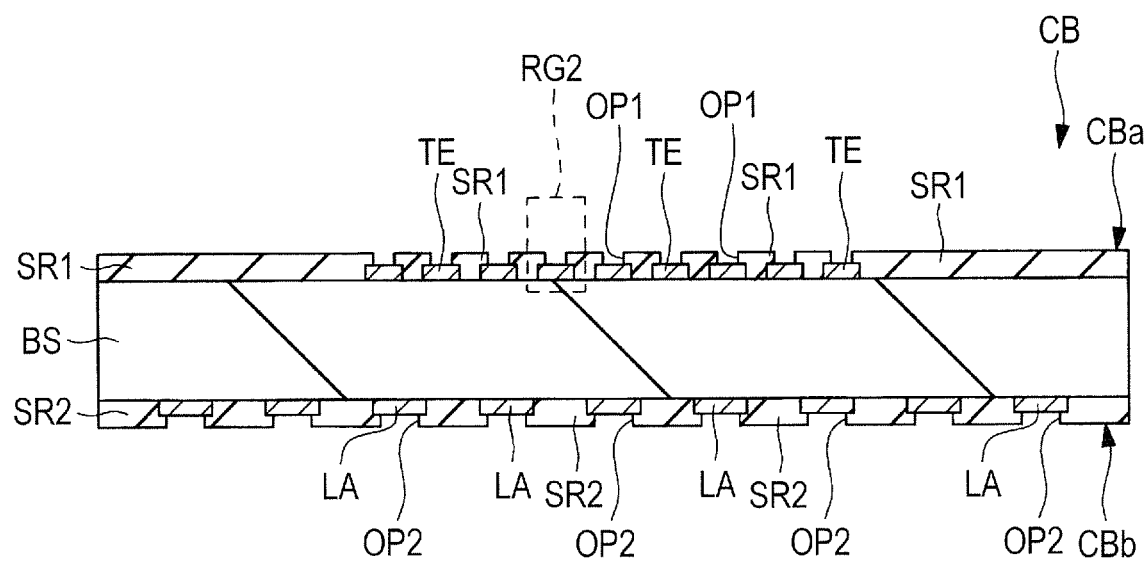
FIG. 10 is a sectional view of the printed circuit board in FIG. 8.
Figure 11:
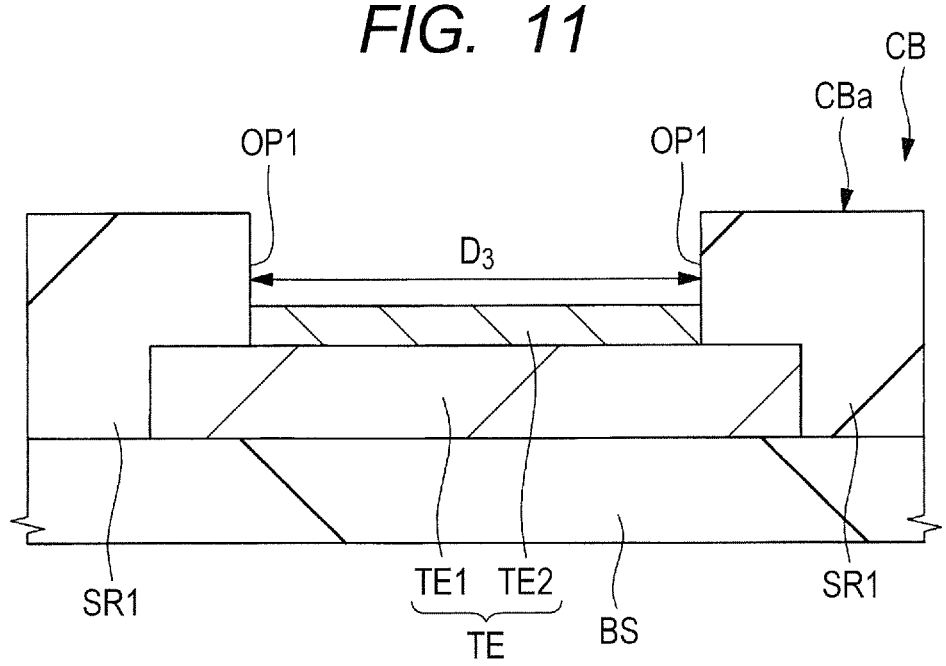
FIG. 11 is a partially sectional view of the printed circuit board in FIG. 8.

FIGS. 4 and 5 are plan views illustrating a semiconductor device PKG according to the embodiment. FIG. 4 illustrates a top view of the semiconductor device PKG. FIG. 5 illustrates a bottom view of the semiconductor device PKG. FIG. 6 is a sectional view illustrating the semiconductor device PKG according to the embodiment. The sectional view taken along line A2-A2 of the semiconductor device PKG in FIGS. 4 and 5 approximately corresponds to FIG. 6. FIG. 7 is a partially sectional view of the semiconductor device PKG according to the embodiment and provides an enlarged view of a region RG1 enclosed in broken lines of FIG. 6. Namely, FIG. 7 corresponds to an enlarged view of a region around a joint between the pillar electrode PL of the semiconductor chip CP and the terminal TE of the printed circuit board CB. FIG. 8 is a top view of the printed circuit board CB used for the semiconductor device PKG. FIG. 9 is a bottom view of the printed circuit board CB. FIG. 10 is a sectional view of the printed circuit board CB. FIG. 11 is a partially sectional view of the printed circuit board CB. The sectional view taken along line A3-A3 of the printed circuit board CB in FIGS. 8 and 9 approximately corresponds to FIG. 10. In FIG. 8, a region CY enclosed in a broken line corresponds to a region (chip mounting region) where the semiconductor chip CP is mounted. FIG. 11 corresponds to an enlarged view of a region RG2 enclosed in a broken line in FIG. 10. FIGS. 6 and 10 provide the same sectional view. FIGS. 7 and 11 provide the same sectional view.

The semiconductor device PKG illustrated in FIGS. 4 through 7 according to the embodiment is comparable to a semiconductor device available as a semiconductor package including the semiconductor chip CP.

As illustrated in FIGS. 4 through 7, the semiconductor device (semiconductor package) PKG according to the embodiment includes the printed circuit board CB, the semiconductor chip CP, a resin portion (underfill resin) UFR, and a plurality of solder balls (external terminals, bump electrodes, or solder bumps) BL. The semiconductor chip CP is mounted (arranged) over an upper surface CBa of the printed circuit board CB. The resin portion (underfill resin) UFR is filled in between the semiconductor chip CP and the printed circuit board CB. The solder ball BL is provided for a lower surface CBb of the printed circuit board CB.

In the semiconductor device PKG, the semiconductor chip CP is flip-chip bonded to the upper surface CBa of the printed circuit board CB. The rear surface of the semiconductor chip CP faces upward and the upper surface of the semiconductor chip CP faces the upper surface CBa of the printed circuit board CB. The semiconductor chip CP is mounted (installed) over the upper surface CBa of the printed circuit board CB via the pillar electrodes PL. The semiconductor chip CP is therefore face-down bonded to the upper surface CBa of the printed circuit board CB.

The pillar electrodes PL for the upper surface of the semiconductor chip CP are each jointed to a plurality of terminals (lands, conductive lands, bonding leads, bonding fingers, substrate-side terminals, or electrodes) TE via a solder layer (solder material or solder portion) SD. The solder layer SD made of solder (solder material) intervenes between the pillar electrode PL and the terminal TE. The solder layer SD joints the pillar electrode PL to the terminal TE to be coupled electrically. The pillar electrodes PL for the upper surface of the semiconductor chip CP are therefore electrically and mechanically coupled to a plurality of terminals TE for the upper surface CBa of the printed circuit board CB. The pads PD of the semiconductor chip CP are therefore each electrically coupled to the terminals TE for the upper surface CBa of the printed circuit board CB via the pillar electrode PL and the solder layer SD. A semiconductor integrated circuit formed in the semiconductor chip CP is therefore electrically coupled to the terminal TE for the upper surface CBa of the printed circuit board CB via the pad PD and the pillar electrode PL.

In the present application, the solder or the solder material signifies not only alloy of tin and lead, but also lead-free soldering (lead-free solder). The lead-free soldering (lead-free solder) used for flip-chip bonding is favorably available as alloy of tin and one or more types of elements such as silver, zinc, copper, nickel, bismuth, and antimony.

In the semiconductor device PKG, the resin portion UFR as an underfill resin is filled between the semiconductor chip CP and the upper surface CBa of the printed circuit board CB. The resin portion UFR can seal and protect a junction between the pillar electrode PL of the semiconductor chip CP and the terminal TE of the printed circuit board CB. The resin portion UFR can buffer a load that results from a difference between coefficients of thermal expansion for the semiconductor chip CP and the printed circuit board CB and is applied to the junction between the pillar electrode PL and the terminal TE. This can improve the reliability of the semiconductor device PKG. The resin portion UFR is made of a resin material (e.g., thermo-setting resin material) such as epoxy resin or silicone resin, for example, and may contain a filler (such as silica).

As a plan view, the printed circuit board (package substrate) CB forms a quadrangular (rectangular) shape intersecting with the thickness and includes the upper surface CBa as one principal surface and the lower surface CBb as a principal surface opposite the upper surface CBa. A chip mounting region (a region to mount the semiconductor chip CP) belonging to the upper surface CBa of the printed circuit board CB aligns the terminals TE corresponding to the alignment of the pillar electrodes PL for the upper surface of the semiconductor chip CP. Namely, the chip mounting region in the upper surface CBa of the printed circuit board CB aligns the terminals TE so that the pillar electrodes PL of the semiconductor chip CP face the terminals TE of the printed circuit board CB when the semiconductor chip CP is mounted over the chip mounting region (CY) in the upper surface CBa of the printed circuit board CB.

Figure 12:
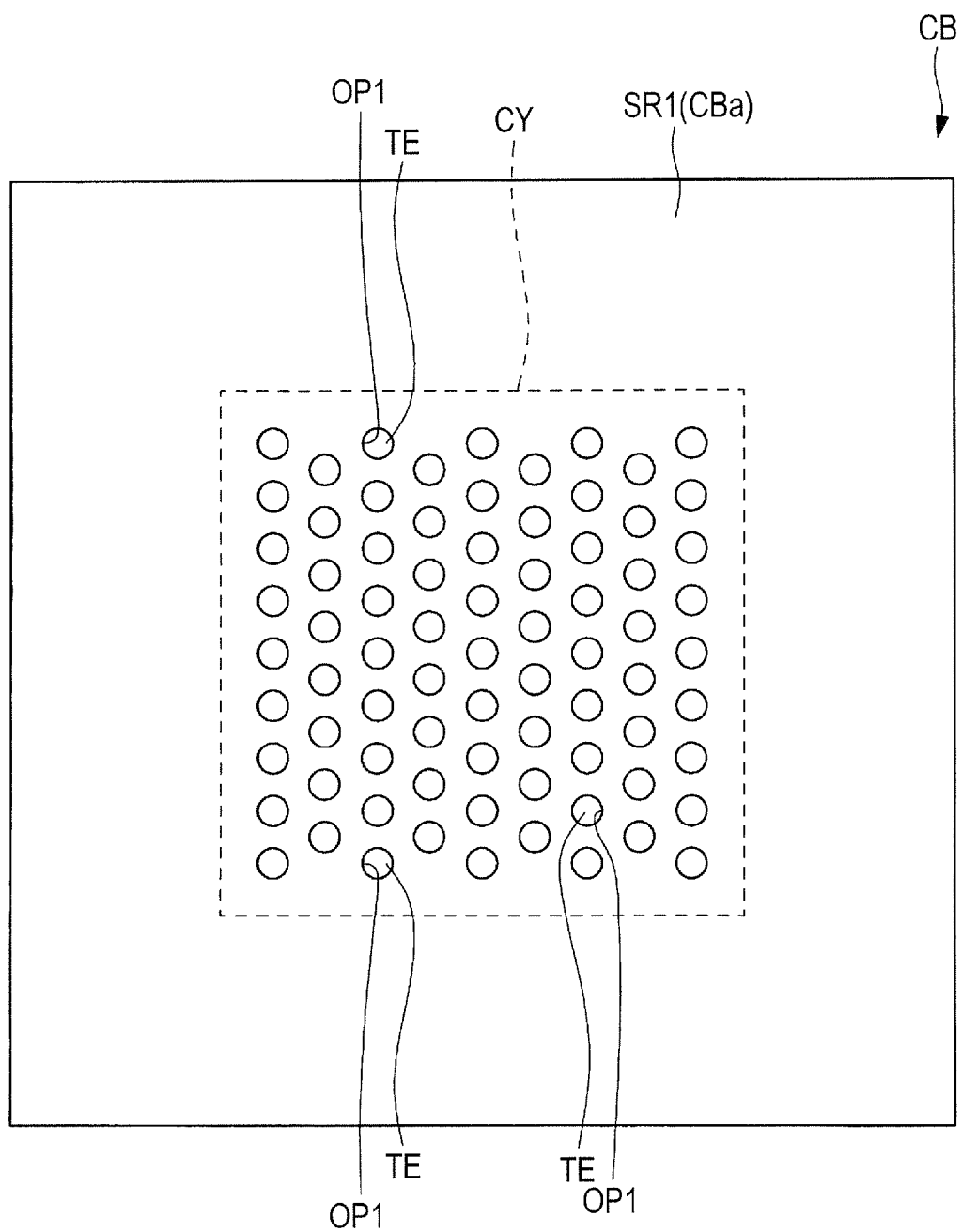
FIG. 12 is a top view of the printed circuit board to mount the semiconductor chip in FIG. 3.

The terminals TE for the chip mounting region (CY) in the upper surface CBa of the printed circuit board CB are therefore aligned equally to the pillar electrodes PL for the upper surface of the semiconductor chip CP. As illustrated in FIG. 1, the pillar electrodes PL are aligned in array over the upper surface of the semiconductor chip CP. In this case, the terminals TE are aligned in array over the chip mounting region (CY) in the upper surface CBa of the printed circuit board CB as illustrated in FIG. 8. As illustrated in FIG. 3, the pillar electrodes PL are aligned zigzag over the upper surface of the semiconductor chip CP. In this case, the terminals TE are also aligned zigzag over the chip mounting region (CY) in the upper surface CBa of the printed circuit board CB as illustrated in FIG. 12. Like FIG. 8, FIG. 12 is also a top view of the printed circuit board and provides an exemplary layout of the terminals TE over the printed circuit board CB when the semiconductor chip in FIG. 3 is mounted.

The chip mounting region in the upper surface CBa of the printed circuit board CB corresponds to the region mounted with the semiconductor chip CP in the upper surface CBa of the printed circuit board CB, namely, the region overlapping with the semiconductor chip CP in the upper surface CBa of the printed circuit board CB as a plan view after the semiconductor chip CP is mounted over the upper surface CBa of the printed circuit board CB. The chip mounting region in the upper surface CBa of the printed circuit board CB corresponds to a region (chip mounting reservation region) reserved for mounting the semiconductor chip CP later before the semiconductor chip CP is mounted over the upper surface CBa of the printed circuit board CB. The chip mounting region in the upper surface CBa of the printed circuit board CB is therefore unchanged before and after the semiconductor chip CP is mounted. Namely, the chip mounting region belongs to the upper surface CBa of the printed circuit board CB and overlaps with the semiconductor chip CP as a plan view when the semiconductor chip CP is mounted regardless of before or after the semiconductor chip CP is mounted. The plan view here signifies a view with reference to a plane parallel to the upper surface CBa of the printed circuit board CB.

Figure 14:
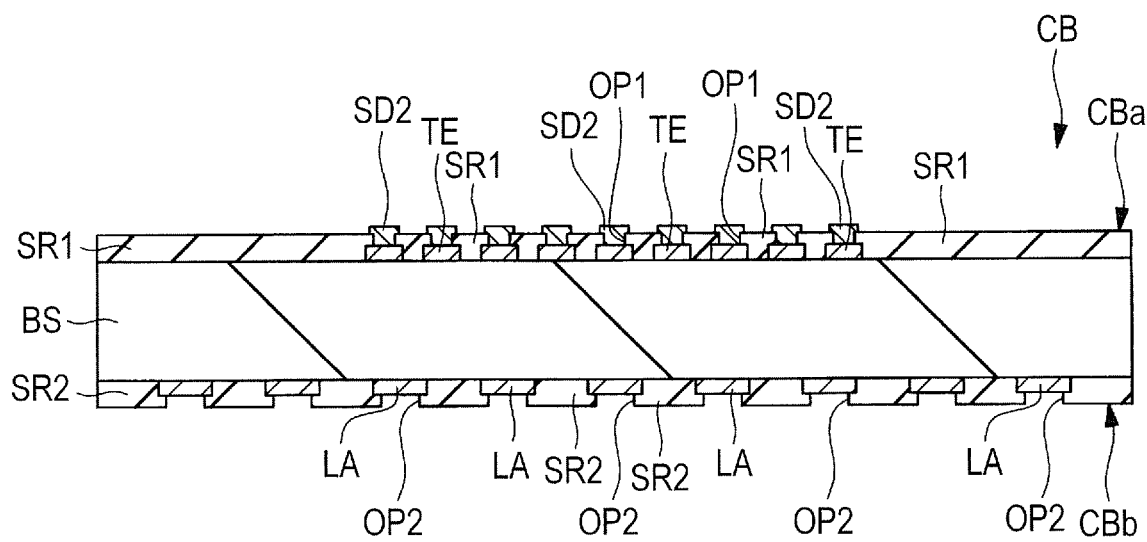
FIG. 14 is a sectional view of the semiconductor device according to the embodiment when the manufacturing process is in progress.

FIG. 14 (to be described) illustrates a printed circuit board CB used for manufacturing of the semiconductor device PKG. The printed circuit board CB in FIG. 14 includes a solder layer SD2 formed over the terminal TE for the upper surface CBa of the printed circuit board CB. As illustrated in FIGS. 4 through 7, the semiconductor device PKG after being manufactured includes the solder layer SD2 over the terminal TE of the printed circuit board CB and the solder layer SD1 formed over the pillar electrode PL of the semiconductor chip CP after being mounted. The solder layer SD2 and the solder layer SD1 are united due to melting and re-hardening to provide the solder layer SD. In the semiconductor device PKG, the pillar electrode PL of the semiconductor chip CP is jointed and fixed to the terminal TE of the printed circuit board CB via the solder layer SD.

In the semiconductor device PKG, a plurality of conductive lands (electrodes, pads, or terminals) LA to couple the solder ball BL are formed over the lower surface CBb of the printed circuit board CB.

The printed circuit board CB is provided as a multi-layer printed circuit board (multi-layer board) by layering and uniting a plurality of insulating layers (dielectric layers) and a plurality of conductor layers (wiring layers or conductor pattern layers). The terminal TE for the upper surface CBa of the printed circuit board CB is electrically coupled to a land LA for the lower surface CBb of the printed circuit board CB via wiring of the printed circuit board CB or via wiring formed in a via hole of the printed circuit board CB.

In FIGS. 6, 7, and 10, a plurality of insulating layers and wiring layers configuring the printed circuit board CB are united without division into respective layers to be represented as a base material layer (base layer) BS for simplification of drawings except the terminal TE for the upper surface CBa of the printed circuit board CB, the land LA for the lower surface CBb of the printed circuit board CB, a resist layer SR1 at the upper surface CBa side of the printed circuit board CB, and a resist layer SR2 at the lower surface CBb side of the printed circuit board CB. In FIGS. 6, 7, and 10, the terminal TE is formed over the upper surface of the base material layer BS and the land LA is formed over the lower surface of the base material layer BS configuring the printed circuit board CB. The base material layer BS actually has a laminate structure including the insulating layers and wiring layers intervening among the insulating layers. Namely, the printed circuit board CB includes the conductor layers (wiring layers or conductor pattern layers). The terminals TE are formed over the uppermost one of the conductor layers. The lands LA are formed over the lowermost one of the conductor layers.

The resist layer (soldering resist layer or solder resist layer) SR1 is formed as an insulation film (insulation layer) over the uppermost layer of the printed circuit board CB. The terminal TE is exposed from an opening OP1 in the resist layer SR1. Namely, the resist layer SR1 corresponds to the uppermost film (insulation film) of the printed circuit board CB. The resist layer (soldering resist layer or solder resist layer) SR2 is formed as an insulation film (insulation layer) over the lowermost layer of the printed circuit board CB. The land LA is exposed from an opening OP2 in the resist layer SR2. The resist layers SR1 and SR2 are provided as insulation films each functioning as a solder resist layer.

Namely, the conductor layer including the terminals TE is formed over the upper surface of the base material layer BS configuring the printed circuit board CB. The resist layer SR1 is formed over the upper surface of the base material layer BS so as to cover the conductor layer. The resist layer SR1 configures the uppermost layer of the printed circuit board CB. Each terminal TE is exposed from the opening OP1 in the resist layer SR1. In a plan view, the opening OP1 is contained in the terminal TE. The plane size (plane area) of the opening OP1 is smaller than the plane size (plane area) of the terminal TE. The resist layer SR1 therefore covers the outer periphery of each terminal TE. The approximate center of each terminal TE is not covered with the resist layer SR1 and is exposed from the opening OP1 in the resist layer SR1.

The upper surface CBa of the printed circuit board CB is mainly configured as an upper surface SR1a of the resist layer SR1 of the printed circuit board CB. The upper surface SR1a of the resist layer SR1 is provided as a surface (principal surface) opposite the base material layer BS. The upper surface SR1a of the resist layer SR1 therefore provides the principal surface opposite the semiconductor chip CP on condition that the semiconductor chip CP is mounted over the printed circuit board CB.

The terminal TE is provided as a laminated film of a copper (Cu) layer TE1 and a nickel (Ni) layer TE2 over the copper layer TE1. The nickel layer TE2 is a plated layer (nickel-plated layer) formed by a plating method and is formed over the copper layer TE1 partly exposed from the opening OP1 in the resist layer SR1. This is because the resist layer SR1 including the opening OP1 is formed and then the nickel-plated layer as the nickel layer TE2 is formed over the copper layer TE1 partly exposed from the opening OP1 during the manufacture of the printed circuit board CB. Each terminal TE therefore includes the nickel layer TE2 formed over the copper layer TE1 partly exposed from the opening OP1, not formed all over the upper surface of the copper layer TE1. The nickel layer TE2 is not formed over the copper layer TE1 covered with the resist layer SR1. Each terminal TE therefore has the laminate structure of the copper layer TE1 and the nickel layer TE2 over it at part of the terminal TE that is not covered with the resist layer SR1 and is exposed from the opening OP1. Part of the terminal TE covered with the resist layer SR1 provides the copper layer TE1.

A conductor layer including the lands LA is formed over the lower surface of the base material layer BS configuring the printed circuit board CB. The resist layer SR2 is formed over the lower surface of the base material layer BS so as to cover the conductor layer. The resist layer SR2 configures the lowermost layer of the printed circuit board CB. Each land LA is exposed from the opening OP2 in the resist layer SR2. In a plan view, the opening OP2 is contained in the land LA. The plane size (plane area) of the opening OP2 is smaller than the plane size (plane area) of the land LA. The resist layer SR2 therefore covers the outer periphery of each land LA. The approximate center of each land LA is not covered with the resist layer SR2 and is exposed from the opening OP2 in the resist layer SR2.

In the printed circuit board CB, the opening OP1 in the resist layer SR1 is provided for the chip mounting region according to the same alignment as that of the terminal TE, therefore, the same alignment as that of the terminal TE of the semiconductor chip CP. A plurality of openings OP1 are formed for the resist layer SR1 in the chip mounting region of the printed circuit board CB. One terminal TE is exposed from one opening OP1.

The lands LA are aligned in array (area array) over the lower surface CBb of the printed circuit board CB. The solder ball BL as a protruded electrode is coupled (formed) to each land LA. The semiconductor device PKG therefore includes a plurality of solder balls BL that are aligned in array over the lower surface CBb of the printed circuit board CB. The solder balls BL can function as external terminals (external coupling terminals) for the semiconductor device PKG.

Each pillar electrode PL of the semiconductor chip CP is electrically coupled to each terminal TE for the upper surface CBa of the printed circuit board CB via the solder layer SD. Each pillar electrode PL is also electrically coupled to the land LA for the lower surface CBb of the printed circuit board CB and the solder ball BL coupled to the land LA via the wiring or via wiring for the printed circuit board CB. The solder balls BL aligned over the lower surface CBb of the printed circuit board CB can include a solder ball not electrically coupled to the pillar electrode PL of the semiconductor chip CP. This solder ball can be used for heat dissipation.

Manufacturing Process of the Semiconductor Device

Figure 13:
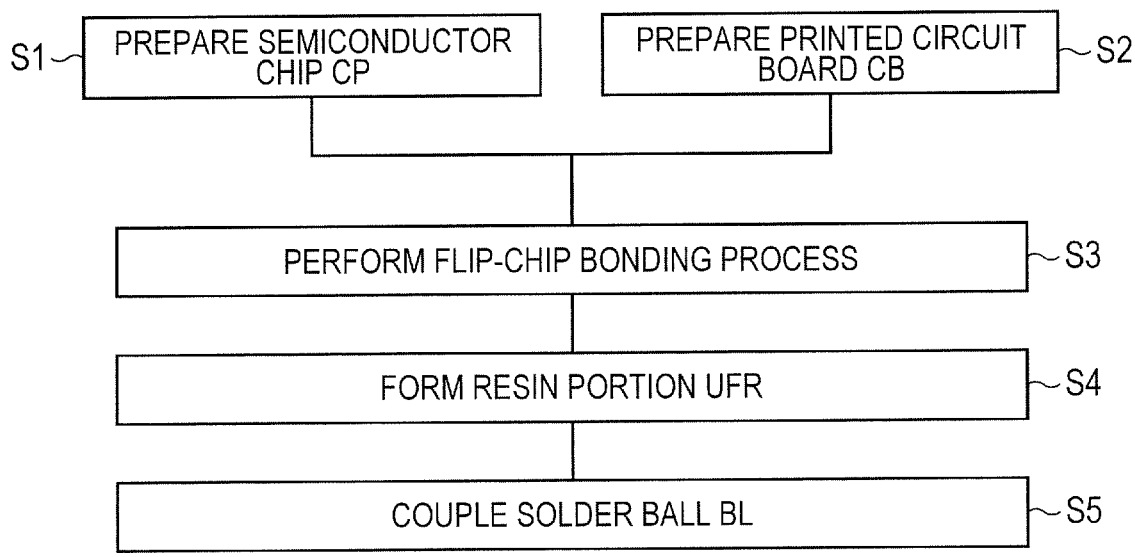
FIG. 13 is a process flow illustrating a manufacturing process for the semiconductor device according to the embodiment.
Figure 16:
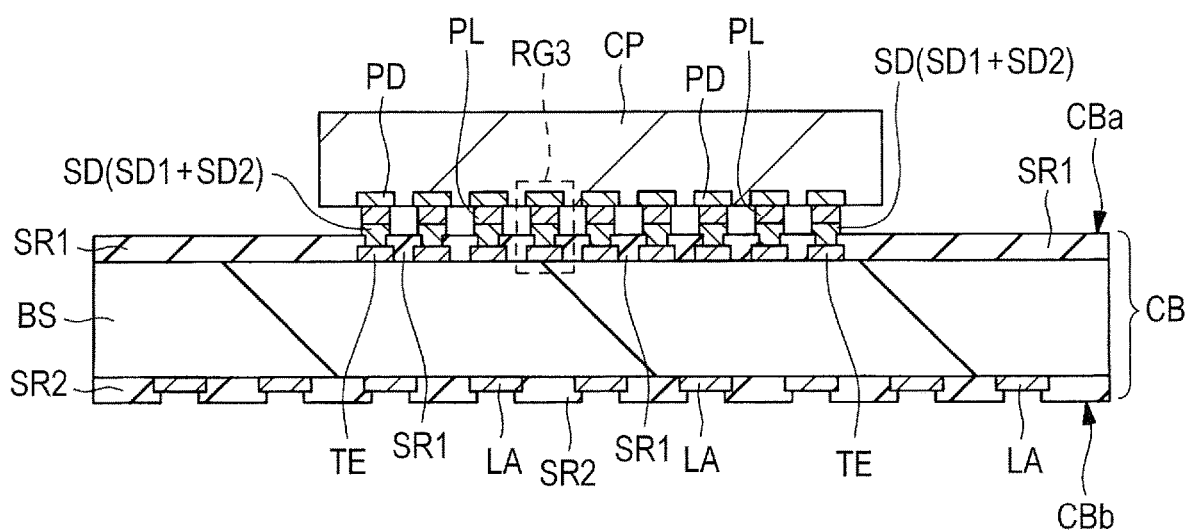
FIG. 16 is a sectional view of the semiconductor device according to the embodiment continued from FIG. 15 when the manufacturing process is in progress.
Figure 17:
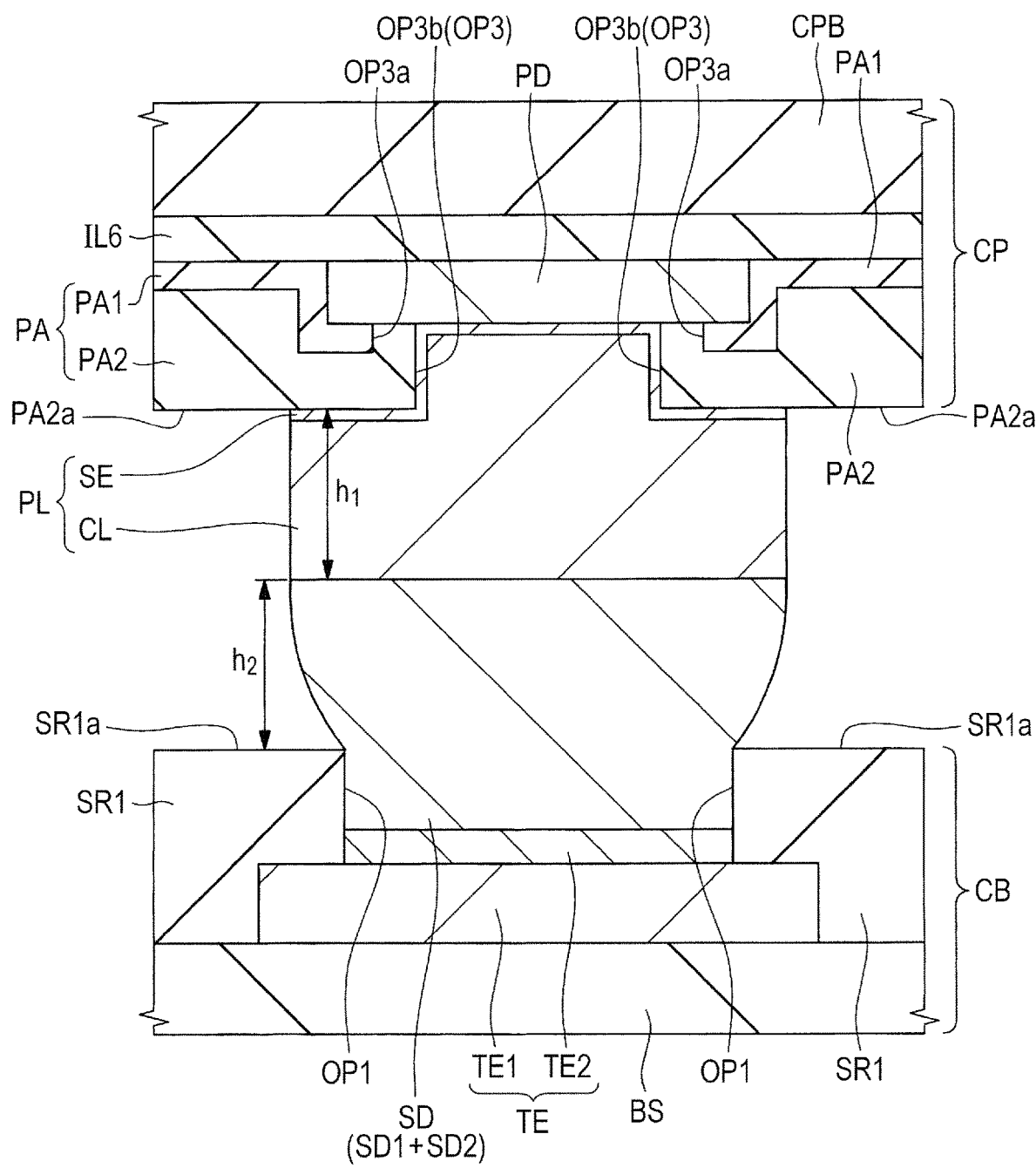
FIG. 17 is an enlarged sectional view of part of FIG. 16.

The description below explains a manufacturing process for the semiconductor device PKG according to the embodiment. FIG. 13 is a process flow illustrating the manufacturing process for the semiconductor device PKG according to the embodiment. FIGS. 14 through 19 are sectional views illustrating the manufacturing process for the semiconductor device according to the embodiment. FIGS. 14 through 16, 18, and 19 provide sectional views corresponding to FIG. 3 above. FIG. 17 is an enlarged sectional view of part of FIG. 16 and provides an enlarged view of a region RG3 enclosed in a broken line.

The semiconductor chip CP and the printed circuit board CB need to be prepared to manufacture the semiconductor device PKG (S1 and S2 in FIG. 13).

FIGS. 1 through 3 illustrate the semiconductor chip CP. As above, the semiconductor chip CP includes the pads PD and the pillar electrodes PL each formed over the pads PD.

FIGS. 8 through 11 illustrate the printed circuit board CB. As above, the printed circuit board CB includes the terminals TE formed in the chip mounting region of the upper surface CBa and the lands LA formed over the lower surface CBb.

Various methods can be used to manufacture the printed circuit board CB. The printed circuit board CB can be manufactured by using the buildup method, the subtractive method, the printing method, the sheet lamination method, the semi-additive method, or the additive method, for example.

The semiconductor chip CP may be prepared at S1 and then the printed circuit board CB may be prepared at S2. The printed circuit board CB may be prepared at S2 and then the semiconductor chip CP may be prepared at S1. The printed circuit board CB and the semiconductor chip CP may be prepared at a time by simultaneously performing S1 and S2.

As illustrated in FIG. 14, the solder layer (solder material or solder portion) SD2 made of solder (solder material) is formed over the terminal TE for the upper surface CBa of the printed circuit board CB used to manufacture the semiconductor device PKG. Namely, the process at S2 prepares (manufactures) the printed circuit board CB including the solder layer SD2 formed over the terminal TE.

Alternatively, the printed circuit board CB not including the solder layer SD2 formed over the terminal TE is prepared at S2 and then the solder layer SD2 can be formed over the terminal TE of the printed circuit board CB before performing a flip-chip mounting process at S3 to be described.

The solder layer SD2 is formed part of the terminal TE exposed from the opening OP1 in the resist layer SR1 and is therefore formed over the nickel layer TE2 configuring the terminal TE. The solder layer SD2 can be formed by using the plating method, for example.

As illustrated in FIGS. 15, 20, 22, 35, and 36 to be described, the solder layer SD1 is formed over the apical surface of each of the pillar electrodes PL for the semiconductor chip CP used to manufacture the semiconductor device PKG. Namely, the process at S1 prepares (manufactures) the semiconductor chip CP including the solder layer SD1 formed over the pillar electrode PL.

The flip-chip bonding process is then performed (S3 in FIG. 13). Specifically, the process at S3 can be performed as follows.

Figure 15:
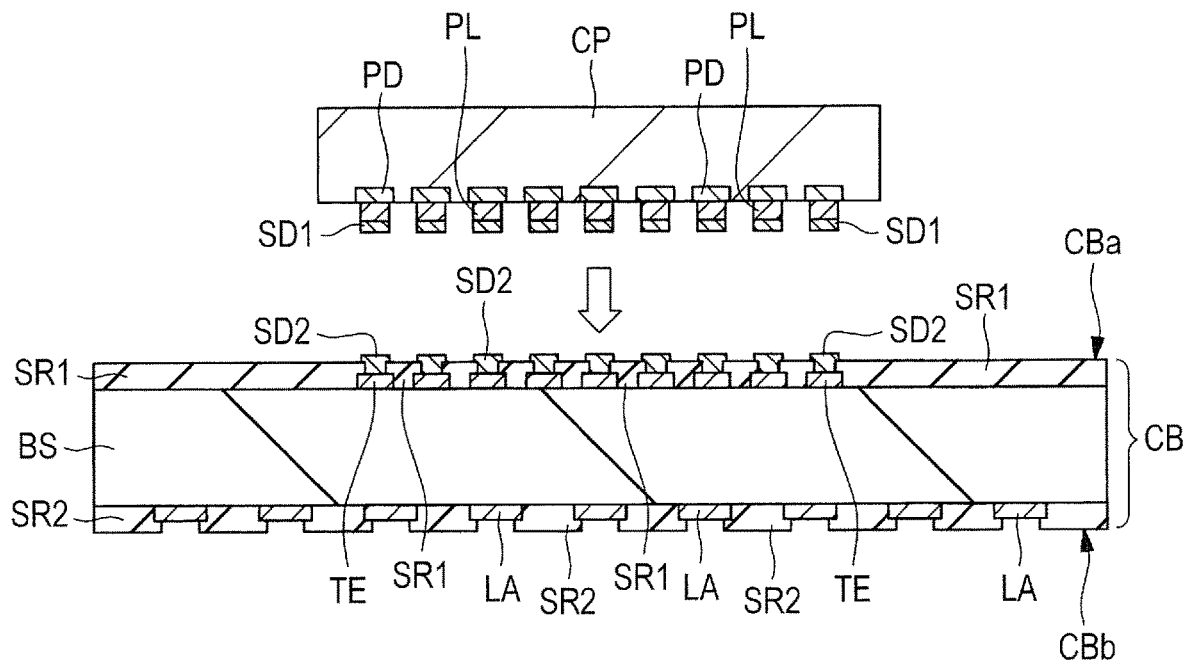
FIG. 15 is a sectional view of the semiconductor device according to the embodiment continued from FIG. 14 when the manufacturing process is in progress.

As illustrated in FIG. 15, the semiconductor chip CP supported by a tool (unshown) is placed above a chip mounting reservation region in the upper surface CBa of the printed circuit board CB so that the upper surface of the semiconductor chip CP faces the upper surface CBa of the printed circuit board CB. The semiconductor chip CP supported by the tool is allowed to approach the upper surface CBa of the printed circuit board CB so that the solder layer SD1 over the apical surface of the pillar electrode PL for the semiconductor chip CP contacts with the solder layer SD2 over the terminal TE for the printed circuit board CB. The semiconductor chip CP is positioned to the printed circuit board CB so that the pillar electrodes PL for the semiconductor chip CP correspond to the terminals TE of the printed circuit board CB. At least one of the solder layer SD1 and the solder layer SD2 may be preheated to be so hardened as to be deformed after the contact.

The solder layer SD1 and the solder layer SD2 are heated so as to reach a melting point or higher. Heating the semiconductor chip CP can also heat the solder layer SD2 due to heat transfer from the solder layer SD1 while a solder material layer SD1 and the solder layer SD2 are in contact with each other during the heating. Melting the solder layer SD1 and the solder layer SD2 melts and unites the solder material of the solder layer SD1 and the solder material of the solder layer SD2. The melted solder is then cooled and hardened to form a solder layer SD that couples the pillar electrode PL with the terminal TE. The solder layer SD includes the solder layer SD1 and solder layer SD2 that are melted and hardened. The solder layer SD intervenes between the pillar electrode PL for the semiconductor chip CP and the terminal TE for the printed circuit board CB and electrically and mechanically couples the pillar electrode PL for the semiconductor chip CP with the terminal TE for the printed circuit board CB. FIG. 16 illustrates this stage.

The solder layer SD1 and the solder layer SD2 are melted and united. The melted and united solder deforms due to surface tension so as to maintain a physically stable shape, namely, a shape similar to a spherical form. The solder layer SD formed by hardening the melted solder is therefore shaped like a spherical form at a height between the resist layer SR1 for the printed circuit board CB and the apical surface of the pillar electrode PL (see FIG. 17).

The flip-chip bonding process is performed as above and the semiconductor chip CP is mounted over the upper surface CBa of the printed circuit board CB. The pillar electrodes PL for the semiconductor chip CP are each jointed to the terminals TE for the printed circuit board CB via the solder layer SD. The semiconductor chip CP is thereby fixed to the printed circuit board CB.

The flux can be appropriately used to remove a metal oxide film from the junction during the flip-chip bonding. For example, the flux is applied to the upper surface CBa (especially the terminal TE) of the printed circuit board CB before mounting the printed circuit board CB with the semiconductor chip CP. The semiconductor chip CP is then placed over the printed circuit board CB. Subsequently, it is favorable to perform a solder reflow process (a heating process to melt the solder layer SD1 and the solder layer SD2 to form the solder layer SD) and then washing treatment.

Figure 18:
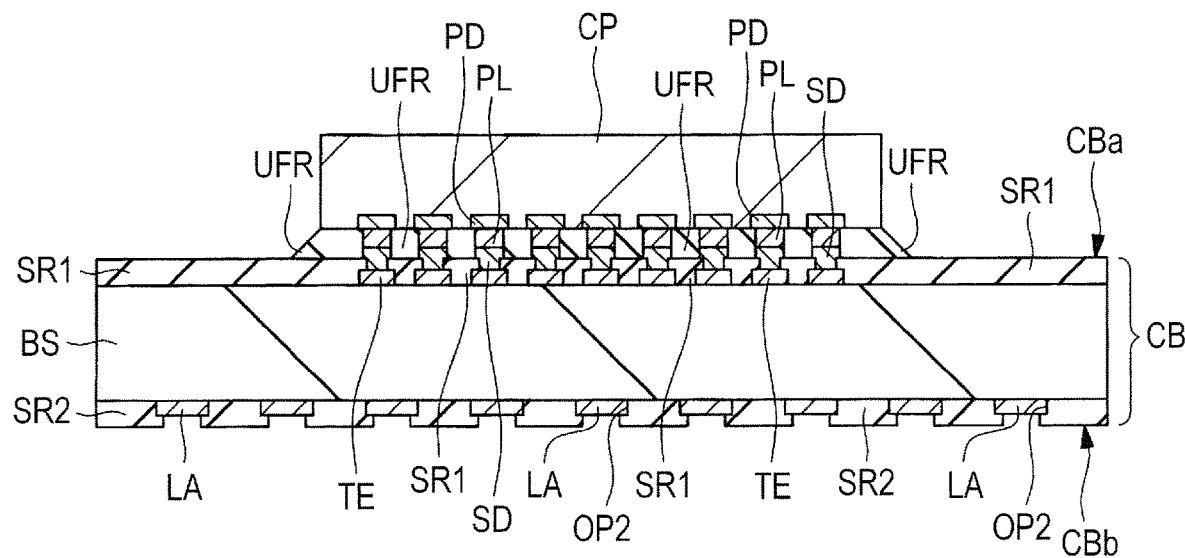
FIG. 18 is a sectional view of the semiconductor device according to the embodiment continued from FIG. 16 when the manufacturing process is in progress.

As illustrated in FIG. 18, the resin portion UFR as an underfill resin is formed and is filled between the semiconductor chip CP and the printed circuit board CB (S4 in FIG. 13). The process at S4 can be performed as follows, for example.

A liquid or pasty resin material is supplied (filled or injected) between the semiconductor chip CP and the upper surface CBa of the printed circuit board CB. The resin material contains a thermo-setting resin material and may also contain a filler (silica particle). The resin material supplied between the semiconductor chip CP and the upper surface CBa of the printed circuit board CB spreads through the space between the semiconductor chip CP and the upper surface CBa of the printed circuit board CB due to the capillary action. The resin material is then hardened by heating to form the resin portion UFR made of the hardened resin material.

Alternatively, the liquid or pasty resin material may be applied to the chip mounting reservation region of the upper surface CBa of the printed circuit board CB before the semiconductor chip CP is placed over the printed circuit board CB (before performing S3 above). The flip-chip bonding may be then used to couple the pillar electrode PL for the semiconductor chip CP to the terminal TE for the printed circuit board CB. The resin material may be then hardened to form the resin portion UFR. In this case, S4 does not need to perform the process to supply the resin material between the semiconductor chip CP and the upper surface CBa of the printed circuit board CB. A heating process is performed to harden the resin material already existing between the semiconductor chip CP and the upper surface CBa of the printed circuit board CB.

Figure 19:
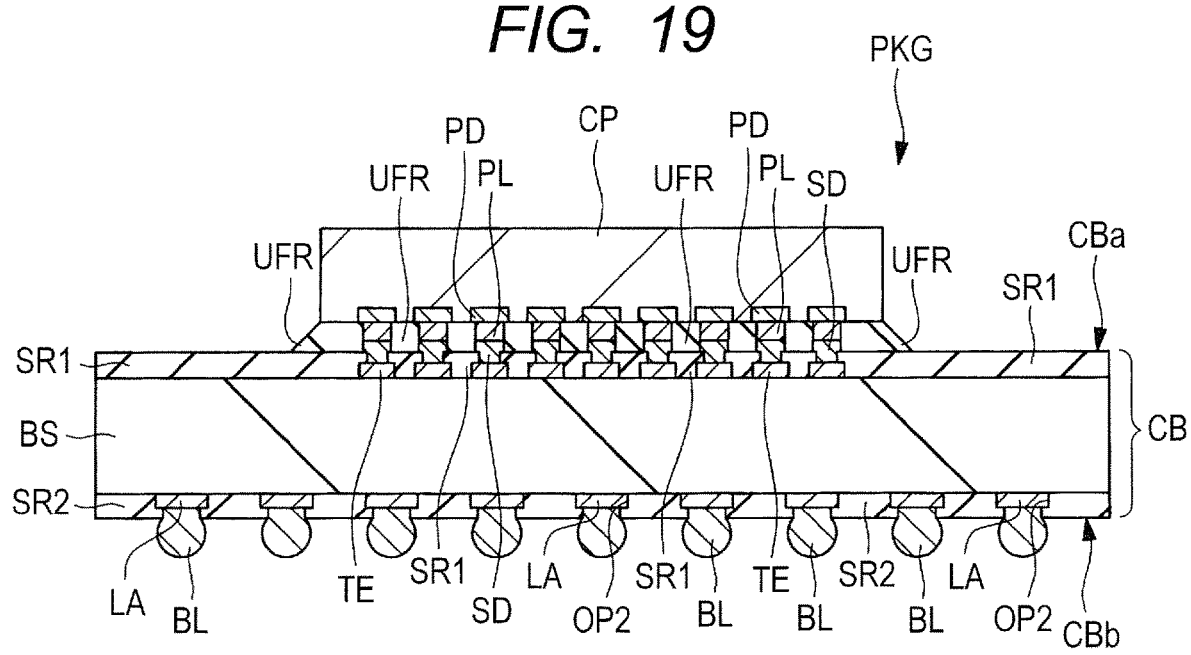
FIG. 19 is a sectional view of the semiconductor device according to the embodiment continued from FIG. 18 when the manufacturing process is in progress.

As illustrated in FIG. 19, the solder ball BL is coupled (jointed or formed) to the land LA for the lower surface CBb of the printed circuit board CB (S5 in FIG. 13).

A process to couple the solder ball BL is performed at S5. The lower surface CBb of the printed circuit board CB is faced upward, for example. The solder ball BL is placed (mounted) over each of the lands LA for the lower surface CBb of the printed circuit board CB and is temporarily fixed by using a flux. A reflow process (solder reflow process or heat treatment) is performed to melt the solder so as to be capable of jointing the solder ball BL and the land LA for the lower surface CBb of the printed circuit board CB. Subsequently, a washing process is performed as needed so as to be capable of removing the flux from the surface of the solder ball BL. The above can joint (form) the solder ball BL as an external terminal (external coupling terminal) for the semiconductor device PKG.

The embodiment has described the case of jointing the solder ball BL as an external terminal for the semiconductor device PKG but is not limited thereto. Instead of the solder ball BL, for example, solder is supplied over the land LA by using the printing method to form an external terminal (bump electrode or solder bump) made of the solder for the semiconductor device PKG. In this case, the solder can be supplied over each of the lands LA for the lower surface CBb of the printed circuit board CB and then the solder reflow process can be performed to form an external terminal (bump electrode or solder bump) made of the solder over each of the lands LA. A plating treatment can be performed to form an external terminal (bump electrode) over each land LA.

At S5, the external coupling terminal (solder ball BL in this example) is formed for each of the lands LA over the lower surface CBb of the printed circuit board CB.

The semiconductor device PKG is manufactured as above.

Alternatively, a multi-piece printed circuit board can be used as the printed circuit board used for the semiconductor device PKG. In this case, S2 prepares the multi-piece printed circuit board, namely, a printed circuit board base that includes a plurality of the printed circuit boards CB integrally spreading in array. The printed circuit board base includes a plurality of semiconductor device regions. Each semiconductor device region corresponds to a region from which one semiconductor device PKG is acquired. At S3, the flip-chip bonding process is performed for the semiconductor device regions of the printed circuit board base. At S4, a resin portion UFR formation process is performed for the semiconductor device regions of the printed circuit board base. At S5, a solder ball coupling process is performed for the semiconductor device regions of the printed circuit board base. The printed circuit board base is then cut into the semiconductor device regions from each of which the semiconductor device PKG can be manufactured.

Structure of the Semiconductor Chip

Figure 20:
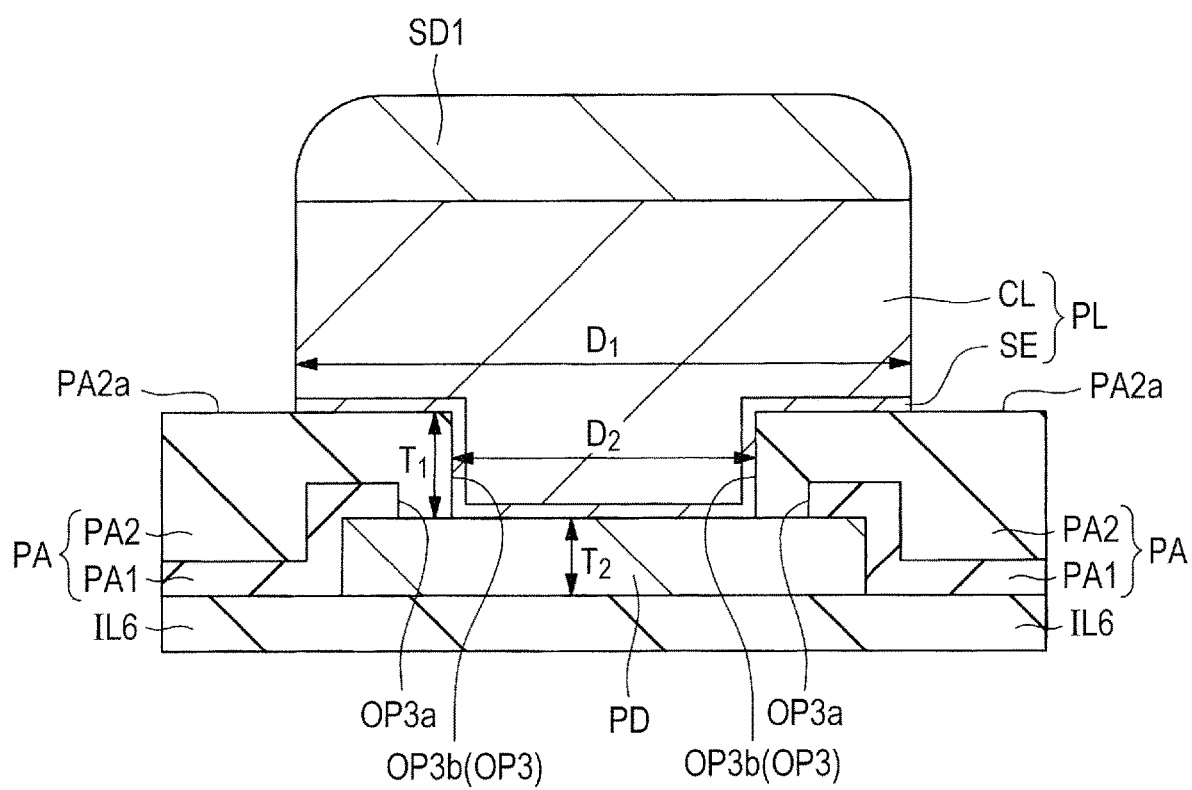
FIG. 20 is a partially sectional view of the semiconductor chip according to the embodiment.
Figure 21:
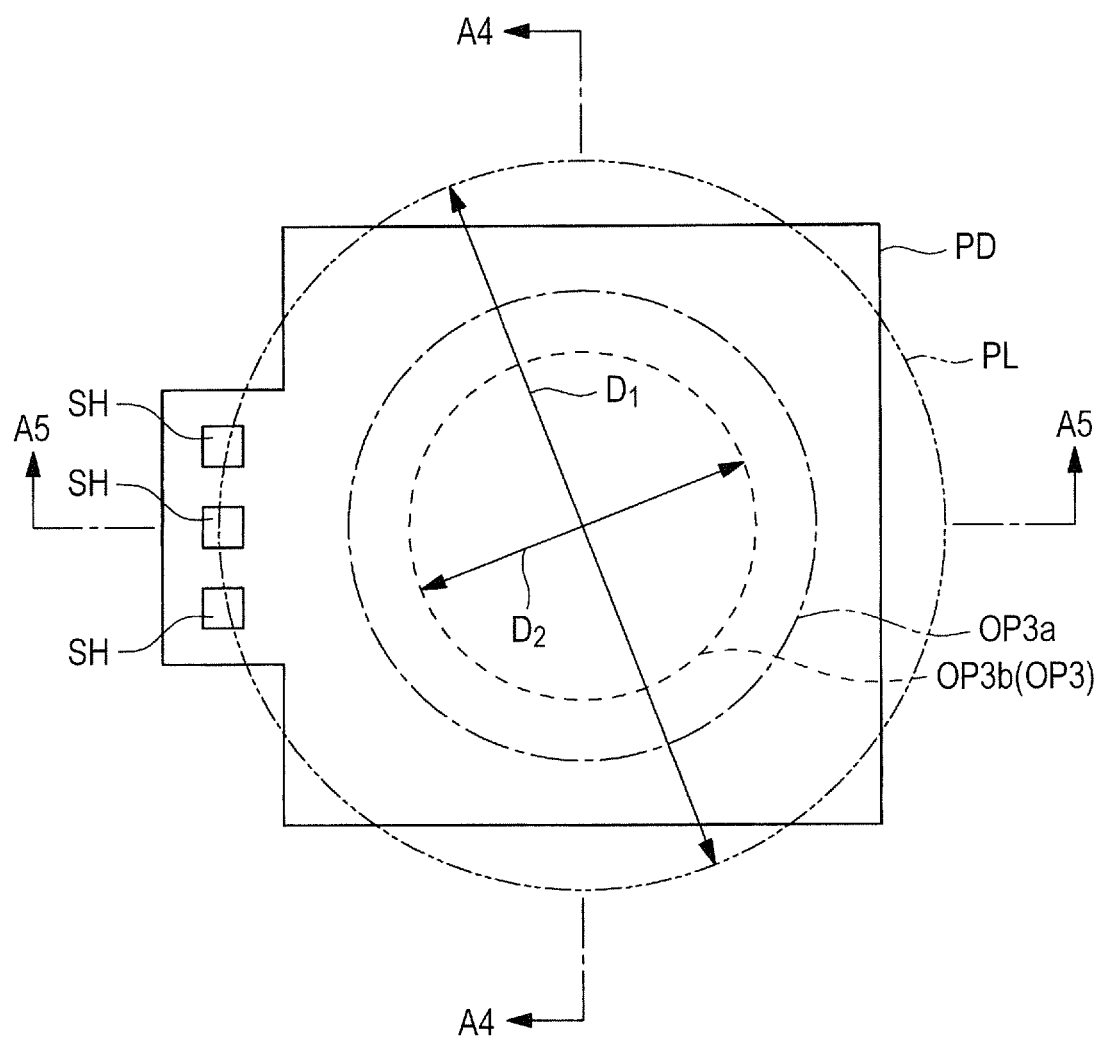
FIG. 21 is a partial plan view of the semiconductor chip according to the embodiment.
Figure 22:
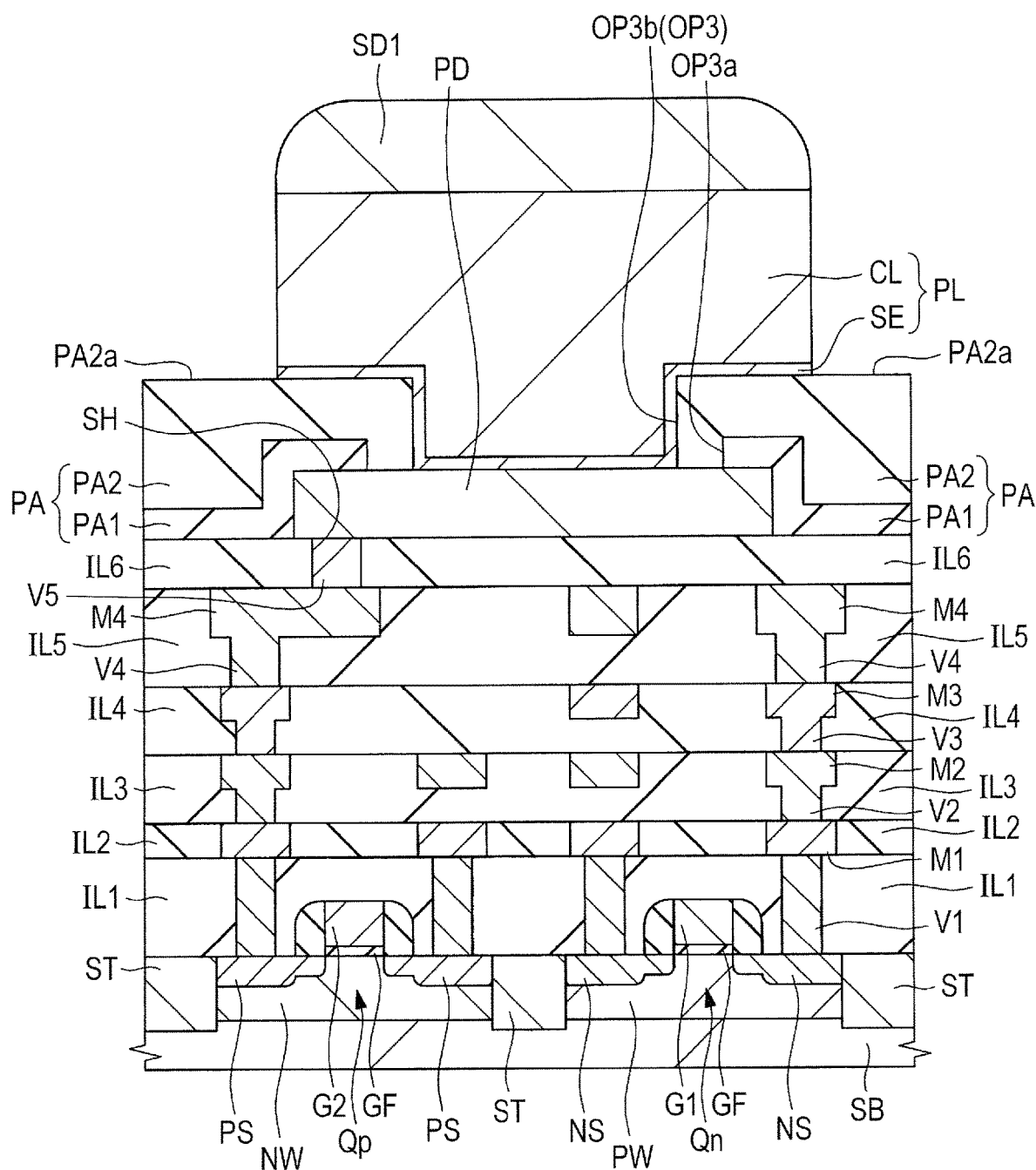
FIG. 22 is a partially sectional view of the semiconductor chip according to the embodiment.

FIG. 20 is a partially sectional view of the semiconductor chip CP according to the embodiment and illustrates a sectional view crossing the pad PD and the pillar electrode PL formed over it. FIG. 21 is a partial plan view of the semiconductor chip CP according to the embodiment and illustrates a plan view around a pad PD formation region. FIG. 21 illustrates plan positions of the pad PD, the pillar electrode PL, an opening OP3a, an opening OP3b, and an opening SH. FIG. 20 approximately corresponds to a sectional view taken along line A4-A4 of FIG. 21. FIG. 22 to be described approximately corresponds to a sectional view taken along line A5-A5 of FIG. 21. FIG. 20 omits the illustration of the structure below an interlayer insulation film IL6. FIG. 22 to be described also illustrates the structure below the interlayer insulation film IL6.

As illustrated in FIG. 20, the pad PD is formed over the interlayer insulation film IL6. The insulation film PA is formed over the interlayer insulation film IL6 so as to cover part of the pad PD. The pad PD is partially exposed from the opening OP3 provided for the insulation film PA. Namely, the pad PD is exposed from the opening OP3. However, the insulation film PA covers part of the pad PD that does not overlap with the opening OP3 in a plan view. Specifically, the insulation film PA does not cover the center of the pad PD and covers the outer periphery of the pad PD.

The insulation film PA corresponds to the uppermost film (insulation film) of the semiconductor chip CP. Particularly, a resin film PA2 configuring the insulation film PA corresponds to the uppermost film (insulation film) of the semiconductor chip CP. The insulation film PA can function as a surface protection film for the semiconductor chip CP. The insulation film PA (particularly an insulation film PA1) can be assumed to be a passivation film.

The insulation film PA is provided as a laminated film of the insulation film PA1 and the resin film (organic insulation film) PA2 over the insulation film PA1. The insulation film PA1 functions as a passivation film and includes an inorganic insulation film. The insulation film PA can favorably use a silicon nitride film or a silicon oxynitride film. The silicon nitride film or the silicon oxynitride film is available as a less hygroscopic insulation film. The use of the silicon nitride film or the silicon oxynitride film for the insulation film PA1 can improve the moisture resistance of the semiconductor chip CP. The resin film PA2 is favorably provided as a polyimide film (polyimide resin film). The polyimide film is macromolecular, includes the imide binding as a repeating unit, and is available as a type of organic insulation films. The use of the resin film PA2 as a film for the uppermost layer (outermost surface) of the semiconductor chip CP can provide an advantage such as improved manageability (handling) of the semiconductor chip CP.

The insulation film PA1 and the resin film PA2 are each provided as an insulation film. The insulation film PA can be therefore considered as a laminated insulation film formed by laminating a plurality of insulation films (specifically, two insulation films such as the insulation film PA1 and the resin film PA2). Throughout the present application, the laminated insulation film signifies a laminated film made of a plurality of laminated insulation films.

The insulation film PA includes the opening OP3 that exposes at least part of the pad PD. The insulation film PA is a laminated film of the insulation film PA1 and the resin film PA2. Therefore, the opening OP3b in the resin film PA2 and the opening OP3a in the insulation film PA1 form the opening OP3 in the insulation film PA.

The opening OP3a pierces through the insulation film PA1 and is contained in the pad PD in a plan view. The plane size (plane area) of the opening OP3a is smaller than the plane size (plane area) of the pad PD. The pad PD includes a region overlapping with the opening OP3a and a region not overlapping with the opening OP3a. Specifically, the center of the pad PD is not covered with the insulation film PA1 and is exposed from the opening OP3a in the insulation film PA1. The outer periphery of the pad PD is covered with the insulation film PA1.

The opening OP3b pierces through the insulation film PA2 and is contained in the pad PD in a plan view. The plane size (plane area) of the opening OP3b is smaller than the plane size (plane area) of the pad PD. The pad PD includes a region overlapping with the opening OP3b and a region not overlapping with the opening OP3b. Specifically, the center of the pad PD is not covered with the insulation film PA2 and is exposed from the opening OP3b in the insulation film PA2. The outer periphery of the pad PD is covered with the insulation film PA2.

In a plan view, the opening OP3a at least partially overlaps with the opening OP3b. The region overlapping with the opening OP3a and the opening OP3b is positioned over the pad PD. The pad PD is exposed from the region overlapping with the opening OP3a and the opening OP3b.

In a plan view, it is favorable that the opening OP3b of the resin film PA2 is contained in the opening OP3a of the insulation film PA1. In this case, the plane size (plane area) of the opening OP3b is smaller than the plane size (plane area) of the opening OP3a. In a plan view, the whole of the opening OP3b overlaps with the opening OP3a. The opening OP3a includes the region overlapping with the opening OP3b and the region not overlapping with the opening OP3b.

Suppose the opening OP3b is contained in the opening OP3a in a plan view. The opening OP3 in the insulation film PA then actually corresponds to the opening OP3b in the resin film PA2. An inner wall (side wall) for the opening OP3b in the resin film PA2 forms an inner wall (side wall) for the opening OP3 in the insulation film PA. Suppose the opening OP3b is contained in the opening OP3a in a plan view. Neither the insulation film PA1 nor the resin film PA2 is formed over the pad PD in a region inside the opening OP3b in a plan view. The upper surface of the pad PD is exposed. Suppose the opening OP3b is contained in the opening OP3a in a plan view. The insulation film PA1 is not formed but the resin film PA2 is formed over the pad PD in a region inside the opening OP3a and outside the opening OP3b. In a region outside the opening OP3a, there is formed a laminated film of the insulation film PA1 and the resin film PA2 over the insulation film PA1 over the pad PD.

It is favorable to contain the opening OP3b in the opening OP3a in a plan view for the following reason.

The inner wall for the opening OP3b in the resin film PA2 forms the inner wall for the opening OP3 in the insulation film PA if the opening OP3b is contained in the opening OP3a in a plan view. The pillar electrode PL therefore touches the resin film PA2 but does not touch the insulation film PA1. The insulation film PA1 is relatively rigid. However, the resin film PA2 is softer than the insulation film PA1. The pillar electrode PL is formed over the pad PD so as to touch the soft resin film PA2 and not touch the rigid insulation film PA1. The resin film PA2 can thereby easily absorb a stress applied to (acting on) the pillar electrode PL. The stress absorbed by the resin film PA2 can restrain the stress applied to (acting on) the pillar electrode PL from being applied to an interlayer insulation film (IL1 through IL6) below the pillar electrode PL. The opening OP3b, if contained in the opening OP3a in a plan view, can reduce a stress applied from the pillar electrode PL to the interlayer insulation film (IL1 through IL6) below the pillar electrode PL.

In the manufactured semiconductor device PKG, the semiconductor chip CP is mounted over the upper surface CBa of the printed circuit board CB face-down, namely, in an orientation that allows the upper surface of the semiconductor chip CP to face the upper surface CBa of the printed circuit board CB. However, the reference to constituent elements (such as the interlayer insulation film) in the semiconductor chip CP assumes the upper surface side of the semiconductor chip CP to be upward and the rear surface side of the semiconductor chip CP to be downward regardless of before or after the semiconductor chip CP is mounted over the printed circuit board CB. In the semiconductor chip CP, therefore, the interlayer insulation film (IL1 through IL6) is considered to be positioned below the pillar electrode PL, not above the pillar electrode PL, before and after the semiconductor chip CP is mounted over the printed circuit board CB.

Planar shapes of the openings OP3a and OP3b are favorably circular. A planar shape of the pad PD is rectangular (more specifically, quadrangular) for example. Alternatively, a planar shape of the pad PD can be circular. The pad PD is favorably provided as an aluminum pad mainly made of aluminum.

Aluminum films used for aluminum pads favorably include not only a pure aluminum film, but also a compound film or an alloy film of Al (aluminum) and Si (silicon), a compound film or an alloy film of Al (aluminum) and Cu (copper), or a compound film or an alloy film of Al (aluminum), Si (silicon), and Cu (copper). The compositional ratio (content percentage) of Al (aluminum) in aluminum films used for aluminum pads is greater than 50 atomic percentages (i.e., Al-rich), or more favorably, greater than or equal to 98 atomic percentages.

The pillar electrode PL is formed over the pad PD exposed from the opening OP3 (i.e., the opening OP3b of the resin film PA2) of the insulation film PA.

Figure 35:
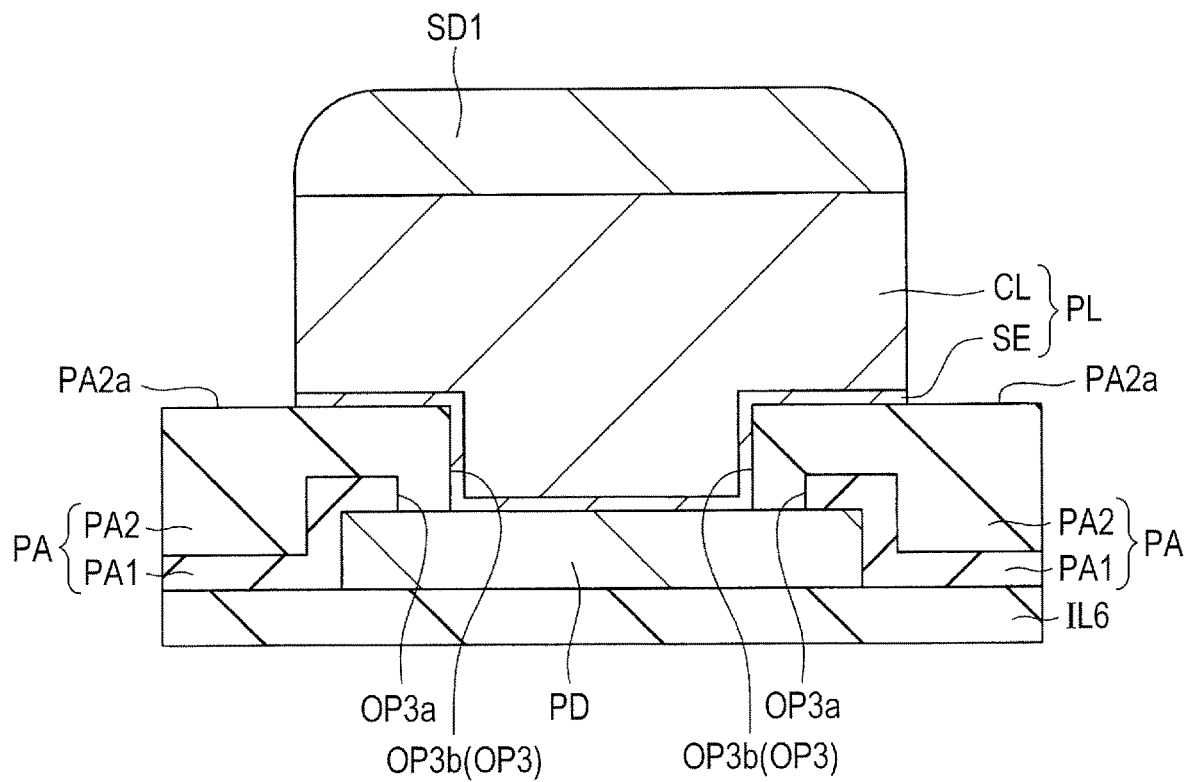
FIG. 35 is a partially sectional view of the semiconductor chip according to the embodiment continued from FIG. 34 when the manufacturing process is in progress.
Figure 36:
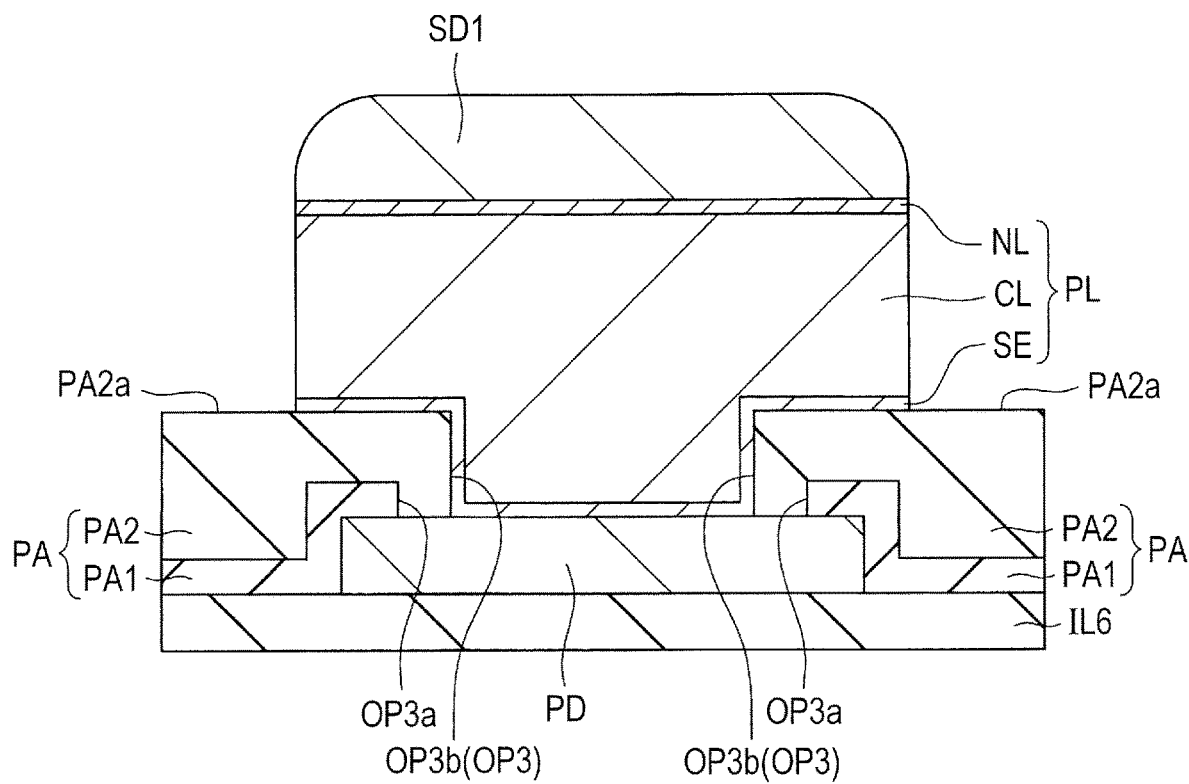
FIG. 36 is a partially sectional view of the semiconductor chip according to the embodiment similarly to FIG. 35 when the manufacturing process is in progress.

As illustrated in FIG. 35, the pillar electrode PL includes a seed layer SE and a copper (Cu) layer CL over the seed layer SE. The seed layer SE is thinner than the copper (Cu) layer CL. The pillar electrode PL is mainly formed of the copper (Cu) layer CL. As illustrated in FIG. 36 to be described, the pillar electrode PL may include the seed layer SE, the copper (Cu) layer CL over the seed layer SE, and a nickel (Ni) layer NL over the copper (Cu) layer CL. The seed layer SE includes a single-layer or multi-layer metal layer and is provided as a laminated film of a chrome (Cr) layer and a copper (Cu) layer over the chrome (Cr) layer, for example.

The solder layer SD1 is formed over the apical surface (upper surface) of the pillar electrode PL. The apical surface (upper surface) of the pillar electrode PL corresponds to the surface opposite the pad PD side.

In a plan view, the plane size (plane area) of the pillar electrode PL is larger than the plane size (plane area) of the opening OP3 (i.e., the opening OP3b of the resin film PA2) in the insulation film PA. The pillar electrode PL contains the opening OP3 (i.e., the opening OP3b of the resin film PA2) of the insulation film PA in a plan view (see FIG. 21). Part of the pillar electrode PL (corresponding to the outer periphery) therefore overlaps with the insulation film PA (resin film PA2). Namely, the pillar electrode PL is formed over the pad PD exposed from the opening OP3 (i.e., the opening OP3b in the resin film PA2) of the insulation film PA. Part of the pillar electrode PL (corresponding to the outer periphery) is positioned (raised) over the insulation film PA (resin film PA2).

The pillar electrode PL is provided as a columnar electrode having a three-dimensional columnar shape. According to the embodiment, the pillar electrode PL has a circular planar shape. The pillar electrode PL is shaped into a circular column.

The apical surface (upper surface) of the pillar electrode PL is almost flat. The apical surface (upper surface) of the pillar electrode PL is almost parallel to the upper surface of the pad PD. The apical surface (upper surface) of the pillar electrode PL and the upper surface of the pad PD are almost parallel to the principal surface of the semiconductor substrate SB configuring the semiconductor chip CP. The upper surface of the pad PD corresponds to the surface opposite the interlayer insulation film IL6.

The solder layer SD1 formed over the apical surface of the pillar electrode PL has a domical shape. As will be described later, the solder layer SD1 is first formed as a solder-plated layer. The solder-plated layer is later melted and re-hardened.

The apical surface of the pillar electrode PL is protruded more than the upper surface (principal surface) PA2a of the insulation film PA. The upper surface PA2a of the insulation film PA equals the upper surface of the resin film PA2. The upper surface PA2a of the insulation film PA and the upper surface of the resin film PA2 signify the same surface. The upper surface PA2a of the insulation film PA corresponds to the principal surface opposite the printed circuit board CB on condition that the semiconductor chip CP is mounted over the printed circuit board CB.

The pillar electrode PL therefore integrally includes a portion embedded in the opening OP3 (the opening OP3b in the resin film PA2) of the insulation film PA and a portion protruding from the upper surface PA2a of the insulation film PA. Of the pillar electrode PL, the portion protruding from the upper surface PA2a of the insulation film PA has a larger plane size (plane area) than the opening OP3 (the opening OP3b in the resin film PA2) of the insulation film PA. Of the pillar electrode PL, the portion embedded in the opening OP3 of the insulation film PA has a shape corresponding to the opening OP3 in the insulation film PA. Of the pillar electrode PL, the portion protruding from the upper surface PA2a of the insulation film PA contains the opening OP3 (the opening OP3b in the resin film PA2) in the insulation film PA in a plan view. Of the pillar electrode PL, the outer periphery of the portion protruding from the upper surface PA2a of the insulation film PA is therefore positioned (raised) over the upper surface PA2a of the insulation film PA. Part of the upper surface PA2a of the insulation film PA overlaps with the pillar electrode PL in a plan view and contacts with the pillar electrode PL (more specifically, the seed layer SE configuring the pillar electrode PL). The side wall of the opening OP3 (the opening OP3b in the resin film PA2) also contacts with the pillar electrode PL (more specifically, the seed layer SE configuring the pillar electrode PL).

The opening OP3 (the opening OP3b in the resin film PA2) of the insulation film PA is circular as a planar shape. Part of the pillar electrode PL embedded in the opening OP3 (the opening OP3b in the resin film PA2) in the insulation film PA therefore has a circular planar shape. Part of the pillar electrode PL embedded in the opening OP3 (the opening OP3b in the resin film PA2) in the insulation film PA therefore has a three-dimensional columnar shape. An opening OP4 in a photoresist layer RP1 (to be described) used to form the pillar electrode PL has a circular planar shape. Part of the pillar electrode PL protruding from the upper surface PA2a of the insulation film PA therefore has a circular planar shape. Part of the pillar electrode PL protruding from the upper surface PA2a of the insulation film PA therefore has a three-dimensional columnar shape.

The pillar electrodes PL are each formed (jointed) over the pads PD of the semiconductor chip CP. The solder layer SD1 is formed over each of the apical surfaces of the pillar electrodes PL.

With reference to FIG. 22, the description below explains a cross-section structure of the semiconductor chip CP including a structure below the interlayer insulation film IL6. FIG. 22 is a partially sectional view of the semiconductor chip CP according to the embodiment and provides a sectional view of the semiconductor chip CP including a structure below the interlayer insulation film IL6 illustrated in FIG. 20.

The semiconductor chip CP according to the embodiment includes a semiconductor device such as MISFET formed over the principal surface of the semiconductor substrate SB. A wiring structure (multi-layer wiring structure) including a plurality of wiring layers is formed over the semiconductor substrate SB. The description below specifically explains an exemplary configuration of the semiconductor chip CP according to the embodiment.

As illustrated in FIG. 22, semiconductor devices such as an MISFET (Metal Insulator Semiconductor Field Effect Transistor) are formed over the semiconductor substrate SB that is made of monocrystalline silicon and configures the semiconductor chip CP according to the embodiment. A plurality of MISFETs are formed over the semiconductor substrate SB. FIG. 22 representatively illustrates two MISFETs (n-channel MISFETQn and p-channel MISFETQp) out of the MISFETs.

For example, the STI (Shallow Trench Isolation) method is used to form an element isolation region ST over the principal surface of the semiconductor substrate SB. The semiconductor substrate SB includes the MISFETs (Qn and Qp) formed in an active region specified by the element isolation region ST.

For example, a p-well PW and an n-well NW are formed over the semiconductor substrate SB. A gate electrode G1 is formed over the p-well PW via a gate insulation film GF. A gate electrode G2 is formed over the n-well NW via a gate insulation film GF. An n-type semiconductor region NS for source-drain is formed in the p-well PW. A p-type semiconductor region PS for source-drain is formed in the n-well NW. The gate electrode G1, the gate insulation film GF below the gate electrode G1, and the n-type semiconductor region NS (source-drain region) at both sides of the gate electrode G1 form the n-channel MISFETQn. The gate electrode G2, the gate insulation film GF below the gate electrode G2, and the p-type semiconductor region PS (source-drain region) at both sides of the gate electrode G2 form the p-channel MISFETQp.

As above, the MISFET exemplifies the semiconductor device formed over the semiconductor substrate SB. Alternatively, a capacitive element, a resistive element, a memory element, or an otherwise configured transistor may be formed instead. As above, the monocrystalline silicon substrate exemplifies the semiconductor substrate SB. Alternatively, an SOI (Silicon On Insulator) substrate can be also used as the semiconductor substrate SB.

A wiring structure (multi-layer wiring structure) including a plurality of interlayer insulation films and a plurality of wiring layers is formed over the semiconductor substrate SB.

Namely, interlayer insulation films IL1, IL2, IL3, IL4, and IL5 are formed over the semiconductor substrate SB. A plug V1, via portions V2, V3, and V4, and wirings M1, M2, M3, and M4 are formed over the interlayer insulation films IL1, IL2, IL3, IL4, and IL5. An interlayer insulation film IL6 is formed over the interlayer insulation film IL5. A pad PD is formed over the interlayer insulation film IL6. A wiring (unshown) corresponding to the same layer may be formed over the interlayer insulation film IL6.

Specifically, the interlayer insulation film IL1 is formed over the semiconductor substrate SB so as to cover the MISFETs (Qn and Qp). The plug V1 is embedded in the interlayer insulation film IL1. The interlayer insulation film IL2 is formed over the insulation film IL1 embedded with the plug V1. The wiring M1 is embedded in the interlayer insulation film IL2. The interlayer insulation film IL3 is formed over the interlayer insulation film IL2 embedded with the wiring M1. The wiring M2 is embedded in the interlayer insulation film IL3. The interlayer insulation film IL4 is formed over the interlayer insulation film IL3 embedded with the wiring M2. The wiring M3 is embedded in the interlayer insulation film IL4. The interlayer insulation film IL5 is formed over the interlayer insulation film IL4 embedded with the wiring M3. The wiring M4 is embedded in the interlayer insulation film IL5. The interlayer insulation film IL6 is formed over the interlayer insulation film IL5 embedded with the wiring M4. The pad PD is formed over the interlayer insulation film IL6. Each of the interlayer insulation film IL1 through IL6 may be provided as a single-layer insulation film or as a laminated film of insulation films. The insulation film PA is formed over the interlayer insulation film IL6 so as to cover the pad PD. The opening OP3 is formed in the insulation film PA to expose part of the pad PD. The pillar electrode PL is formed over the pad PD exposed from the opening OP3 (the opening OP3b in the resin film PA2) in the insulation film PA.

The plug V1 is made of a conductive material and is placed below the wiring M1. The plug V1 electrically couples the wiring M1 with various semiconductor regions and the gate electrodes G1 and G2 formed over the semiconductor substrate SB.

The via portion V2 made of a conductive material is formed integrally with the wiring M2 and is placed between the wiring M2 and the wiring M1 to electrically couple the wiring M2 with the wiring M1. Namely, the dual damascene method is used to embed the interlayer insulation film IL3 with the wiring M2 and the via portion V2 formed integrally with the wiring M2. Alternatively, the single damascene method can be used to independently form the via portion V2 and the wiring M2. The same applies to the via portions V3, V4, and V5.

The via portion V3 made of a conductive material is formed integrally with the wiring M3 and is placed between the wiring M3 and the wiring M2 to electrically couple the wiring M3 with the wiring M2. Namely, the dual damascene method is used to embed the interlayer insulation film IL4 with the wiring M3 and the via portion V3 formed integrally with the wiring M3.

The via portion V4 made of a conductive material is formed integrally with the wiring M4 and is placed between the wiring M4 and the wiring M3 to electrically couple the wiring M4 with the wiring M3. Namely, the dual damascene method is used to embed the interlayer insulation film IL5 with the wiring M4 and the via portion V4 formed integrally with the wiring M4.

The wirings M1, M2, M3, and M4 have been illustrated and described as damascene wirings (embedded wirings) formed by the damascene method but are not limited to the damascene wirings. The wiring can be formed by patterning a conductive material film for wiring and may be provided as an aluminum wiring, for example.

The interlayer insulation film IL6 includes an opening (through-hole or through-bore) SH formed at a position to overlap with the pad PD in a plan view. The via portion V5 is formed (embedded) in the opening SH. The via portion V5 made of a conductive material is placed between the pad PD and the wiring M4 and electrically couples the pad PD with the wiring M4. Namely, the single damascene is used to embed the interlayer insulation film IL6 with the via portion V5.

The embodiment separately forms the via portion V5 and the pad PD. Alternatively, the via portion V5 and the pad PD can be formed integrally. To integrally form the via portion V5 and the pad PD, the via portion V5 is formed by embedding part of the pad PD in the opening SH in the interlayer insulation film IL6.

The configuration of the pad PD, the insulation film PA (including the openings OP3a and OP3b), and the pillar electrode PL is already described with reference to FIGS. 20 and 21 and a repetitive description is omitted here. The region assigned the reference symbol CPB in FIG. 7 corresponds to a region (wiring structure formation region) below the interlayer insulation film IL6 in FIG. 22.

The wiring structure (multi-layer wiring structure) of the semiconductor chip CP includes the wiring layers and the interlayer insulation films (IL1 through IL6). It is favorable to use a low-dielectric insulation film for one or more layers for the interlayer insulation films (IL1 through IL6) included in the wiring structure. The use of the low-dielectric insulation film can decrease a parasitic capacitance between wirings. Particularly, the use of low-dielectric insulation films for the interlayer insulation film IL2, IL3, IL4, and IL5 can reliably decrease a parasitic capacitance between wirings for the same layer or between vertically aligned wirings in terms of M1, M2, M3, and M4. The low-dielectric insulation film signifies an insulation film having a dielectric constant (relative permittivity) lower than that of oxide silicon and can be also referred to as a low-dielectric film or a Low-k film.

Manufacturing Process For the Semiconductor Chip

The description below explains the manufacturing process for the semiconductor chip CP according to the embodiment with reference to FIGS. 23 through 36. FIGS. 23 through 36 are partially sectional views of the semiconductor chip CP during the manufacturing process.

Figure 23:
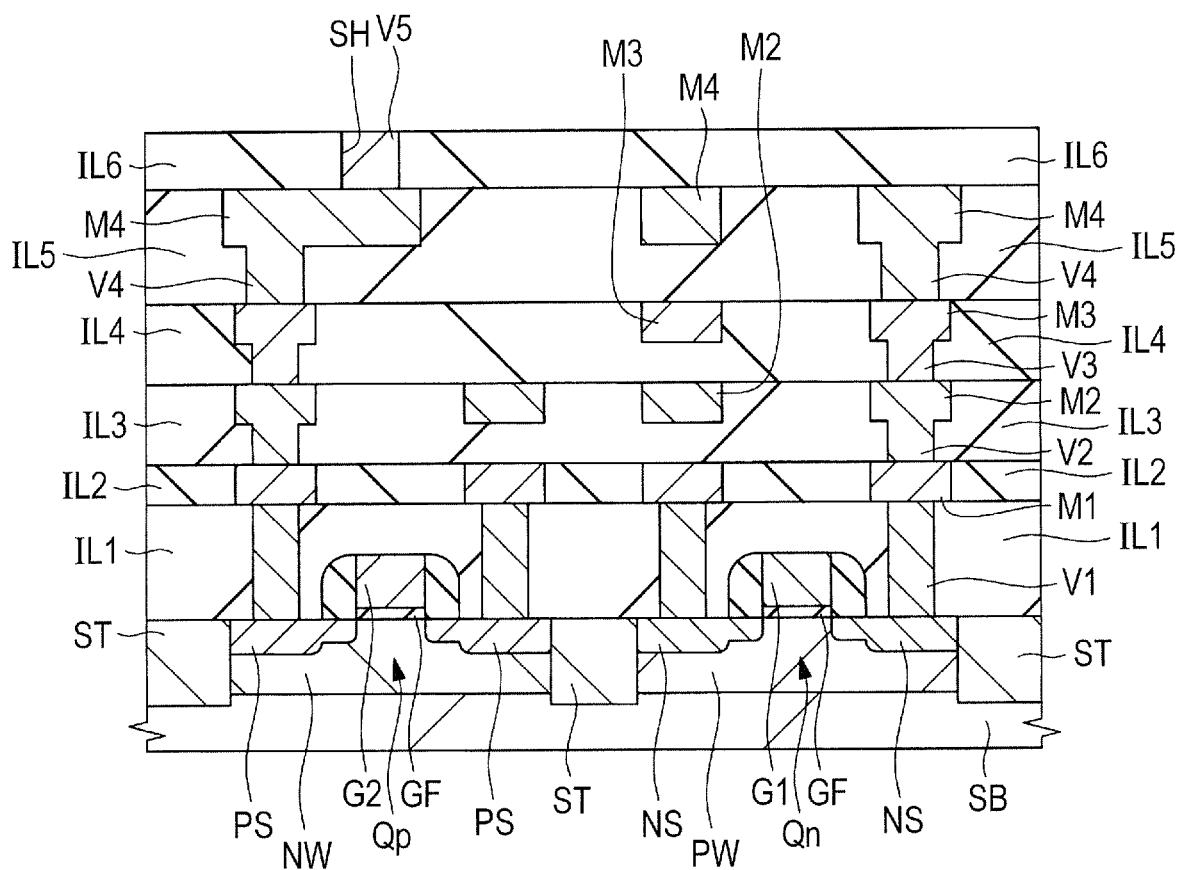
FIG. 23 is a partially sectional view of the semiconductor chip according to the embodiment when the manufacturing process is in progress.

As illustrated in FIG. 23, the semiconductor substrate (semiconductor wafer) SB is prepared (arranged). The semiconductor substrate SB is made of p-type monocrystalline silicon having a specific resistance of approximately 1 to 10 Ωcm. At this stage, the semiconductor substrate SB is available as a semiconductor wafer.

The STI method is then used to form the element isolation region ST over the semiconductor substrate SB. The ion implantation method is used to form the p-well PW and the n-well NW. The gate electrodes G1 and G2 are formed over the p-well PW and the n-well NW via the gate insulation film GF. The ion implantation method is used to form the n-type semiconductor region NS and the p-type semiconductor region PS. The n-channel MISFETQn and the p-channel MISFETQp are thereby formed over the semiconductor substrate SB.

The interlayer insulation film IL1 is formed over the semiconductor substrate SB so as to cover the MISFETQn and the MISFETQp. The photolithographic technique and the dry etching technology are used to form a contact hole in the interlayer insulation film IL1. A conductive film is embedded in the contact hole to form the plug V1.

The interlayer insulation film IL2 is formed over the interlayer insulation film IL1 embedded with the plug V1. The single damascene technology is then used to embed the wiring M1 in the interlayer insulation film IL2. The interlayer insulation film IL3 is formed over the interlayer insulation film IL2 embedded with the wiring M1. The dual damascene is used to embed the wiring M2 and the via portion V2 in the interlayer insulation film IL3. The interlayer insulation film IL4 is formed over the interlayer insulation film IL3 embedded with the wiring M2. The dual damascene technology is used to embedded the wiring M3 and the via portion V3 in the interlayer insulation film IL4. The interlayer insulation film IL5 is formed over the interlayer insulation film IL4 embedded with the wiring M3. The dual damascene technology is used to embed the wiring M4 and the via portion V4 in the interlayer insulation film IL5.

The photolithographic technique and the etching technology are used to form the opening SH in the interlayer insulation film IL6. Forming the opening SH in the interlayer insulation film IL6 exposes the upper surface of the wiring M4 at the bottom of the opening SH.

A conductive film for the via portion V5 is formed over the interlayer insulation film IL6 so as to embed in the opening SH. A CMP (Chemical Mechanical Polishing) method or an etch-back method is used to remove the conductive film (the conductive film for the via portion V5) outside the opening SH so that the conductive film (the conductive film for the via portion V5) remains in the opening SH. This can form the via portion V5 that is made of the conductive film (the conductive film for the via portion V5) and is embedded in the opening SH.

FIG. 23 illustrates the laminate structure from the semiconductor substrate SB to the interlayer insulation film IL6. However, FIGS. 24 through 36 to follow omit the structure below the interlayer insulation film IL6 to simplify the drawings. FIG. 23 illustrates the sectional region corresponding to FIG. 22. FIGS. 24 through 36 illustrate the sectional region corresponding to FIG. 20. FIGS. 24 through 36 therefore do not illustrate the opening SH and the via portion V5.

Figure 24:
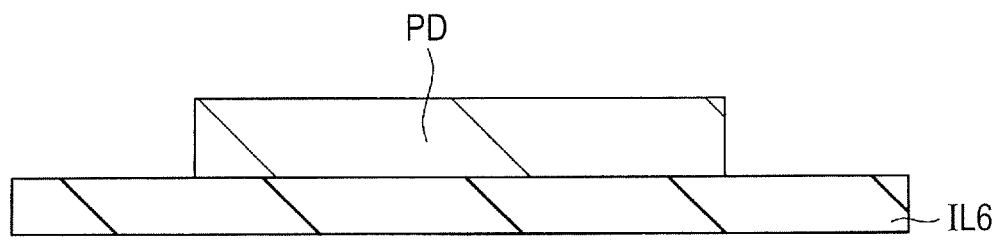
FIG. 24 is a partially sectional view of the semiconductor chip according to the embodiment continued from FIG. 23 when the manufacturing process is in progress.

As illustrated in FIG. 24, the pad PD is formed over the interlayer insulation film IL6 embedded with the via portion V5. For example, the pad PD can be formed by forming a conductive film for the pad PD over the interlayer insulation film IL6 embedded with the via portion V5 and then patterning the conductive film using the photolithographic technique and the etching technology. Patterning the conductive film for the pad PD can also form a wiring corresponding to the same layer as the pad PD as well as the pad PD. The above-mentioned aluminum film can be used as the conductive film for the pad PD. The pad PD can be approximately 2 to 3 μm thick.

There has been illustrated and described the case of separately forming the via portion V5 and the pad PD. Alternatively, the via portion V5 and the pad PD can be formed integrally. In this case, the pad PD is formed by forming a conductive film for the pad PD over the interlayer insulation film IL6 including the inside of the opening SH without forming the via portion V5 and then patterning the conductive film using the photolithographic technique and the etching technology. The pad PD and the via portion V5 are thereby formed integrally.

Figure 25:
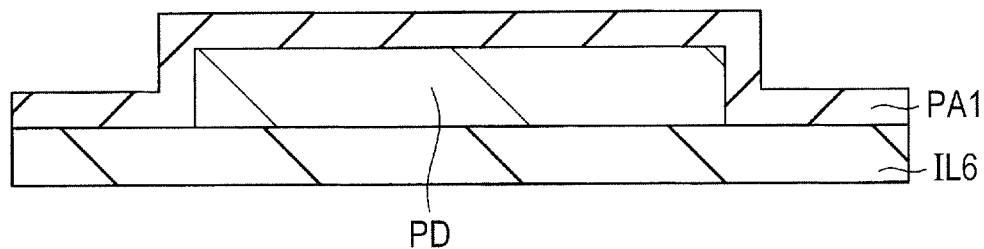
FIG. 25 is a partially sectional view of the semiconductor chip according to the embodiment continued from FIG. 24 when the manufacturing process is in progress.

As illustrated in FIG. 25, the insulation film PA1 is formed over the interlayer insulation film IL6 so as to cover the pad PD. The insulation film PA1 is favorably made of a silicon nitride film or a silicon oxynitride film and can be formed by using a CVD (Chemical Vapor Deposition) method. The HDP (High Density Plasma)-CVD method is particularly favorable as a method of forming the insulation film PA1. The insulation film PA1 can be approximately 0.1 to 2 μm thick, for example. The insulation film PA1, when formed, covers the pad PD that is therefore not exposed.

Figure 26:
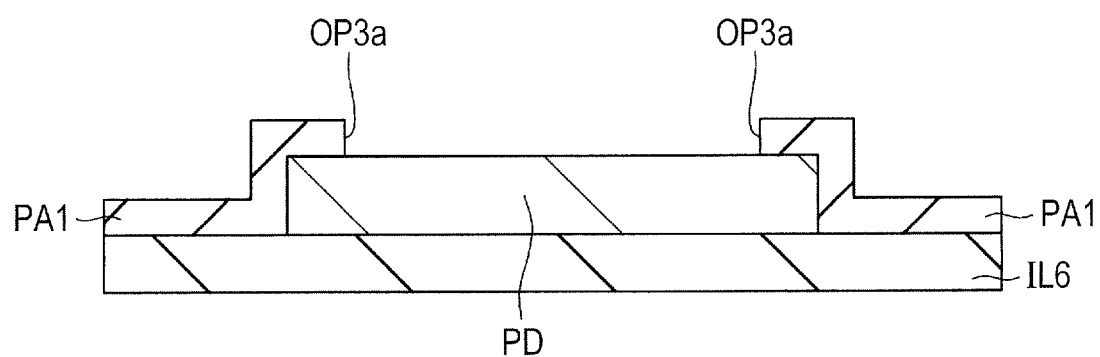
FIG. 26 is a partially sectional view of the semiconductor chip according to the embodiment continued from FIG. 25 when the manufacturing process is in progress.

As illustrated in FIG. 26, the opening OP3a is formed in the insulation film PA1. The opening OP3a is formed by selectively removing the insulation film PA1 from the pad PD so that the opening OP3a is contained in the pad PD in a plan view. After the insulation film PA1 is formed, for example, the photolithographic technique is used to form a photoresist pattern (unshown) over the insulation film PA1. The photoresist pattern is used as an etching mask to etch (dry etching) the insulation film PA1. The opening OP3a can be thereby formed in the insulation film PA1. The opening OP3a is formed so as to pierce through the insulation film PA1. At least part of the pad PD is exposed from the opening OP3a.

The conductive film for the pad PD may be available as a laminated film of a barrier conductor film (e.g., a titanium film, a titanium nitride film, or a laminated film of these), an aluminum film, and a barrier conductor film (e.g., a titanium film, a titanium nitride film, or a laminated film of these) from the bottom. The laminated film may be patterned to form the pad PD. In this case, it is favorable to remove the barrier conductor film (the barrier conductor film at the upper layer) exposed at the bottom of the opening OP3a using the etching and expose the aluminum film configuring the pad PD from the opening OP3a when the opening OP3a is formed in the insulation film PA1.

Figure 27:
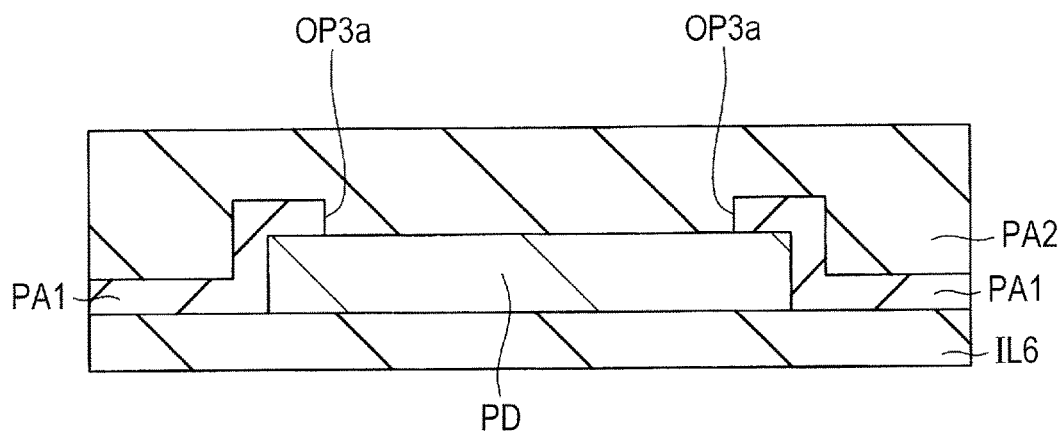
FIG. 27 is a partially sectional view of the semiconductor chip according to the embodiment continued from FIG. 26 when the manufacturing process is in progress.

As illustrated in FIG. 27, the resin film PA2 is formed over the insulation film PA1 including the pad PD exposed from the opening OP3a. The resin film PA2 is formed all over the principal surface of the semiconductor substrate SB and is therefore formed over the insulation film PA1 and the pad PD exposed from the opening OP3a in the insulation film PA1. The pad PD is exposed from the opening OP3a in the insulation film PA1 before the resin film PA2 is formed. After the resin film PA2 is formed, the resin film PA2 covers the pad PD exposed from the opening OP3a in the insulation film PA1 and the pad PD is not exposed. A polyimide film can be favorably used as the resin film PA2. A coating method can be used to form the resin film PA2. The thickness (formed film thickness) of the resin film PA2 is greater than the thickness (formed film thickness) of the insulation film PA1 and can be approximately 5 µm, for example.

Figure 28:
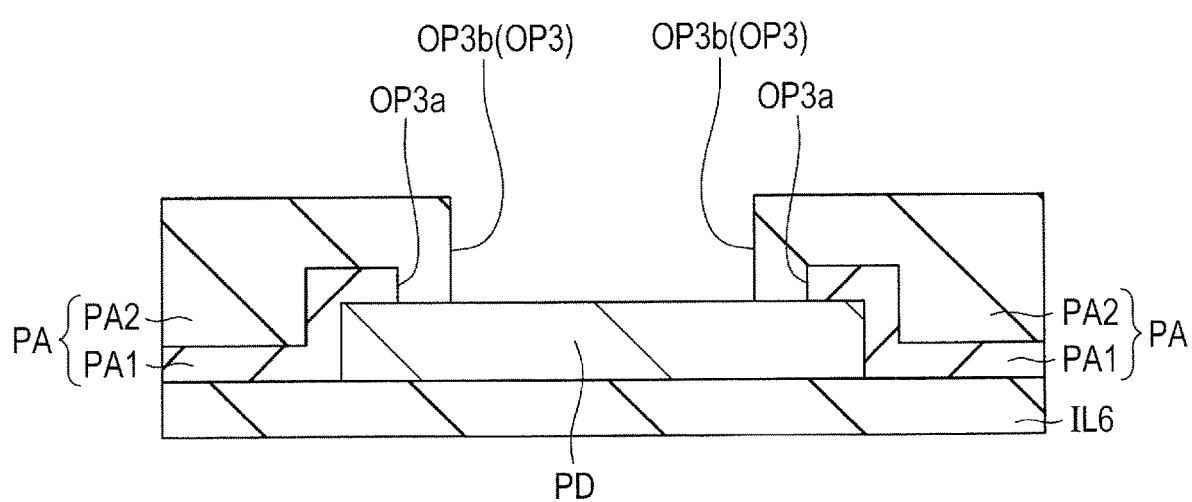
FIG. 28 is a partially sectional view of the semiconductor chip according to the embodiment continued from FIG. 27 when the manufacturing process is in progress.

As illustrated in FIG. 28, the opening OP3b is formed in the resin film PA2. The opening OP3b can be formed as follows, for example. Namely, the resin film PA2 is formed as a light-sensitive resin film. The resin film PA2 made of the light-sensitive resin is exposed and developed. Part of the resin film PA2 corresponding to the opening OP3b is selectively removed to form the opening OP3b in the resin film PA2. The heat treatment is then performed to harden the resin film PA2. The opening OP3b is formed so as to pierce through the resin film PA2. At least part of the pad PD is exposed from the opening OP3b.

Alternatively, the opening OP3b can be also formed in the resin film PA2 by applying a dry etching process to the resin film PA2 using an etching mask, namely, the photoresist layer formed over the resin film PA2 by using the photolithographic technique. In this case, the resin film PA2 need not be a light-sensitive resin film.

The opening OP3b in the resin film PA2 is formed to be contained in the opening OP3a in the insulation film PA1 in a plan view. Forming the opening OP3b in the resin film PA2 allows the resin film PA2 to cover the inner wall of the opening OP3a in the insulation film PA1.

As above, the insulation film PA is formed to include the opening OP3 that exposes at least part of the pad PD. The insulation film PA includes the insulation film PA1 and the resin film PA2. The opening OP3b in the resin film PA2 is contained in the opening OP3a in the insulation film PA1 in a plan view. The opening OP3 in the insulation film PA therefore actually corresponds to the opening OP3b in the resin film PA2. The inner wall (side wall) of the opening OP3b in the resin film PA2 configures the inner wall (side wall) of the opening OP3 in the insulation film PA.

Figure 29:
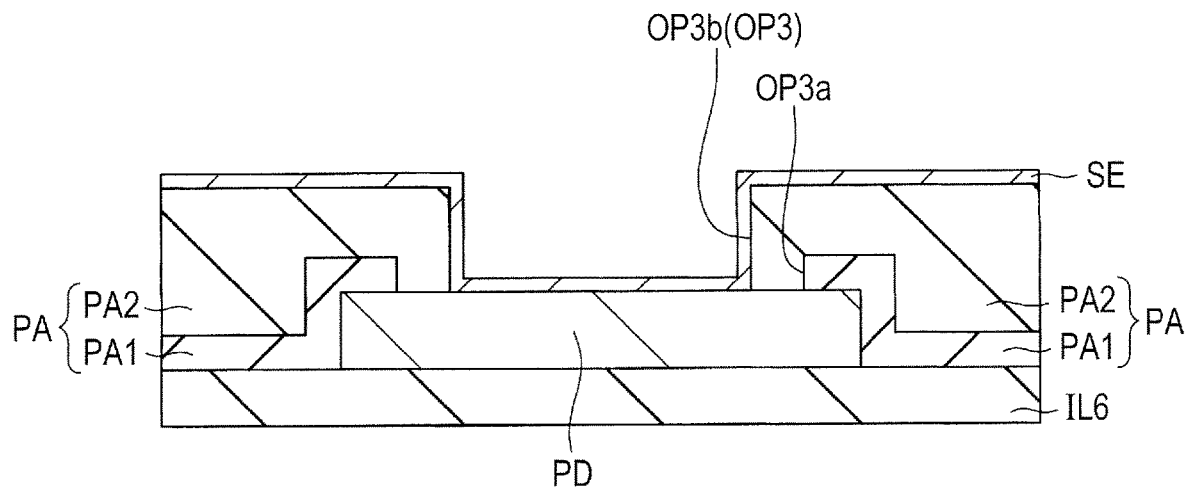
FIG. 29 is a partially sectional view of the semiconductor chip according to the embodiment continued from FIG. 28 when the manufacturing process is in progress.

As illustrated in FIG. 29, the seed layer (seed film) SE is formed over the insulation film PA (resin film PA2) including the side wall of the opening OP3 (OP3b) and part of the pad PD exposed from the opening OP3 (OP3b). The seed layer SE, when formed, covers the upper surface of the pad PD exposed from the opening OP3 (OP3b) and the upper surface is in contact with the seed layer SE.

The seed layer SE is made of one or more metal layers and can be formed by using a sputtering method. For example, the seed layer SE is available as a laminated film of a chromium (Cr) layer and a copper (Cu) layer over the chromium (Cr) layer. In this case, the chromium (Cr) layer can be approximately 0.1 µm thick, for example. The copper (Cu) layer can be approximately 0.2 µm thick, for example. The chromium (Cr) layer toward the bottom of the seed layer SE can function as a barrier conductor layer. For example, the chromium (Cr) layer has a function of preventing the copper diffusion or a function of improving the adherence property (adhesiveness) between the pillar electrode PL and the insulation film PA (resin film PA2) but is not the only option. The chromium (Cr) layer can be replaced by a titanium (Ti) layer, a titanium tungsten (TiW) layer, a titanium nitride (TiN) layer, or a tungsten (W) layer.

Figure 30:
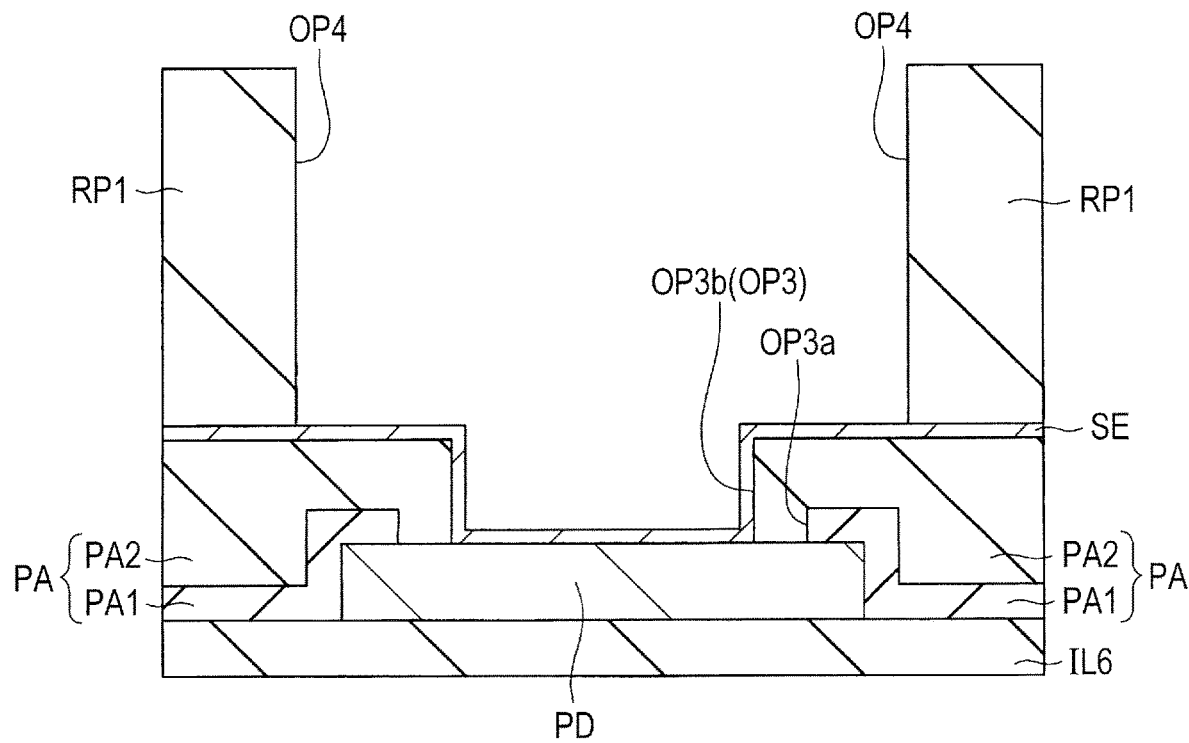
FIG. 30 is a partially sectional view of the semiconductor chip according to the embodiment continued from FIG. 29 when the manufacturing process is in progress.

As illustrated in FIG. 30, a photoresist layer (photoresist pattern) RP1 is formed over the seed layer SE by using the photolithographic technique. The photoresist layer RP1 includes an opening OP4 in a region reserved for formation of the pillar electrode PL.

The opening OP4 in the photoresist layer RP1 is contained in the pad PD in a plan view. The plane size (plane area) of the opening OP4 in the photoresist layer RP1 is larger than the plane size (plane area) of the opening OP3b in the resin film PA2. The opening OP4 in the photoresist layer RP1 contains the opening OP3b in the resin film PA2 in a plan view. The side wall (inner wall) of the opening OP3b in the resin film PA2 is positioned inside the opening OP4 in the photoresist layer RP1 in a plan view. The opening OP4 of the photoresist layer RP1 therefore exposes not only the seed layer SE corresponding to the part positioned over the pad PD, but also the seed layer SE corresponding to the part positioned over the resin film PA2.

Figure 31:
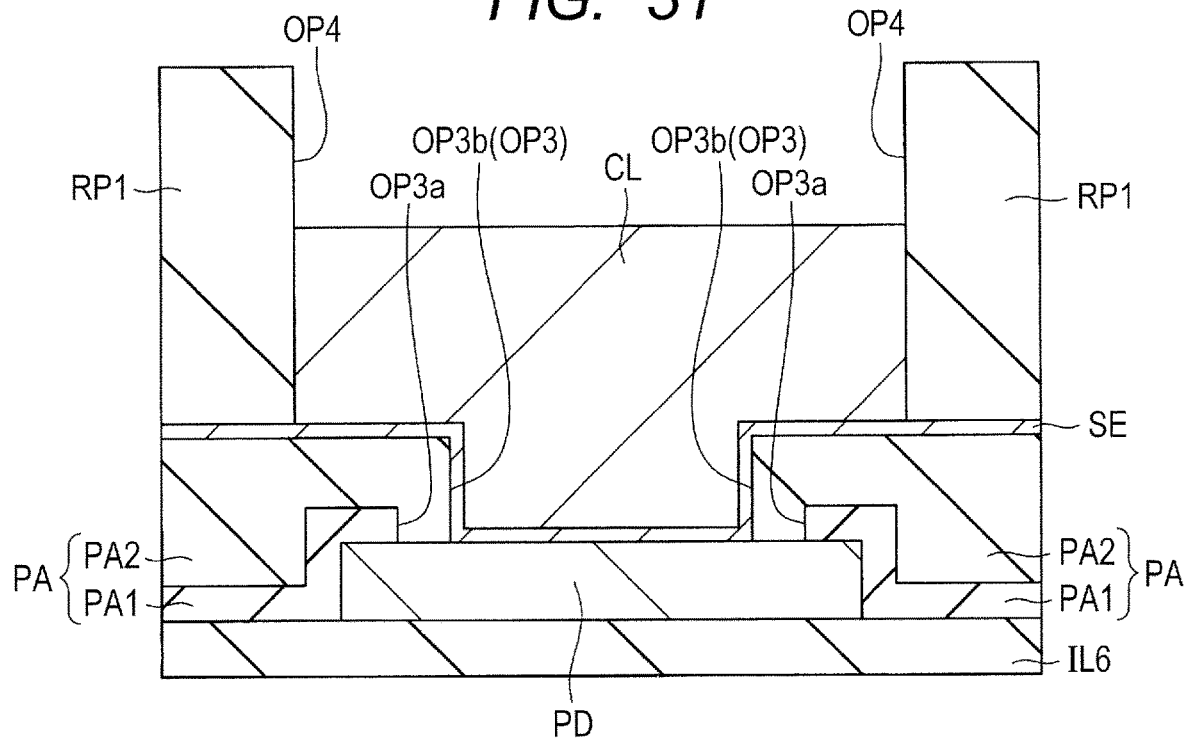
FIG. 31 is a partially sectional view of the semiconductor chip according to the embodiment continued from FIG. 30 when the manufacturing process is in progress.

As illustrated in FIG. 31, the plating method is used to form a copper (Cu) layer CL over the seed layer SE exposed from the opening OP4 in the photoresist layer RP1. The copper (Cu) layer CL equals a copper (Cu) plated layer. It is favorable to use the electrolytic plating process as a plating method of forming the copper (Cu) layer CL. The plating method is used to form the copper layer CL that is therefore selectively formed over part of the seed layer SE exposed from the opening OP4 in the photoresist layer RP1. The copper (Cu) layer CL is therefore selectively formed in the opening OP4 in the photoresist layer RP1. The copper (Cu) layer CL mainly forms the pillar electrode PL. The pillar electrode PL therefore equals a Cu pillar (Cu pillar electrode) mainly made of copper. The seed layer SE can function as a conductor layer for power supply when the electrolytic plating process is used to form the copper (Cu) layer CL. The copper layer CL is mainly made of copper (Cu). The content percentage of copper (Cu) is favorably greater than or equal to 99 atomic percentages.

Figure 32:
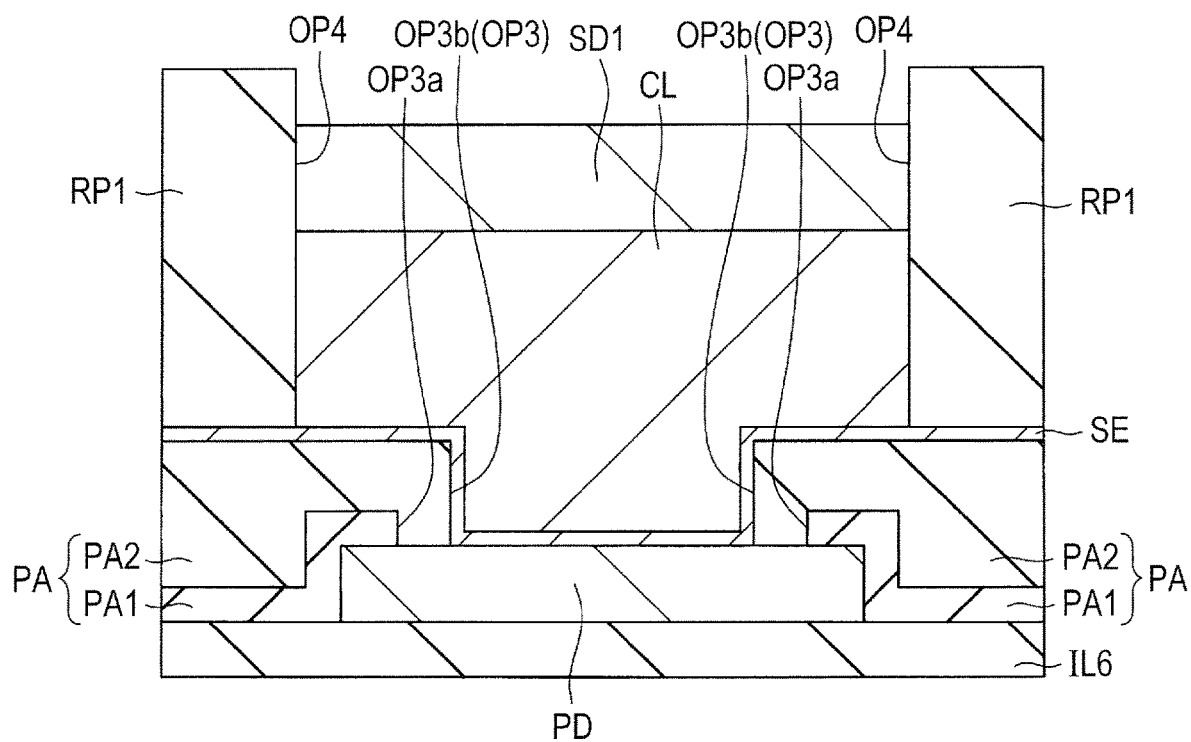
FIG. 32 is a partially sectional view of the semiconductor chip according to the embodiment continued from FIG. 31 when the manufacturing process is in progress.

As illustrated in FIG. 32, the plating method is used to form a solder layer (solder material or solder portion) SD1 over the copper (Cu) layer CL. The solder layer SD1 is made of solder (solder material). The solder layer SD1 provides a solder-plated layer formed by the plating method. It is favorable to use the electrolytic plating process as a plating method of forming the solder layer SD1. The copper (Cu) layer CL and the solder layer SD1 over it are selectively formed in the opening OP4 in the photoresist layer RP1.

Figure 33:
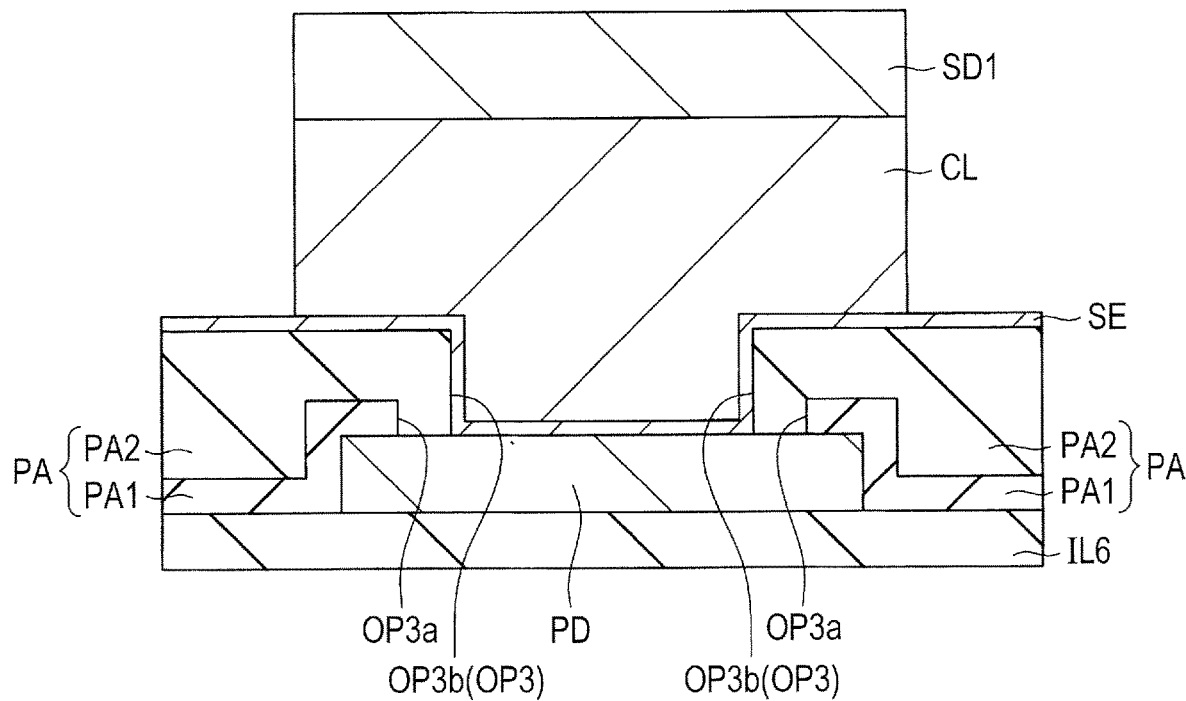
FIG. 33 is a partially sectional view of the semiconductor chip according to the embodiment continued from FIG. 32 when the manufacturing process is in progress.
Figure 34:
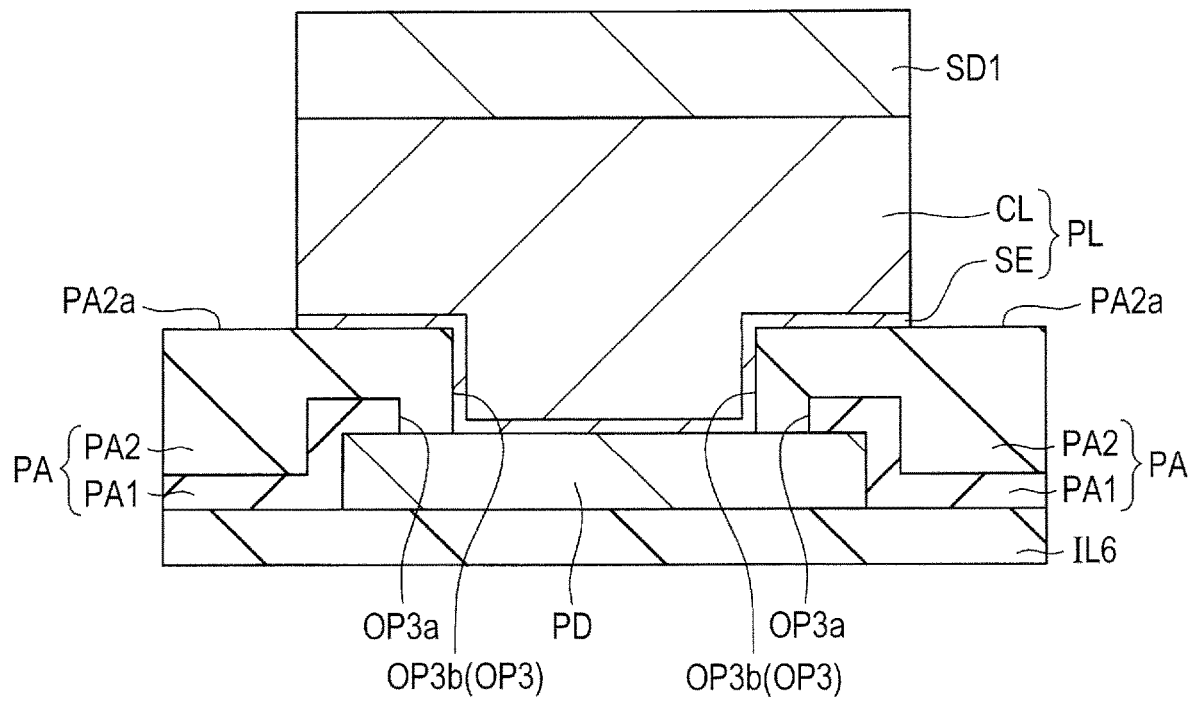
FIG. 34 is a partially sectional view of the semiconductor chip according to the embodiment continued from FIG. 33 when the manufacturing process is in progress.

As illustrated in FIG. 33, the photoresist layer RP1 is removed. As illustrated in FIG. 34, the etching is then used to remove the part of the seed layer SE not covered by the copper (Cu) layer CL. This removes part of the seed layer SE that is not covered with the copper (Cu) layer CL and is exposed. However, part of the seed layer SE covered with the copper (Cu) layer CL, namely, part of the seed layer SE positioned below the copper (Cu) layer CL, remains unremoved.

As illustrated in FIG. 34, the pillar electrode PL can be formed as above. The pillar electrode PL includes the copper (Cu) layer CL and the seed layer SE below the copper (Cu) layer CL. In other words, the pillar electrode PL includes the seed layer SE and the copper (Cu) layer CL over the seed layer SE. The seed layer SE is thinner than the copper (Cu) layer CL. The copper (Cu) layer CL mainly forms the pillar electrode PL. The solder layer SD1 is formed over the apical surface (upper surface) of the pillar electrode PL.

The copper (Cu) layer CL selectively grows over the seed layer SE exposed from the opening OP4 in the photoresist layer RP1. A side wall (inner wall) of the opening OP4 in the photoresist layer RP1 regulates the side surface of the copper (Cu) layer CL. The external shape of the copper (Cu) layer CL equals the shape of the opening OP4 in the photoresist layer RP1. Namely, the planar shape of the copper (Cu) layer CL corresponds to the planar shape of the opening OP4 in the photoresist layer RP1. Forming the shape (planar shape) of the opening OP4 in the photoresist layer RP1 into an intended shape can therefore form the copper (Cu) layer CL into an intended shape. The pillar electrode PL can be formed into an intended shape. The metal layer (the copper layer CL in this example) selectively formed inside the opening OP4 in the photoresist layer RP1 forms the pillar electrode PL. The pillar electrode PL is provided as a columnar electrode having a three-dimensional columnar shape. According to the embodiment, the opening OP4 in the photoresist layer RP1 is formed into a circular planar shape. The pillar electrode PL can therefore be formed into a circular planar shape. The pillar electrode PL can be formed into a columnar shape.

The shape of the solder layer SD1 approximately equals the shape of the pillar electrode PL. The shape of the solder layer SD1 is columnar when the shape of the pillar electrode PL is columnar. The heat treatment (thermal treatment) is then performed to once melt the solder layer SD1 and then re-harden it. The solder layer SD1 is deformed due to the surface tension of the melted solder. As illustrated in FIG. 35, the solder layer SD1 is formed into a domical shape. Performing the heat treatment can firmly joint the solder layer SD1 and the apical surface of the pillar electrode PL. The solder layer SD1 is stable when domed, making it possible to prevent the solder layer SD1 from being damaged or removed from the pillar electrode PL.

The pillar electrodes PL are formed (jointed) over the pads PD as above (according to the processes in FIGS. 29 through 35). The resulting structure forms the solder layer SD1 over each of the apical surfaces of the pillar electrodes PL.

There has been described the case of forming the copper (Cu) layer CL and then forming the solder layer SD1 over the copper (Cu) layer CL. Alternatively, the plating method (electrolytic plating process) may be used to form a nickel (Ni) layer over the copper (Cu) layer CL and form the solder layer SD1 over the nickel (Ni) layer after forming the copper (Cu) layer CL and before forming the solder layer SD1. In this case, the nickel layer (nickel-plated layer) intervenes between the copper (Cu) layer CL and the solder layer SD1 (see FIG. 36). FIG. 36 illustrates this case. The pillar electrode PL is formed of the seed layer SE, the copper (Cu) layer CL over the seed layer SE, and the nickel (Ni) layer NL over the copper (Cu) layer CL. FIG. 36 illustrates the same process stage as FIG. 35 and corresponds to the case of forming the nickel (Ni) layer NL over the copper (Cu) layer CL after forming the copper (Cu) layer CL and before forming the solder layer SD1. The nickel layer (nickel-plated layer) NL, when formed, is thinner than the copper (Cu) layer CL and is approximately 3 μm thick, for example. The thickness of the pillar electrode PL is configured to mainly depend on the copper (Cu) layer CL.

The semiconductor substrate SB is then ground or polished at the rear surface side as needed to thin the semiconductor substrate SB. The semiconductor substrate SB is then cut (diced) along with the laminate structure over the semiconductor substrate SB. A dicing blade (unshown) cuts (dices) the semiconductor substrate SB and the laminate structure over the semiconductor substrate SB along a scribe region. The semiconductor chip is thereby acquired from each chip region of the semiconductor substrate SB (semiconductor wafer).

The semiconductor chip CP can be manufactured in this manner.

Examination Background

The semiconductor device includes the semiconductor chip flip-chip bonded over the printed circuit board. In this case, the flip-chip bonding can be performed by coupling the solder bumps of the semiconductor chip to the terminals of the printed circuit board. However, a recent trend is to decrease an interval between solder bumps in the semiconductor chip based on an increase in the number of terminals for semiconductor chips and miniaturization of semiconductor chips.

The inventors examine whether the flip-chip bonding is performed by forming pillar electrodes over pads of the semiconductor chip and coupling the pillar electrodes of the semiconductor chip to the terminals of the printed circuit board via soldering.

The adopted structure solders the pillar electrodes of the semiconductor chip and the terminals of the printed circuit board. The use of pillar electrodes can easily increase an interval between the semiconductor chip and the printed circuit board. The underfill resin can be easily filled between the semiconductor chip and the printed circuit board even if an interval between adjacent pillar electrodes decreases due to an increase in the number of terminals for the semiconductor chip or miniaturization of the semiconductor chip. The use of pillar electrodes can also suppress the amount of solder for each solder junction, making it possible to easily prevent the solder junctions from being contacting and short-circuited each other even if an interval between adjacent pillar electrodes decreases due to an increase in the number of terminals for the semiconductor chip or miniaturization of the semiconductor chip. It is therefore favorable to adopt the structure that solders the pillar electrodes of the semiconductor chip and the terminals of the printed circuit board in order to satisfy the demand for an increasing number of terminals for the semiconductor chip or miniaturization of the semiconductor chip.

The semiconductor chip uses the wiring structure (multilayer wiring structure) including a plurality of wiring layers. The wiring formed for the wiring structure wires the elements formed in the semiconductor chip and thereby forms a semiconductor integrated circuit. The demand to miniaturize the semiconductor chip also requires fine wiring inside the semiconductor chip and shortens a distance (interval) between wirings. Shortening the distance between wirings increases the capacitance (parasitic capacitance) between adjacent wirings, posing risk of decreasing transmission rates of signals transmitted over the wiring, causing a signal delay, or increasing the power consumption. It is therefore favorable to decrease the capacitance (parasitic capacitance) between adjacent wirings by using a low-dielectric insulation film for the interlayer insulation film configuring the wiring structure. However, the low-dielectric insulation film indicates a smaller dielectric constant than the oxide silicon film but often indicates a lower intensity than the oxide silicon film.

Based on experiments and simulations, the inventors examined reliability of the semiconductor device when adopting the structure that solders the pillar electrodes of the semiconductor chip and the terminals of the printed circuit board. As a result, the inventors found that optimizing sizes of members is very important to improve the reliability of the manufactured semiconductor device when adopting the structure that solders the pillar electrodes of the semiconductor chip and the terminals of the printed circuit board.

For example, suppose the flip-chip bonding is performed to solder the pillar electrode of the semiconductor chip and the terminal of the printed circuit board. The pillar electrode PL is apt to apply a stress to the interlayer insulation film of the wiring structure for the semiconductor chip during cooling after the solder is melted and re-hardened. The interlayer insulation film is likely to be damaged and degraded if the pillar electrode PL applies a stress to the interlayer insulation film of the wiring structure for the semiconductor chip. Particularly, suppose the low-dielectric insulation film is used as an interlayer insulation film. The low-dielectric insulation film is easily damaged when the pillar electrode PL applies a stress to the low-dielectric insulation film that is low in intensity. Damaging the interlayer insulation film of the wiring structure for the semiconductor chip decreases the reliability of the semiconductor device including the semiconductor chip. Improving the reliability of the semiconductor device therefore requires decreasing a stress applied from the pillar electrode PL to the interlayer insulation film of the wiring structure for the semiconductor chip.

Based on experiments and simulations, the inventors newly found that thickness $h_1$ of the pillar electrode PL, diameter $D_1$ of the pillar electrode PL, and the thickness of the semiconductor substrate SB configuring the semiconductor chip CP are principal factors contributing to the magnitude of a stress applied from the pillar electrode PL to the interlayer insulation film positioned below the pillar electrode PL. The inventors also found that optimizing these factors as will be described later can approximately halve a stress applied from the pillar electrode PL to the interlayer insulation film positioned below the pillar electrode PL.

The embodiment can improve the reliability of the semiconductor device by optimizing sizes of members when adopting the structure that solders the pillar electrodes of the semiconductor chip and the terminals of the printed circuit board.

Major Features and Effects

The semiconductor device PKG according to the embodiment includes the printed circuit board CB and the semiconductor chip CP mounted over the printed circuit board CB. The semiconductor chip CP includes the interlayer insulation film IL6 (first insulation film), the pad PD formed over the interlayer insulation film IL6, the insulation film PA (second insulation film) having the opening OP3 (first opening) to expose part of the pad PD, and the pillar electrode PL formed over the pad PD exposed from the opening OP3. The printed circuit board CB includes the terminal TE and the resist layer SR1 (third insulation film) having the opening OP1 (second opening) to partially expose the terminal TE. The insulation film PA of the semiconductor chip CP includes the resin film PA2a as the principal surface (first principal surface) facing the printed circuit board CB. The resist layer SR1 of the printed circuit board CB includes the upper surface SR1a as the principal surface (second principal surface) facing the semiconductor chip CP. In a plan view, the pillar electrode PL contains the opening OP3 (first opening) in the insulation film PA. The pillar electrode PL partially overlaps with the insulation film PA. The pillar electrode PL of the semiconductor chip CP and the terminal TE of the printed circuit board CB are coupled via the solder layer SD intervening between the pillar electrode PL and the terminal TE.

The first feature of the embodiment is that thickness (first thickness or height) $h_1$ of the insulation film PA from the upper surface PA2a is half or greater than thickness (second thickness or height) $h_2$ of the solder layer SD from the upper surface SR1a of the resist layer SR1 and is smaller than or equal to thickness $h_2$. Namely, the first feature satisfies the relation of $h_2/2 \leq h_1 \leq h_2$. Thicknesses $h_1$ and $h_2$ are illustrated in FIGS. 7 and 17.

Satisfying the relation of $h_2/2 \leq h_1 \leq h_2$ signifies satisfying the relation of $h_1 \leq h_2 \leq h_1 \times 2$. The first feature therefore signifies that thickness $h_2$ of the resist layer SR1 from the upper surface SR1a is greater than or equal to and is smaller than or double the thickness $h_1$ of the pillar electrode PL from the upper surface PA2a of the insulation film PA.

Thickness $h_1$ can be assumed to be the thickness (height) of part of the pillar electrode PL protruding from the upper surface PA2a of the insulation film PA. Thickness $h_1$ can be also assumed to be a distance (viewed in the thickness direction of the semiconductor chip CP) between the upper surface PA2a of the insulation film PA and the apical surface of the pillar electrode PL. Thickness $h_1$ can be also assumed to be a thickness of part of the pillar electrode PL (i.e., part of the insulation film PA raised over the upper surface PA2a) positioned over the upper surface PA2a of the insulation film PA. Thickness $h_1$ represent a measurement viewed in the thickness direction of the semiconductor chip CP.

Thickness $h_2$ can be assumed to be the thickness (height) of part of the solder layer SD protruding from the upper surface SR1a of the resist layer SR1. Thickness $h_2$ can be also assumed to be a distance (viewed in the thickness direction of the printed circuit board CB) between the upper surface SR1a of the resist layer SR1 and the upper surface (i.e., a boundary face between the solder layer SD and the pillar electrode PL) of the solder layer SD. Thickness $h_2$ represent a measurement viewed in the thickness direction of the printed circuit board CB. When viewed in the thickness direction of the printed circuit board CB, the distance (interval) between the upper surface PA2a of the insulation film PA for the semiconductor chip CP and the upper surface SR1a of the resist layer SR1 for the printed circuit board CB corresponds to the sum of the thickness $h_1$ of the pillar electrode PL and thickness $h_2$ of the solder layer SD (i.e., $h_1+h_2$).

The description below explains why satisfying the first feature ($h_2/2 \leq h_1 \leq h_2$) is favorable.

The adopted structure provides the pillar electrode PL over the pad PD and uses the solder layer SD to couple the pillar electrode PL of the semiconductor chip CP and terminal TE of the printed circuit board CB. Advantages of the adopted structure are that the use of the pillar electrode PL increases an interval between the semiconductor chip CP and the printed circuit board CB and the use of the pillar electrode PL suppress the amount of solder for the solder junction. From this viewpoint, thickness $h_1$ of the pillar electrode PL is ideally great to some extent. Decreasing thickness $h_1$ of the pillar electrode PL dwindles the significance why the pillar electrode PL is used. From this viewpoint, thickness $h_1$ of the pillar electrode PL is ideally greater than or equal to half the thickness $h_2$ of the solder layer SD (i.e., $h_2/2 \leq h_1$). Satisfying the condition of $h_2/2 \leq h_1$ can reliably provide the above-mentioned advantage of using the pillar electrode PL. The underfill resin can be easily filled between the semiconductor chip CP and the printed circuit board CB even if an interval between adjacent pillar electrodes PL decreases due to an increase in the number of terminals for the semiconductor chip CP or miniaturization of the semiconductor chip CP. Ensuring thickness $h_1$ of the pillar electrode PL can suppress the amount of solder for each solder junction (solder layer SD in this example), making it possible to easily prevent the solder junctions from being contacting and short-circuited each other even if an interval between adjacent pillar electrodes PL decreases. It is therefore possible to encourage miniaturization and multiterminal configuration of the semiconductor chip CP.

Excessively increasing thickness $h_1$ of the pillar electrode PL causes an issue as follows. The insulation film PA (particularly the resin film PA2) below the pillar electrode PL absorbs a stress applied to the pillar electrode PL. However, increasing thickness $h_1$ of the pillar electrode PL increases a stress applied to the pillar electrode PL. The insulation film PA (particularly the resin film PA2) cannot fully absorb the stress. The stress is transmitted from the pillar electrode PL to the interlayer insulation films (IL1 through IL6) below the pillar electrode PL. The stress is applied to the interlayer insulation films (IL1 through IL6). Applying a stress from the pillar electrode PL to the interlayer insulation film positioned below the pillar electrode PL may damage the interlayer insulation film, degrading the reliability of the semiconductor device PKG. Based on experiments and simulations conducted by the inventors, the magnitude of a stress applied from the pillar electrode PL to the interlayer insulation films (IL1 through IL6) below the pillar electrode PL depends on thickness $h_1$ of the pillar electrode PL. Decreasing thickness $h_1$ of the pillar electrode PL is effective in decreasing a stress applied from the pillar electrode PL to the interlayer insulation films (IL1 through IL6) below the pillar electrode PL.

From this viewpoint, thickness $h_1$ of the pillar electrode PL is ideally greater than or equal to thickness h2 of the solder layer SD (i.e., $h_1 \leq h_2$). Satisfying the relation of $h_1 \leq h_2$ can decrease a stress applied from the pillar electrode PL to the interlayer insulation films (IL1 through IL6) below the pillar electrode PL. It is therefore possible to suppress or prevent the interlayer insulation film positioned below the pillar electrode PL from being damaged due to a stress from the pillar electrode PL and improve the reliability of the semiconductor device.

The first feature ideally satisfies the relation of $h_2/2 \leq h_1 \leq h_2$. This can reliably provide the above-mentioned advantage due to the use of the pillar electrode PL and reliably decrease a stress applied from the pillar electrode PL to the interlayer insulation films (IL1 through IL6) positioned below the pillar electrode PL. The reliability of the semiconductor device can thereby improve. An interval between adjacent pillar electrodes PL can be decreased, making it possible to encourage miniaturization and multiterminal configuration of the semiconductor chip CP.

Figure 37:
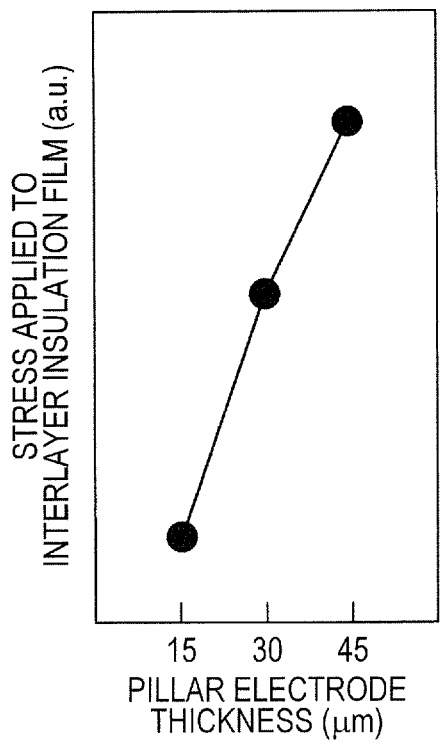
FIG. 37 is a graph illustrating a result of simulating correlation between a pillar electrode thickness and a stress applied from a pillar electrode to an interlayer insulation film.

FIG. 37 is a graph representing results of simulating the correlation between the pillar electrode thickness (horizontal axis in FIG. 37) and a stress (vertical axis in FIG. 37) applied from the pillar electrode to the interlayer insulation film below the pillar electrode. The horizontal axis in FIG. 37 represents the pillar electrode thickness and corresponds to thickness $h_1$ described above. As seen also from the graph in FIG. 37, decreasing the pillar electrode thickness ($h_1$) can decrease a stress applied from the pillar electrode to the interlayer insulation film below the pillar electrode. Favorably, thickness $h_1$ of the pillar electrode PL is approximately 15 through 25 μm. For example, a favorable combination is 20 μm as thickness $h_1$ of the pillar electrode PL and 30 μm as thickness $h_2$ of the solder layer SD.

The second feature of the embodiment is that the sum of thickness $h_1$ of the pillar electrode PL and thickness h2 of the solder layer SD (i.e., $h_1+h_2$) is greater than or equal to 0.5 times diameter $D_1$ of the pillar electrode PL and is smaller than or equal to 0.8 times the same. Namely, the second feature satisfies the relation of $D_1 \times 0.5 \leq h_1+h_2 \leq D_1 \times 0.8$. Diameter $D_1$ is illustrated in FIGS. 20 and 21. Diameter $D_1$ of the pillar electrode PL actually equals the diameter of the opening OP4 in the photoresist layer RP1.

Satisfying the relation of $D_1 \times 0.5 \leq h_1+h_2 \leq D_1 \times 0.8$ signifies satisfying the relation of $0.5 \leq (h_1+h_2)/D_1 \leq 0.8$.

The description below explains why satisfying the second feature is favorable.

Decreasing diameter $D_1$ of the pillar electrode PL to increase $(h_1+h_2)/D_1$ increases a stress acting in the direction allowing the pillar electrode PL to fall down. Increasing a stress acting in the direction allowing the pillar electrode PL to fall down is unfavorable because a stress is easily applied from the pillar electrode PL to the interlayer insulation films (IL1 through IL6) positioned below the pillar electrode PL. Increasing diameter $D_1$ of the pillar electrode PL is effective in decreasing a stress applied from the pillar electrode PL to the interlayer insulation film below the pillar electrode PL. From this viewpoint, it is favorable to set $(h_1+h_2)/D_1$ to be smaller than or equal to 0.8.

Increasing diameter $D_1$ of the pillar electrode PL to decrease $(h_1+h_2)/D_1$ decreases a volume of the underfill resin (resin portion UFR) to be filled between the semiconductor chip CP and the printed circuit board CB and may degrade a protection effect provided by the underfill resin. Increasing diameter $D_1$ of the pillar electrode PL to decrease $(h_1+h_2)/D_1$ increases an arrangement pitch of the pillar electrode PL and is disadvantageous to miniaturization and multiterminal configuration of the semiconductor chip. It is therefore unfavorable to increase diameter $D_1$ of the pillar electrode PL and excessively decrease $(h_1+h_2)/D_1$. From this viewpoint, it is favorable to set $(h_1+h_2)/D_1$ to be greater than or equal to 0.5.

The second feature ideally assumes that the sum of thickness $h_1$ of the pillar electrode PL and thickness $h_2$ of the solder layer SD is greater than or equal to 0.5 times diameter $D_1$ of the pillar electrode PL and is smaller than or equal to 0.8 times the same (namely $D_1 \times 0.5 \leq h_1+h_2 \leq D_1 \times 0.8$). This can suppress a stress acting in the direction allowing the pillar electrode PL to fall down and hinder a stress from being applied from the pillar electrode PL to the interlayer insulation films (IL1 through IL6) positioned below the pillar electrode PL. The reliability of the semiconductor device can improve. It is possible to ensure the volume of the underfill resin (resin portion UFR) to be filled between the semiconductor chip CP and the printed circuit board CB and reliably produce the protection effect provided by the underfill resin. The arrangement pitch of the pillar electrode PL can be easily decreased. This is advantageous to miniaturization and multiterminal configuration of the semiconductor chip.

Figure 38:
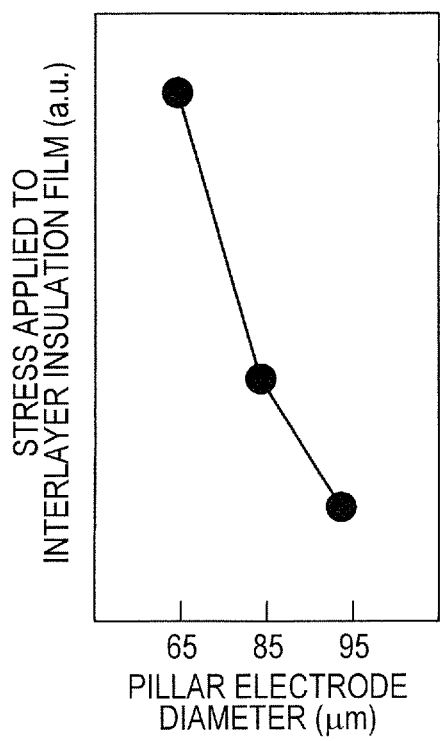
FIG. 38 is a graph illustrating a result of simulating correlation between a pillar electrode diameter and a stress applied from a pillar electrode to an interlayer insulation film.

FIG. 38 is a graph representing results of simulating the correlation between the pillar electrode diameter (horizontal axis in FIG. 38) and a stress (vertical axis in FIG. 38) applied from the pillar electrode to the interlayer insulation film below the pillar electrode. The horizontal axis in FIG. 38 represents the pillar electrode diameter and corresponds to diameter $D_1$ described above. As seen also from the graph in FIG. 38, increasing the pillar electrode diameter ($D_1$) can decrease a stress applied from the pillar electrode to the interlayer insulation film below the pillar electrode. Favorably, diameter $D_1$ of the pillar electrode PL is approximately 85 through 105 μm.

The third feature of the embodiment is that diameter D2 of the opening OP3 in the insulation film PA is greater than or equal to 0.4 times diameter $D_1$ of the pillar electrode PL and is smaller than or equal to 0.75 times the same. Namely, the third feature satisfies the relation of $D_1 \times 0.4 \leq D2 \leq D_1 \times 0.75$. Diameters $D_1$ and D2 are illustrated in FIGS. 20 and 21. The opening OP3b in the resin film PA2 configures the opening OP3 in the insulation film PA. Diameter D2 of the opening OP3 in the insulation film PA therefore equals the diameter of the opening OP3b in the resin film PA2.

The description below explains why satisfying the third feature is favorable.

Decreasing diameter D2 of the opening OP3 in the insulation film PA also decreases the diameter of part of the pillar electrode PL embedded in the opening OP3 in the insulation film PA and increases a current density at part of the electrode PL embedded in the opening OP3 in the insulation film PA. It is unfavorable to increase the current density in part of the pillar electrode PL embedded in the opening OP3 in the insulation film PA because the pillar electrode PL easily degrades (e.g., due to electromigration) and EM (ElectraMigration) lifetime may decrease. Increasing diameter D2 of the opening OP3 in the insulation film PA effectively suppresses degradation of the pillar electrode PL. From this viewpoint, diameter D2 of the opening OP3 in the insulation film PA is ideally greater than or equal to 0.4 times diameter $D_1$ of the pillar electrode PL (i.e., $D_1 \times 0.4 \leq D2$).

The insulation film PA (particularly the resin film PA2) has the function as a buffer layer (stress buffer layer or stress absorption layer). The insulation film PA (particularly the resin film PA2) as a buffer layer absorbs a stress applied to the pillar electrode PL. However, increasing diameter D2 of the opening OP3 in the insulation film PA degrades the function of the insulation film PA (particularly the resin film PA2) as a buffer layer and decreases the effect of the insulation film PA (particularly the resin film PA2) to absorb a stress applied to the pillar electrode PL. A stress is easily applied from the pillar electrode PL to the interlayer insulation films (IL1 through IL6) below the pillar electrode PL.

A countermeasure against the electromigration may decrease the current density at the pillar electrode PL. For this purpose, however, excessively increasing diameter D2 of the opening OP3 in the insulation film PA used to couple the pillar electrode PL with pad PD degrades the function of the insulation film PA (particularly the resin film PA2) as a buffer layer. A stress applied from the pillar electrode PL to the interlayer insulation film increases and the interlayer insulation film may be damaged. It is therefore unfavorable to excessively increase diameter D2 of the opening OP3 in the insulation film PA. Decreasing diameter D2 of the opening OP3 in the insulation film PA is effective in decreasing a stress applied from the pillar electrode PL to the interlayer insulation films (IL1 through IL6) below the pillar electrode PL. From this viewpoint, diameter D2 of the opening OP3 in the insulation film PA is ideally smaller than or equal to 0.75 times diameter $D_1$ of the pillar electrode PL (i.e., $D2 \leq D_1 \times 0.75$).

The third feature ideally assumes that diameter D2 of the opening OP3 in the insulation film PA is greater than or equal to 0.4 times diameter $D_1$ of the pillar electrode PL and is smaller than or equal to 0.75 times the same (i.e., $D_1 \times 0.4 \leq D2 \leq D_1 \times 0.75$). It is therefore possible to suppress the current density at part of the pillar electrode PL embedded in the opening OP3 in the insulation film PA, suppress degradation (e.g., due to electromigration) of the pillar electrode PL, and improve the EM lifetime. It is also possible to reliably ensure the function of the insulation film PA (particularly the resin film PA2) as a buffer layer and decrease a stress applied from the pillar electrode PL to the interlayer insulation films (IL1 through IL6) below the pillar electrode PL. The reliability of the semiconductor device can be therefore improved.

As the fourth feature according to the embodiment, the insulation film PA includes the laminate structure of the insulation film PA1 made of an inorganic insulation film and the resin film PA2 over the insulation film PA1. In a plan view, the opening OP3a (third opening) in the insulation film PA1 contains the opening OP3b (fourth opening) in the resin film PA2. The opening OP3b in the resin film PA2 forms the opening OP3 in the insulation film PA.

The description below explains why satisfying the fourth feature is favorable.

The insulation film PA includes the laminate structure of the insulation film PA1 and the resin film PA2 over the insulation film PA1. Suppose the opening OP3a in the insulation film PA1 contains the opening OP3b in the resin film PA2 in a plan view. The inner wall of the opening OP3b in the resin film PA2 then configures the inner wall of the opening OP3 in the insulation film PA. The pillar electrode PL touches the resin film PA2 but does not touch the insulation film PA1. The resin film PA2 is made of a resin material and is therefore relatively soft. The resin film PA2 excels in the function as a buffer layer (stress buffer layer or stress absorption layer) that absorbs a stress applied to the pillar electrode PL. The resin film PA2 can easily absorb a stress applied to the pillar electrode PL because the pillar electrode PL touches the resin film PA2 but does not touch the insulation film PA1. It is possible to decrease a stress applied from the pillar electrode PL to the interlayer insulation films (IL1 through IL6) below the pillar electrode PL. It is therefore possible to suppress or prevent the interlayer insulation film positioned below the pillar electrode PL from being damaged due to a stress from the pillar electrode PL. Satisfying the fourth feature is therefore favorable and can thereby improve the reliability of the semiconductor device. For example, a favorable combination is approximately 55 μm as the diameter of the opening OP3a and approximately 40 μm as the diameter of the opening OP3b.

Primarily, the resin film PA2 over the insulation film PA1 functions as a buffer layer that absorbs a stress applied to the pillar electrode PL. The insulation film (i.e., the resin film PA2) made of a resin material is used as a film at the topmost layer of the semiconductor chip CP in order to improve the function as the buffer layer. A polyimide resin film is particularly favorable for the resin film PA2 in consideration of this function (as the buffer layer) of the resin film PA2. The resin film PA2 can thereby more reliably absorb the stress applied to the pillar electrode PL. It is possible to more reliably decrease the stress applied from the pillar electrode PL to the interlayer insulation films (IL1 through IL6) below the pillar electrode PL.

The insulation film PA1 is made of an inorganic insulation film and can therefore reliably function as a passivation film. The insulation film PA1 is more ideally be made of a silicon nitride film or a silicon oxynitride film. It is thereby possible to improve the moisture resistance of the semiconductor chip CP and consequently the reliability of the semiconductor device.

As the fifth feature according to the embodiment, thickness (third thickness) T1 of the resin film PA2 between the pad PD and the pillar electrode PL is greater than the thickness (fourth thickness) T2 of the pad PD and is smaller than thickness $h_1$ of the pillar electrode PL. Namely, the fifth feature satisfies the relation of $T2<T1<h_1$. Thicknesses T1 and T2 are illustrated in FIGS. 7 and 20.

Thickness T1 corresponds to the thickness of part of the resin film PA2 intervening between the upper surface of the pad PD (the upper surface of part of the pad PD not covered with the insulation film PA1) and the pillar electrode PL (part of the pillar electrode PL raised over the resin film PA2). In other words, thickness T1 corresponds to the thickness of the resin film PA2 in a region inside the opening OP3a and outside the opening OP3b in a plan view. Thicknesses T1 and T2 are measurements viewed in the thickness direction of the semiconductor chip CP.

The description below explains why satisfying the fifth feature is favorable.

Decreasing the thickness (T1) of the resin film PA2 degrades the function of the resin film PA2 as a buffer layer and decreases the effect of the resin film PA2 to absorb a stress applied to the pillar electrode PL. A stress is easily applied from the pillar electrode PL to the interlayer insulation films (IL1 through IL6) below the pillar electrode PL. It is therefore unfavorable to excessively decrease the thickness (T1) of the resin film PA2. Increasing the thickness (T1) of the resin film PA2 is effective in decreasing a stress applied from the pillar electrode PL to the interlayer insulation films (IL1 through IL6) below the pillar electrode PL. From this viewpoint, thickness T1 of the resin film PA2 is ideally be greater (thicker) than thickness T2 of the pad PD (i.e., $T2<T1$).

Excessively increasing the thickness (T1) of the resin film PA2 easily warps the semiconductor chip CP due to a difference between the heat shrinkage rate of the resin film PA2 and the heat shrinkage rate of the interlayer insulation films (IL1 through IL6) configuring the wiring structure. It is therefore unfavorable to excessively increase the thickness (T1) of the resin film PA2. From this viewpoint, thickness T1 of the resin film PA2 is ideally be smaller than thickness $h_1$ of the pillar electrode PL (i.e., $T1<h_1$).

The fifth feature ideally assumes that thickness T1 of the resin film PA2 is greater the thickness T2 of the pad PD and is smaller than thickness h1 of the pillar electrode PL (i.e., $T2<T1<h_1$). It is possible to reliably ensure the function of the resin film PA2 as a buffer layer and decrease a stress applied from the pillar electrode PL to the interlayer insulation films (IL1 through IL6) below the pillar electrode PL. It is therefore possible to suppress or prevent the interlayer insulation film positioned below the pillar electrode PL from being damaged due to a stress from the pillar electrode PL. It is possible to easily suppress or prevent the semiconductor chip CP from being unnecessarily warped due to a difference between the heat shrinkage rate of the resin film PA2 and the heat shrinkage rate of the interlayer insulation films (IL1 through IL6). The reliability of the semiconductor device can improve.

Figure 39:
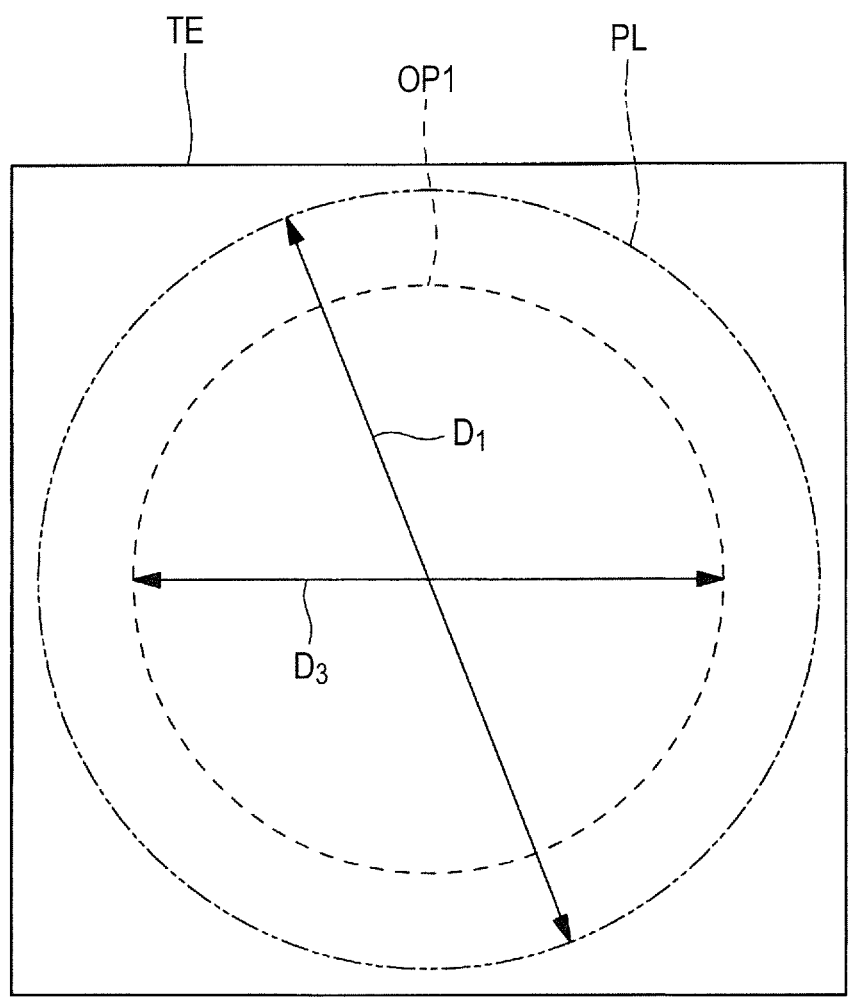
FIG. 39 is a partial plan view of the semiconductor device in FIG. 4.

As the sixth feature of the embodiment, diameter $D_3$ of the opening OP1 in the resist layer SR1 is smaller than diameter $D_1$ of the pillar electrode PL (see FIG. 39). Namely, the sixth feature satisfies the relation of $D_3<D_1$. Diameter $D_3$ is illustrated in FIGS. 11 and 39. In other words, the sixth feature assumes that the opening OP1 in the resist layer SR1 is contained in the pillar electrode PL in a plan view. FIG. 39 is a partial plan view of the semiconductor device PKG. FIG. 39 provides a planar layout of the terminal for the printed circuit board CB, the opening OP1 in the resist layer SR1, and the pillar electrode PL in the semiconductor device PKG.

The description below explains why satisfying the sixth feature is favorable.

Part of the solder layer SD1 easily rises over a side surface of the pillar electrode PL if the diameter $D_3$ of the opening OP1 in the resist layer SR1 is larger than diameter $D_1$ of the pillar electrode PL in a plan view. It is unfavorable to raise part of the solder layer SD1 over the side surface of the pillar electrode PL because the underfill resin (resin portion UFR) is hardly filled in between the semiconductor chip CP and the printed circuit board CB. It is unfavorable to raise part of the solder layer SD1 over the side surface of the pillar electrode PL because there increases a risk of short-circuiting between adjacent pillar electrodes PL. It is unfavorable to raise part of the solder layer SD1 over the side surface of the pillar electrode PL because thickness $h_2$ of the solder layer SD decreases corresponding to the raised part and narrows an interval between the semiconductor chip CP and the printed circuit board CB.

The sixth feature ideally assumes that diameter $D_3$ of the opening OP1 in the resist layer SR1 is smaller than diameter $D_1$ of the pillar electrode PL in a plan view. In other words, the opening OP1 in the resist layer SR1 is ideally contained in the pillar electrode PL. The solder layer SD coupling the pillar electrode PL with the terminal TE is shaped as illustrated in FIG. 7, making it difficult for the solder configuring the solder layer SD1 to rise over the side surface of the pillar electrode PL. It is therefore possible to easily fill the underfill resin (resin portion UFR) in between the semiconductor chip CP and the printed circuit board CB and easily manufacture the semiconductor device PKG. It is possible to decrease a risk of short-circuiting between adjacent pillar electrodes PL and therefore improve the reliability of the semiconductor device. For example, a favorable combination is approximately 85 to 105 μm as diameter $D_1$ of the pillar electrode PL and approximately 65 to 75 μm as diameter $D_3$ of the opening OP1 in the resist layer SR1.

The arrangement pitch of the pillar electrode PL for the semiconductor chip CP is ideally be larger than a value ($D_1$+15 μm) resulting from adding 15 μm to diameter $D_1$ of the pillar electrode PL. Namely, it is favorable to ensure 15 μm or more for the closest distance (an interval between most adjacent locations) between adjacent pillar electrodes PL in a plan view. It is therefore possible to easily fill the underfill resin (resin portion UFR) in between the semiconductor chip CP and the printed circuit board CB. An available example is approximately 85 to 105 µm as diameter $D_1$ of the pillar electrode PL and approximately 130 µm as the arrangement pitch of the pillar electrode PL.

The description below explains a further supplement to the sixth feature. As above, the sixth feature assumes that diameter $D_3$ of the opening OP1 in the resist layer SR1 is smaller than diameter $D_1$ of the pillar electrode PL ($D_3<D_1$). It is particularly favorable if diameter $D_3$ of the opening OP1 in the resist layer SR1 is larger than or equal to 0.7 times diameter $D_1$ of the pillar electrode PL and is smaller than or equal to 0.8 times the same ($D_1 \times 0.7 \leq D_3 \leq D_1 \times 0.8$). The reason follows.

As above, the sixth feature assumes that diameter $D_3$ of the opening OP1 in the resist layer SR1 is smaller than diameter $D_1$ of the pillar electrode PL ($D_3<D_1$) in a plan view. In other words, the opening OP1 in the resist layer SR1 is contained in the pillar electrode PL. The solder configuring the solder layer SD1 thereby hardly rises over the side surface of the pillar electrode PL. However, there is a need to reliably prevent the solder configuring the solder layer SD1 from rising over the side surface of the pillar electrode PL. A favorable solution is not only setting diameter $D_3$ of the opening OP1 in the resist layer SR1 to be smaller than diameter $D_1$ of the pillar electrode PL in a plan view, but also setting diameter $D_3$ of the opening OP1 in the resist layer SR1 to be smaller than or equal to 0.8 times diameter $D_1$ of the pillar electrode PL (i.e., $D_3 \leq D_1 \times 0.8$). It is possible to more reliably prevent the solder configuring the solder layer SD1 from rising over the side surface of the pillar electrode PL if diameter $D_3$ of the opening OP1 in the resist layer SR1 is set to be smaller than or equal to 0.8 times diameter $D_1$ of the pillar electrode PL ($D_3 \leq D_1 \times 0.8$).

Decreasing diameter $D_3$ of the opening OP1 in the resist layer SR1 also decreases the diameter of part of the solder layer SD embedded in the opening OP1 in the resist layer SR1 and increases the current density at the part of the solder layer SD embedded in the opening OP1 in the resist layer SR1. It is unfavorable to increase the current density at the part of the solder layer SD embedded in the opening OP1 in the resist layer SR1 because the solder layer SD easily degrades (e.g., due to electromigration) and the EM lifetime may decrease. It is effective to avoid excessively decreasing diameter $D_3$ of the opening OP1 in the resist layer SR1 in order to suppress or prevent the solder layer SD from degrading due to an increased current density. Decreasing a ratio of diameter $D_3$ of the opening OP1 in the resist layer SR1 to diameter $D_1$ of the pillar electrode PL (i.e., $D_3/D_1$) forms a constricted part of the solder layer SD at a position in contact with a corner formed by the upper surface SR1$a$ of the resist layer SR1 and the inner wall (side wall) of the opening OP1 in the resist layer SR1 and increases a risk of cracking the solder layer SD from the constricted part as a start point. It is effective to avoid excessively decreasing the ratio of diameter $D_3$ of the opening OP1 in the resist layer SR1 to diameter $D_1$ of the pillar electrode PL (i.e., $D_3/D_1$) in order to suppress or prevent the solder layer SD from cracking. Namely, it is effective to avoid excessively decreasing diameter $D_3$ of the opening OP1 in the resist layer SR1 in order to suppress or prevent the solder layer SD from degrading or cracking.

As the sixth feature, the opening OP1 in the resist layer SR1 is contained in the pillar electrode PL in a plan view (diameter $D_3$ of the opening OP1 is smaller than diameter $D_1$ of the pillar electrode PL) and it is particularly favorable to set diameter $D_3$ of the opening OP1 in the resist layer SR1 to be larger than or equal to 0.7 times diameter $D_1$ of the pillar electrode PL and smaller than or equal to 0.8 times the same (i.e., $D_1 \times 0.7 \leq D_3 \leq D_1 \times 0.8$). Namely, it is particularly favorable to set the ratio of diameter $D_3$ of the opening OP1 in the resist layer SR1 to diameter $D_1$ of the pillar electrode PL (i.e., $D_3/D_1$) to be larger than or equal to 0.7 and smaller than or equal to 0.8 (i.e., $0.7 \leq D_3/D_1 \leq 0.8$). It is possible to more reliably prevent the solder configuring the solder layer SD1 from rising over the side surface of the pillar electrode PL and prevent the solder layer SD from degrading or cracking. The reliability of the semiconductor device can improve more unfailingly.

According to the example illustrated in FIG. 39, the terminal TE has the rectangular (quadrangular) planar shape, but is not limited thereto. The terminal TE may have a circular planar shape.

The seventh feature of the embodiment is that the semiconductor substrate SB configuring the semiconductor chip CP is 25 to 300 µm thick. The description below explains why satisfying the seventh feature is favorable.

The semiconductor chip CP is hardly deformed if the semiconductor substrate SB configuring the semiconductor chip CP is thick. Contrastingly, the semiconductor chip CP is easily deformed if the semiconductor substrate SB configuring the semiconductor chip CP is thin. Deformation of the semiconductor chip CP can absorb a stress applied to the interlayer insulation films (IL1 through IL6) configuring the wiring structure of the semiconductor chip CP. Thinning the semiconductor substrate SB therefore decreases a stress applied from the pillar electrode PL to the interlayer insulation films (IL1 through IL6) below the pillar electrode PL. From this viewpoint, the semiconductor substrate SB configuring the semiconductor chip CP is ideally thin such as 300 µm or less. Excessively thinning the semiconductor substrate SB increases a risk of breaking the semiconductor substrate SB. The thickness of the semiconductor substrate SB is ideally 25 µm or more.

The seventh feature ideally assumes that the thickness of the semiconductor substrate SB configuring the semiconductor chip CP ranges from 25 to 300 µm. It is possible to absorb a stress applied from the pillar electrode PL to the interlayer insulation films (IL1 through IL6) below the pillar electrode PL by using deformation of the semiconductor chip CP and reliably prevent the semiconductor substrate SB from being broken. The reliability of the semiconductor device can improve. The semiconductor device can be easily manufactured. The fabrication yield of the semiconductor device can improve.

Figure 40:
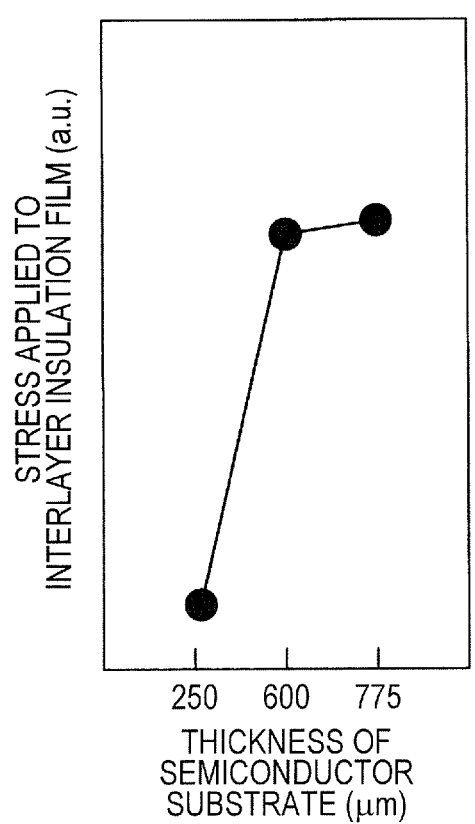
FIG. 40 is a graph illustrating a result of simulating correlation between a semiconductor substrate thickness and a stress applied from a pillar electrode to an interlayer insulation film.

FIG. 40 is a graph representing results of simulating the correlation between the thickness (horizontal axis in FIG. 40) of the semiconductor substrate configuring the semiconductor chip and the stress (vertical axis in FIG. 40) applied from the pillar electrode to the interlayer insulation film below the pillar electrode. As seen from the graph in FIG. 40, thinning the semiconductor substrate configuring the semiconductor chip can decrease the stress applied from the pillar electrode to the interlayer insulation film below the pillar electrode. The thickness of the semiconductor substrate SB configuring the semiconductor chip CP is ideally 300 µm or less.

The eighth feature of the embodiment is that the opening OP3 (the opening OP3$b$ of the resin film PA2) of the insulation film PA has a circular planar shape. It is more favorable if the pillar electrode PL has a circular planar shape. The description below explains why satisfying the eighth feature is favorable.

The opening OP3 (the opening OP3$b$ of the resin film PA2) of the insulation film PA can have various planar shapes such as rectangular (quadrangular), polygonal other than rectangular, and circular. Of these, the circular planar shape is particularly favorable. Part of the pillar electrode PL embedded in the opening OP3 (the opening OP3b of the resin film PA2) of the insulation film PA is columnar when the opening OP3 (the opening OP3b of the resin film PA2) of the insulation film PA has the circular planar shape. The pillar electrode PL thereby hardly causes an anisotropic stress. It is possible to prevent occurrence of a phenomenon that concentrates a stress at corners of the pillar electrode PL. This effect further increases when the pillar electrode PL has a circular planar shape. It is possible to decrease a stress applied from the pillar electrode PL to the interlayer insulation films (IL1 through IL6) below the pillar electrode PL. It is therefore possible to suppress or prevent the interlayer insulation film positioned below the pillar electrode PL from being damaged due to a stress from the pillar electrode PL. The reliability of the semiconductor device can improve.

The semiconductor chip CP has the wiring structure including a plurality of wiring layers. The embodiment is very effective when the wiring structure of the semiconductor chip CP includes a low-dielectric insulation film. The reason follows.

As above, fine wiring is recently required inside the semiconductor chip, increasing the parasitic capacitance between adjacent wirings and possibly causing a signal delay or increased power consumption. It is favorable to decrease the parasitic capacitance between adjacent wirings by using the low-dielectric insulation film for interlayer insulation films configuring the wiring structure of the semiconductor chip. The performance of the semiconductor device can thereby improve. However, the low-dielectric insulation film features a smaller dielectric constant than an oxide silicon film but easily tends to be lower in intensity than an oxide silicon film. Applying a stress from the pillar electrode PL to the interlayer insulation film below the pillar electrode PL increases a risk of damaging the interlayer insulation film when the low-dielectric insulation film is used as the interlayer insulation film included in the wiring structure. Namely, the low-dielectric insulation film is less resistant to a stress from the pillar electrode PL.

Owing to the above-mentioned features (first through eighth features), the embodiment decreases a stress applied from the pillar electrode PL to the interlayer insulation films (IL1 through IL6) below the pillar electrode PL. It is therefore possible to suppress or prevent an occurrence of damage to the interlayer insulation film made of the low-dielectric insulation film due to a stress from the pillar electrode PL even when a low-dielectric insulation film less resistant to a stress is used for the interlayer insulation film included in the wiring structure. Applying the embodiment to the case of including the low-dielectric insulation film in the wiring structure of the semiconductor chip CP can provide an effect of decreasing the parasitic capacitance between adjacent wirings in the semiconductor chip CP and suppress or prevent an occurrence of damage to the low-dielectric insulation film due to a stress from the pillar electrode PL. It is therefore possible to improve the performance and the reliability of the semiconductor device. The same is applicable to the ninth feature and the tenth feature to be described.

Figure 41:
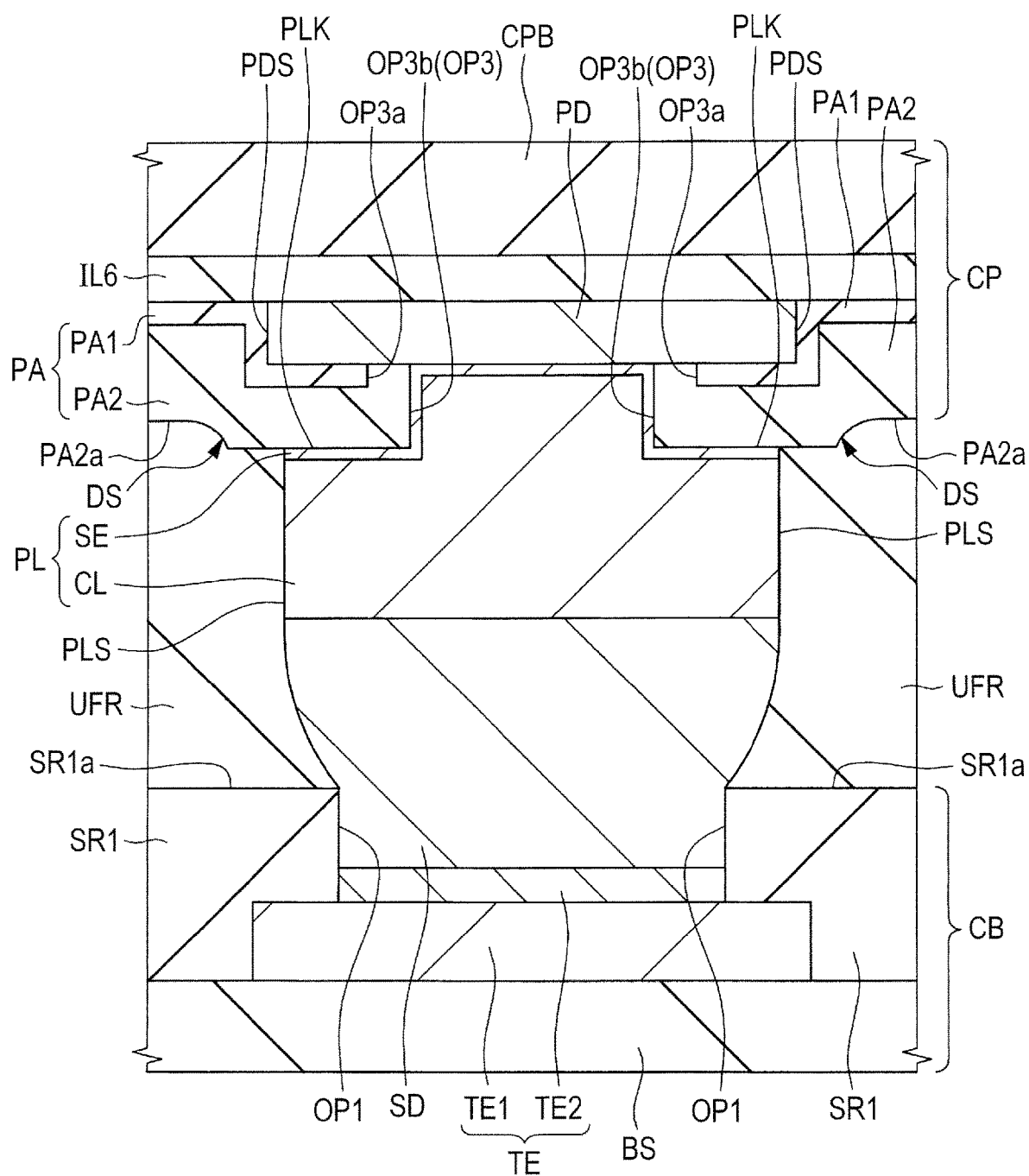
FIG. 41 is a partially sectional view of the semiconductor device according to a first modification.
Figure 42:
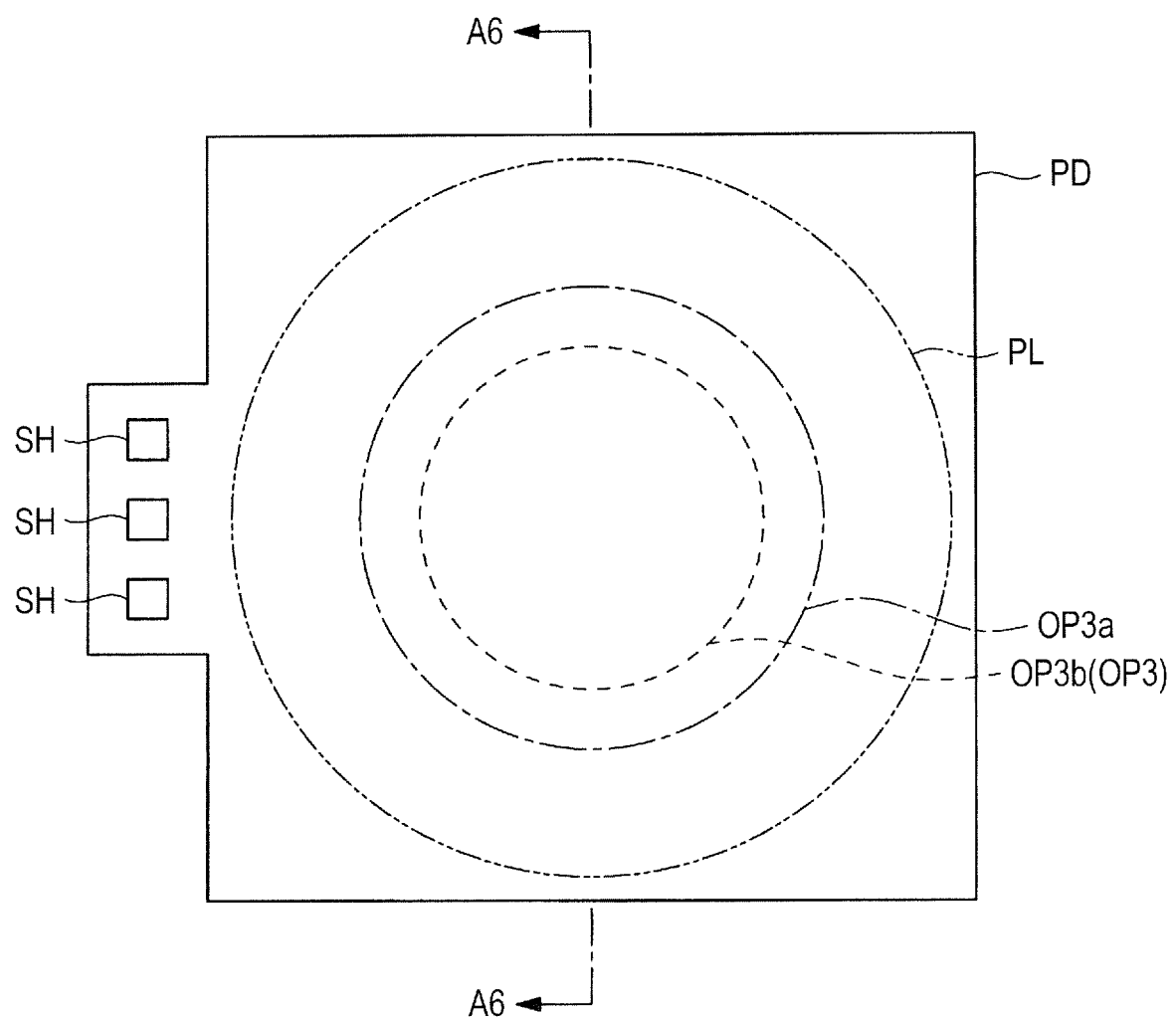
FIG. 42 is a partial plan view of the semiconductor device according to the first modification.
Figure 43:
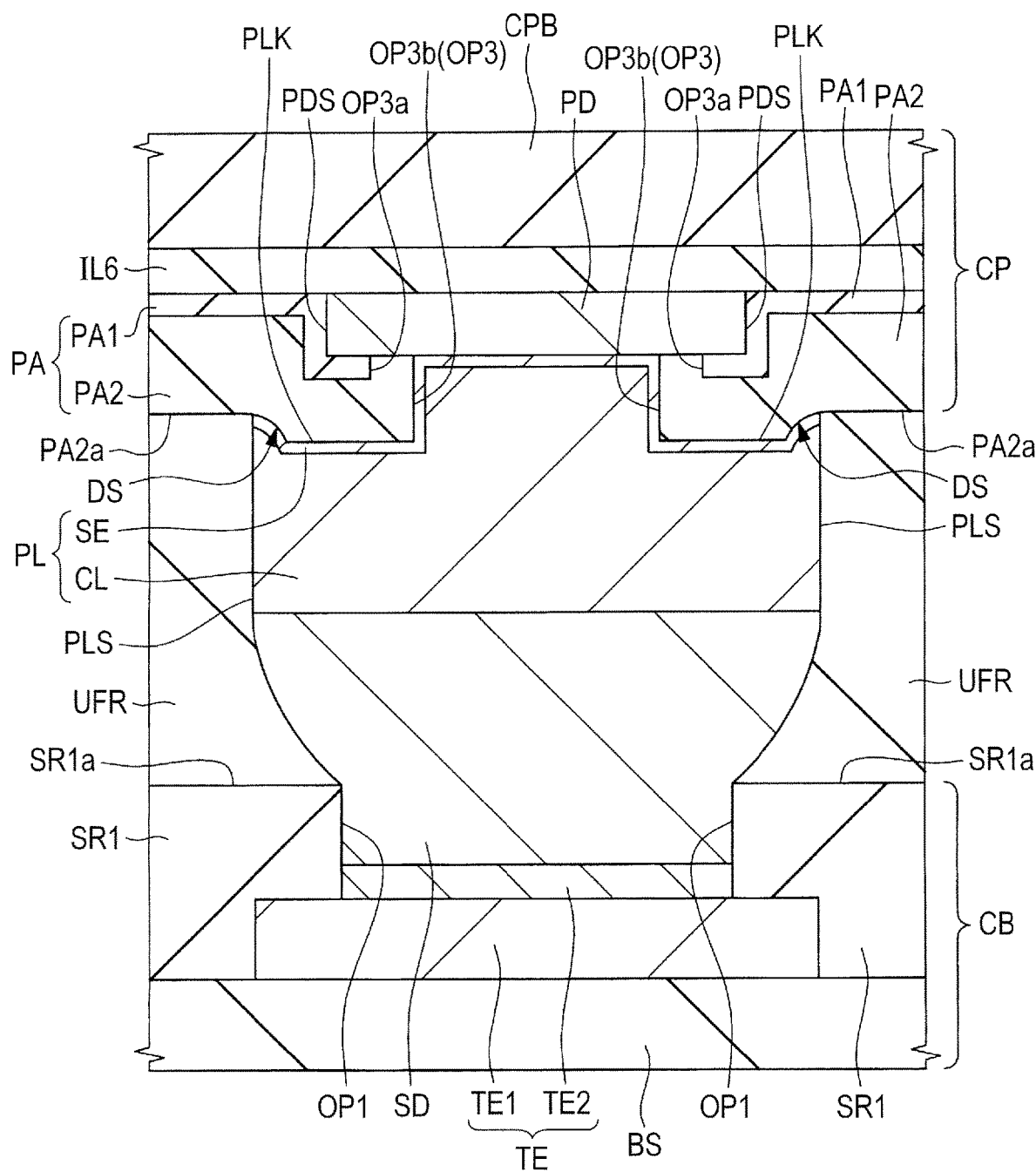
FIG. 43 is an explanatory diagram illustrating an effect of the semiconductor device according to the first modification.

The first modification of the embodiment will be described. FIGS. 41 and 42 are a partially sectional view (FIG. 41) and a partial plan view (FIG. 42) of the semiconductor device PKG according to the first modification of the embodiment. FIG. 41 provides a sectional view (partially enlarged sectional view) of the region corresponding to FIG. 7 above. FIG. 42 provides a plan view corresponding to FIG. 21 above. FIG. 41 approximately corresponds to the sectional view taken along line A6-A6 of FIG. 42. FIG. 43 is an explanatory diagram illustrating an effect of the semiconductor device according to the first modification and provides a sectional view of the region corresponding to FIG. 7 above.

The semiconductor device according to the first modification illustrated in FIGS. 41 and 42 mainly differs from the semiconductor device in FIG. 7 above in that the semiconductor device according to the first modification has the ninth feature.

Namely, the ninth feature assumes that the pad PD contains the pillar electrode PL in a plan view concerning the pad PD and the pillar electrode PL formed over the pad PD in a plan view. The pillar electrode PL is contained in the pad PD and does not extend beyond the pad PD in a plan view. In other words, the ninth feature assumes that a side surface (outer periphery) PDS of the pad PD of the semiconductor chip CP is positioned equally to a side surface PLS of the pillar electrode PL or is positioned outside the side surface PLS of the pillar electrode PL in a plan view. The side to leave the opening OP3 in the insulation film PA is assumed to be outside and the side to approach the opening OP3 in the insulation film PA is assumed to be inside in a plan view.

The side surface PLS of the pillar electrode PL corresponds to the side surface of part of the pillar electrode PL positioned over the upper surface PA2a of the insulation film PA (i.e., the part being raised over the upper surface PA2a of the insulation film PA). The side surface PLS of the pillar electrode PL overlaps with the resin film PA2 and is placed in contact with the resin portion UFR in a plan view. Namely, the side surface PLS of the pillar electrode PL is placed in contact with the resin portion UFR.

The description below explains effects of the ninth feature with reference to FIGS. 41 and 43.

An uneven base may be included in the insulation film when formed. The insulation film may reflect the unevenness of the base and may also become uneven. The insulation film PA is formed so as to expose part (the center) of the upper surface of the pad PD from the opening OP3 and cover the outer periphery and the side surface of the upper surface of the pad PD. The side surface PDS of the pad PD may cause an unevenness DS to be formed over the upper surface PA2a of the insulation film PA. FIGS. 41 and 43 each illustrate the unevenness DS formed over the upper surface PA2a of the insulation film PA due to the side surface PDS of the pad PD. In comparison with FIG. 41 and FIG. 43, FIG. 41 provides a larger plane size (plane area) of the pad PD than FIG. 43. In FIG. 41, the side surface PDS of the pad PD does not overlap with the pillar electrode PL in a plan view. In FIG. 43, the side surface PDS of the pad PD overlaps with the pillar electrode PL in a plan view.

In FIG. 43, the unevenness DS due to the side surface PDS of the pad PD is formed over the upper surface PA2a of the insulation film PA. The pillar electrode PL exists over the unevenness DS. In FIG. 43, the pillar electrode PL exists to cover the region outside the unevenness DS in the upper surface PA2a of the insulation film PA. In this case (FIG. 43), a lower surface PLK of the pillar electrode PL in contact with the insulation film PA is not flat but is shaped so as to reflect the unevenness DS. Specifically, the lower surface PLK of the pillar electrode PL is shaped so that a region near the edge of the lower surface PLK is protruded (pointed) toward the side approaching the semiconductor chip CP. The lower surface PLK of the pillar electrode PL corresponds to the surface that is assigned reference symbol PLK and is positioned in contact with the upper surface PA2a of the insulation film PA in the pillar electrode PL.

The region near the edge of the lower surface PLK of the pillar electrode PL presses the insulation film PA during a temperature cycle (alternately repeating a high-temperature state and a low-temperature state) when the lower surface PLK of the pillar electrode PL is shaped as illustrated in FIG. 43. A stress is then applied to the pad PD or the interlayer insulation film of the semiconductor chip CP, easily deforming the pad PD or damaging the interlayer insulation film.

Regarding the lower surface PLK of the pillar electrode PL in contact with the insulation film PA, flattening the lower surface PLK to its edge is effective in suppressing deformation of the pad PD or damage to the interlayer insulation film due to a stress from the pillar electrode PL. This requires preventing the unevenness DS of the insulation film PA, if any, from affecting the shape of the lower surface PLK of the pillar electrode PL. This can be done by designing the pad PD and the pillar electrode PL so that no pillar electrode PL exists over the unevenness DS of the insulation film PA and the side surface PLS of the pillar electrode PL is positioned inside the unevenness DS in a plan view.

The unevenness DS of the insulation film PA results from the side surface PDS of the pad PD. The unevenness DS of the insulation film PA is always positioned outside the side surface PDS of the pad PD from the viewpoint of planar position relation between the unevenness DS of the insulation film PA and the side surface PDS of the pad PD. As above, the side to leave the opening OP3 in the insulation film PA is assumed to be outside and the side to approach the opening OP3 in the insulation film PA is assumed to be inside in a plan view. The pillar electrode PL therefore needs to be contained in the pad PD so as not to extend beyond the pad PD in a plan view. The side surface PLS of the pillar electrode PL is then inevitably positioned inside the unevenness DS of the insulation film PA in a plan view. No pillar electrode PL exists over the unevenness DS of the insulation film PA. It is possible to flatten the lower surface PLK to its edge regarding the lower surface PLK of the pillar electrode PL in contact with the insulation film PA even when the insulation film PA includes the unevenness DS as illustrated in FIG. 41.

If the above-mentioned ninth feature is satisfied, the shape of the lower surface PLK of the pillar electrode PL is unaffected by the unevenness DS that may occur in the insulation film PA due to the side surface PDS of the pad PD. It is possible to flatten the lower surface PLK to its edge regarding the lower surface PLK of the pillar electrode PL in contact with the insulation film PA (see FIG. 41). Compared to FIG. 43, FIG. 41 illustrates the flat lower surface PLK of the pillar electrode PL, making it possible to absorb a stress applied from the lower surface PLK of the pillar electrode PL to the pad PD of the semiconductor chip CP or the interlayer insulation film during the temperature cycle. It is possible to suppress deformation of the pad PD or damage to the interlayer insulation film. Satisfying the ninth feature can therefore suppress or prevent deformation of the pad PD or an occurrence of damage to the interlayer insulation film due to a stress from the pillar electrode PL during the temperature cycle. The reliability of the semiconductor device can thereby improve.

The ninth feature can be combined with one or more of the first through eighth features above.

Figure 44:
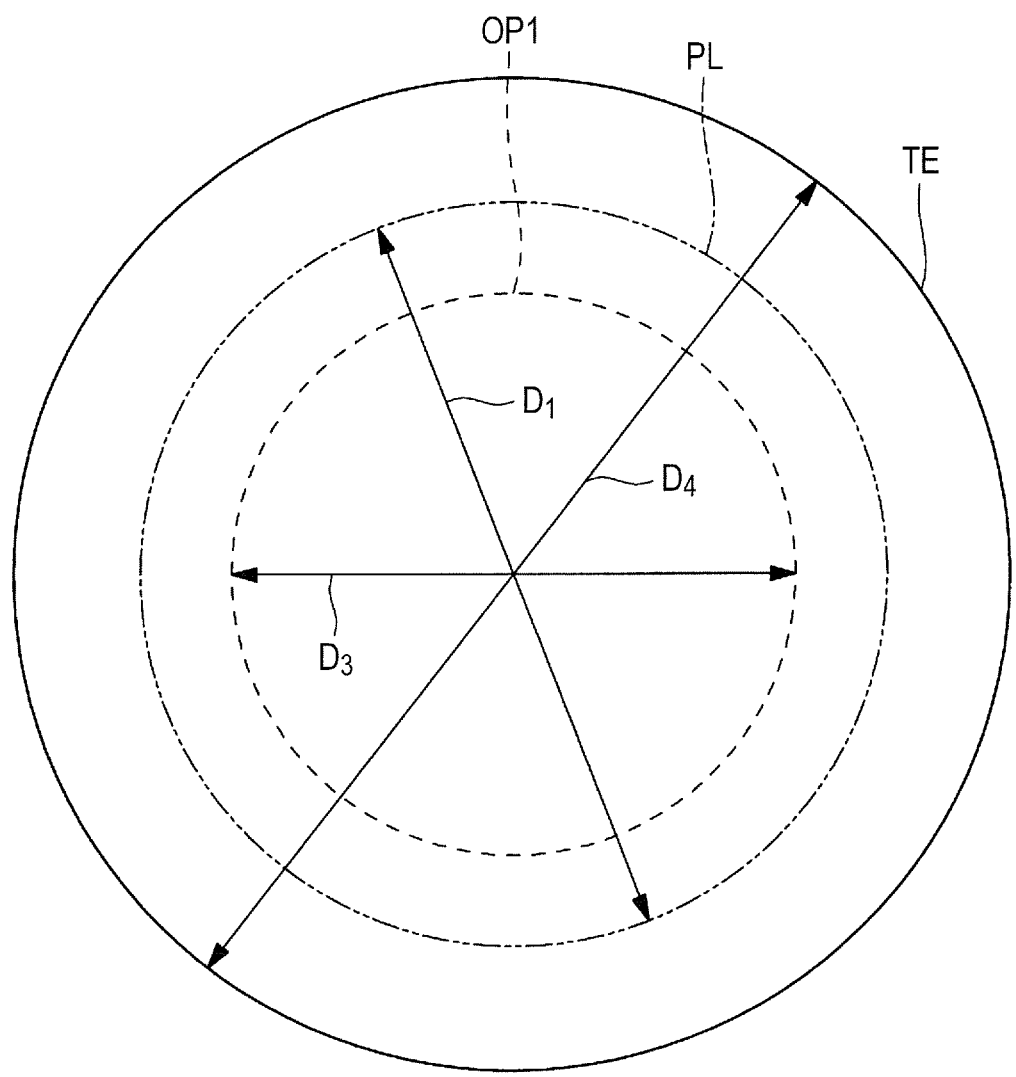
FIG. 44 is a partial plan view of the semiconductor device according to a second modification.

The first modification of the embodiment will be described. FIG. 44 is a partial plan view of the semiconductor device PKG according to the second modification of the embodiment and corresponds to FIG. 39 above. FIG. 44 illustrates a planar layout of the terminal of the printed circuit board CB, the opening OP1 in the resist layer SR1, and the pillar electrode PL in the semiconductor device PKG according to the second modification. The sectional view of the semiconductor device PKG according to the second modification is basically the same as FIGS. 6 and 7.

The semiconductor device in FIG. 44 according to the second modification has the tenth feature. The tenth feature satisfies the relation of $1.5 \leq D_4/D_3 \leq 2$.

As above, $D_3$ denotes the diameter of the opening OP1 in the resist layer SR1. $D_4$ denotes the diameter of the terminal TE. The terminal TE includes the copper layer TE1 and the nickel layer TE2 over the copper layer TE1. The nickel layer TE2 is contained in the copper layer TE1 in a plan view. The diameter $D_4$ corresponds to the diameter of the copper layer TE1 configuring the terminal TE. According to the second modification as illustrated in FIG. 44, the terminal TE, namely, the copper layer TE1 configuring the terminal TE has a circular planar shape. The opening OP1 in the resist layer SR1 has a circular planar shape also in FIG. 44 similarly to FIG. 39. The nickel layer TE2 configuring the terminal TE is formed over part of the copper layer TE1 exposed from the opening OP1 in the resist layer SR1. The opening OP1 in the resist layer SR1 and the nickel layer TE2 configuring the terminal TE actually have the same planar shape and the same plane size.

The description below explains reasons and effects of using the tenth feature.

The adhesion force between the resist layer SR1 and the terminal TE (copper layer TE1) is not so strong. Decreasing a contact area between the resist layer SR1 and the terminal TE (copper layer TE1) decreases the adhesiveness (adherence property) between the resist layer SR1 and the terminal TE (copper layer TE1). Separation is liable to occur between the resist layer SR1 and the terminal TE at the boundary face. Separation between the resist layer SR1 and the terminal TE at the boundary face may degrade the reliability of the semiconductor device and is therefore unfavorable.

It is therefore favorable to increase the contact area between the resist layer SR1 and the terminal TE (copper layer TE1) to an extent and possibly prevent the separation from occurring between the resist layer SR1 and the terminal TE at the boundary face. Increasing the diameter $D_4$ of the terminal TE or decreasing the diameter $D_3$ of the opening OP1 in the resist layer SR1 increases the contact area between the terminal TE (copper layer TE1) and the resist layer SR1. This corresponds to increasing the ratio of the diameter $D_4$ of the terminal TE to the diameter $D_3$ of the opening OP1 in the resist layer SR1 ($D_4/D_3$).

Decreasing $D_4/D_3$ decreases the contact area between the resist layer SR1 and the terminal TE (copper layer TE1). Separation may occur between the resist layer SR1 and the terminal TE at the boundary face. Preventing $D_4/D_3$ from excessively decreasing is effective in suppressing or preventing the separation.

Decreasing the diameter $D_3$ of the opening OP1 in the resist layer SR1 also decreases the diameter of part of the solder layer SD embedded in the opening OP1 in the resist layer SR1, increasing the current density in part of the solder layer SD embedded in the opening OP1 in the resist layer SR1. It is unfavorable to increase the current density in part of the solder layer SD embedded in the opening OP1 in the resist layer SR1 because the solder layer SD easily degrades (e.g., due to electromigration) and the EM lifetime may decrease. Preventing the diameter $D_3$ of the opening OP1 in the resist layer SR1 from excessively decreasing is effective in suppressing or preventing degradation of the solder layer SD due to an increased current density.

Increasing the diameter $D_4$ of the terminal TE increases the arrangement pitch for the terminal TE or narrows an interval between adjacent terminals TE. Increasing the arrangement pitch for the terminal TE accordingly increases the arrangement pitch for the pad PD of the semiconductor chip CP. However, this contradicts miniaturization and multiterminal configuration of the semiconductor chip CP and is therefore unfavorable. Narrowing an interval between adjacent terminals TE makes it difficult to place a wire between adjacent terminals TE in the printed circuit board CB, causes a restriction on the wiring layout of the printed circuit board CB, and is unfavorable. Preventing the diameter $D_4$ of the terminal TE from excessively increasing is effective in controlling the arrangement pitch for the terminal TE and reducing restrictions on the wiring layout for the printed circuit board CB.

Increasing the diameter $D_4$ of the terminal TE and decreasing the diameter $D_3$ of the opening OP1 in the resist layer SR1 likewise increase the ratio of the diameter $D_4$ of the terminal TE to the diameter $D_3$ of the opening OP1 in the resist layer SR1 ($D_4/D_3$).

Preventing $D_4/D_3$ from excessively increasing is therefore effective in suppressing or preventing degradation of the solder layer SD due to an increased current density, controlling the arrangement pitch for the terminal TE, and reducing restrictions on the wiring layout for the printed circuit board CB.

The second modification uses the above-mentioned tenth feature and satisfies the relation of $1.5 \leq D_4/D_3 \leq 2$. Satisfying the relation of $1.5 \leq D_4/D_3 \leq 2$ can ensure the contact area between the resist layer SR1 and the terminal TE, increase the adhesiveness between the resist layer SR1 and the terminal TE, and possibly prevent the separation from occurring between the resist layer SR1 and the terminal TE at the boundary face. Satisfying the relation of $D_4/D_3 \leq 2$ can suppress or prevent degradation of the solder layer SD due to an increased current density, control the arrangement pitch for the terminal TE, and reduce restrictions on the wiring layout for the printed circuit board CB. Satisfying the relation of $1.5 \leq D_4/D_3 \leq 2$ can improve the reliability of the semiconductor device, profit miniaturization (area reduction) and multiterminal configuration of the semiconductor chip CP, and improve the degree of freedom of wiring layout for the printed circuit board CB.

There has been described that the above-mentioned sixth feature ideally satisfies the relation of $D_1 \times 0.7 \leq D_3 \leq D_1 \times 0.8$. Suppose this relation is combined with the relation of $1.5 \leq D_4/D_3 \leq 2$ as the tenth feature. The diameter $D_4$ of the terminal TE and the diameter $D_1$ of the pillar electrode PL then ideally satisfy the relation of $1.05 \leq D_4/D_1 \leq 1.6$.

The tenth feature can be combined with one or more of the first through ninth features above.

FIG. 44 illustrates the terminal TE having a circular planar shape. The use of a circular planar shape for the terminal TE can provide the following effects.

Namely, the use of a circular planar shape for the terminal TE can effectively increase an interval between adjacent terminals TE. For example, suppose the terminal TE having the circular planar shape and the terminal TE having the rectangular planar shape are compared and have the same arrangement pitch for the terminal TE. The terminal TE having the circular planar shape then provides a wider interval between adjacent terminals TE than the terminal TE having the rectangular planar shape. The use of the circular planar shape for the terminal TE can efficiently increase the interval between adjacent terminals TE and easily place a wire between adjacent terminals TE in the printed circuit board CB. It is possible to moreover improve the degree of freedom of wiring layout for the printed circuit board CB.

The use of the circular opening OP1 in the resist layer SR1 can possibly prevent the solder layer SD from generating an anisotropic stress and prevent an occurrence of phenomenon that concentrates a stress at corners of the solder layer SD. It is possible to easily prevent the solder layer SD from degrading or cracking.

The description below supplements the use of the nickel layer NL for the pillar electrode PL. FIGS. 7 and 35 illustrates no nickel layer (nickel-plated layer) intervening between the copper layer CL and the solder layer SD. The pillar electrode PL is formed by the seed layer SE and the copper layer CL over the seed layer SE. Alternatively, as described with reference to FIG. 36 above, the pillar electrode PL can be also formed by the seed layer SE, the copper layer CL over the seed layer SE, and the nickel layer NL over the copper layer CL. In this case, the nickel layer NL intervenes between the copper layer CL and the solder layer SD.

However, the EM lifetime can improve when the pillar electrode PL does not include the nickel layer NL as illustrated in FIGS. 7 and 35 and no nickel layer (NL) intervenes between the copper layer CL and the solder layer SD compared to the case (FIG. 36) where the pillar electrode PL includes the nickel layer NL. The possible reason follows.

The description below explains an EM test applied to the semiconductor device (corresponding to the semiconductor device using the pillar electrode PL in FIG. 36) including the nickel layer NL intervening between the copper layer CL and the solder layer SD configuring the pillar electrode PL. In this case, nickel (Ni) diffuses from the nickel layer TE2 configuring the terminal TE to the solder layer SD. EM open failures occur between the nickel layer TE2 and the solder layer SD. This is a primary factor affecting the EM lifetime.

The description below explains an EM test applied to the semiconductor device (corresponding to the semiconductor device using the pillar electrode PL in FIG. 35) including no nickel layer (NL) between the copper layer CL and the solder layer SD configuring the pillar electrode PL. In this case, thermal diffusion of copper (Cu) from the copper layer CL causes a CuSn layer to be formed over the nickel layer TE2 configuring the terminal TE. The CuSn layer functions as a barrier layer against the diffusion of nickel (Ni) from the nickel layer TE2 to the solder layer SD. An EM open failure therefore hardly occurs between the nickel layer TE2 configuring the terminal TE and the solder layer SD. In this case, the EM open failure occurs between the copper layer CL configuring the pillar electrode PL and the solder layer SD, not between the nickel layer TE2 configuring the terminal TE and the solder layer SD, and equates with a primary factor of affecting the EM lifetime. The EM lifetime improves (e.g., by approximately 25%) compared to the semiconductor device using the pillar electrode PL in FIG. 36.

The EM lifetime can improve when the pillar electrode PL does not include the nickel layer NL to prevent the nickel layer (NL) from intervening between the copper layer CL configuring the pillar electrode PL and the solder layer SD. The reliability of the semiconductor device can moreover improve.

While there has been described the invention developed by the inventors based on specific preferred embodiments, it is to be distinctly understood that the present invention is not limited to the embodiments but may be otherwise variously embodied within the spirit and scope of the invention.

The description below explains part of the contents described in the above-mentioned embodiments (including the modifications).

Additional Statement 1

A semiconductor device includes a printed circuit board and a semiconductor chip mounted over the printed circuit board.

The semiconductor chip includes:
a first insulation film;
a pad formed over the first insulation film;
a second insulation film that is formed over the first insulation film and includes a first opening exposing part of the pad; and
a pillar electrode formed over the pad exposed from the first opening.

The printed circuit board includes:
a terminal; and
a third insulation film including a second opening to expose part of the terminal.

The second insulation film of the semiconductor chip includes a first principal surface facing the printed circuit board.

The third insulation film of the printed circuit board includes a second principal surface facing the semiconductor chip.

The pillar electrode contains the first opening and part of the pillar electrode overlaps with the second insulation film in a plan view.

The pillar electrode of the semiconductor chip is coupled to the terminal of the printed circuit board via a solder layer intervening between the pillar electrode and the terminal.

The second opening is contained in the pillar electrode in a plan view.

A third diameter of the second opening is larger than or equal to 0.7 times a first diameter of the pillar electrode and is smaller than or equal to 0.8 times the same.

Additional Statement 2

A semiconductor device includes a printed circuit board and a semiconductor chip mounted over the printed circuit board.

The semiconductor chip includes:
a first insulation film;
a pad formed over the first insulation film;
a second insulation film that is formed over the first insulation film and includes a first opening exposing part of the pad; and
a pillar electrode formed over the pad exposed from the first opening.

The printed circuit board includes:
a terminal; and
a third insulation film having a second opening exposing part of the terminal.

The second insulation film of the semiconductor chip includes a first principal surface facing the printed circuit board.

The third insulation film of the printed circuit board includes a second principal surface facing the semiconductor chip.

The pillar electrode contains the first opening and part of the pillar electrode overlaps with the second insulation film in a plan view.

The pillar electrode of the semiconductor chip and the terminal of the printed circuit board are coupled via a solder layer intervening between the pillar electrode and the terminal.

The pad contains the pillar electrode in a plan view.

Additional Statement 3

A semiconductor device includes a printed circuit board and a semiconductor chip mounted over the printed circuit board.

The semiconductor chip includes:
a first insulation film;
a pad formed over the first insulation film;
a second insulation film that is formed over the first insulation film and includes a first opening exposing part of the pad; and
a pillar electrode formed over the pad exposed from the first opening.

The printed circuit board includes:
a terminal; and
a third insulation film having a second opening exposing part of the terminal.

The second insulation film of the semiconductor chip includes a first principal surface facing the printed circuit board.

The third insulation film of the printed circuit board includes a second principal surface facing the semiconductor chip.

The pillar electrode contains the first opening and part of the pillar electrode overlaps with the second insulation film in a plan view.

The pillar electrode of the semiconductor chip and the terminal of the printed circuit board are coupled via a solder layer intervening between the pillar electrode and the terminal.

Relation of $1.5 \leq D_4/D_3 \leq 2$ is satisfied when $D_3$ signifies a diameter of the second opening in the third insulation film and $D_4$ signifies a diameter of the terminal.

What is claimed is:

1. A semiconductor device comprising:
a printed circuit board; and
a semiconductor chip mounted over the printed circuit board,
wherein the semiconductor chip includes:
a first insulation film;
a pad formed over the first insulation film;
a second insulation film formed over the first insulation film and including a first opening exposing a part of the pad; and
a pillar electrode formed over the pad exposed from the first opening,
wherein the printed circuit board includes:
a terminal; and
a third insulation film including a second opening exposing a part of the terminal,
wherein the second insulation film of the semiconductor chip includes a first principal surface facing the printed circuit board,
wherein the third insulation film of the printed circuit board includes a second principal surface facing the semiconductor chip,
wherein, in a plan view, the first opening of the second insulation film is inside a footprint of the pillar electrode and a part of the pillar electrode overlaps with the second insulation film,
wherein the pillar electrode of the semiconductor chip and the terminal of the printed circuit board are coupled to each other via a solder layer intervening between the pillar electrode and the terminal,
wherein a first thickness of the pillar electrode from the first principal surface is greater than or equal to half a second thickness of the solder layer from the second principal surface and is smaller than or equal to the second thickness, wherein a second diameter of the first opening is larger than or equal to 0.4 times a first diameter of the pillar electrode and is smaller than or equal to 0.75 times the first diameter, wherein the second insulation film has a laminate structure comprised of:
an inorganic insulation film formed on the first insulation film; and
a resin film, on which the pillar electrode is formed, formed on the inorganic insulation film without intervening wirings therebetween in a cross section view, wherein the inorganic insulation film includes a third opening, wherein the resin film includes a fourth opening, wherein, in the plan view, the fourth opening of the resin film is inside the third opening of the inorganic insulation film, and wherein the first opening of the second insulation film is the fourth opening of the resin film.

2. The semiconductor device according to claim 1, wherein the sum of the first thickness and the second thickness is greater than or equal to 0.5 times a first diameter of the pillar electrode and is smaller than or equal to 0.8 times the first diameter.

3. The semiconductor device according to claim 1, wherein the pillar electrode is placed in contact with the resin film but is not placed in contact with the inorganic insulation film.

4. The semiconductor device according to claim 1, wherein the resin film is available as a polyimide resin film.

5. The semiconductor device according to claim 4, wherein the inorganic insulation film is made of one of a silicon nitride film and a silicon oxynitride film.

6. The semiconductor device according to claim 1, wherein the resin film equates to an insulation film at an uppermost layer of the semiconductor chip.

7. The semiconductor device according to claim 1, wherein a third thickness of the resin film between the pad and the pillar electrode is greater than a fourth thickness of the pad and is smaller than the first thickness.

8. The semiconductor device according to claim 1, wherein the first opening has a circular planar shape.

9. The semiconductor device according to claim 8, wherein the pillar electrode has a circular planar shape.

10. The semiconductor device according to claim 1, wherein a third diameter of the second opening is smaller than a first diameter of the pillar electrode in the plan view.

11. The semiconductor device according to claim 1, wherein, in the plan view, the second opening of the third insulation film is inside the footprint of the pillar electrode.

12. The semiconductor device according to claim 1,
wherein the semiconductor chip includes a semiconductor substrate, and
wherein a fifth thickness of the semiconductor substrate is 25 to 300 μm.

13. The semiconductor device according to claim 1, wherein the pillar electrode equates to a Cu pillar electrode mainly made of copper.

14. The semiconductor device according to claim 1, further comprising:
a resin portion filled in between the printed circuit board and the semiconductor chip.

15. The semiconductor device according to claim 1,
wherein the semiconductor chip has a wiring structure including a plurality of wiring layers, and
wherein the wiring structure includes a low-dielectric insulation film.

16. The semiconductor device according to claim 1, wherein the third insulation film equates to an insulation film at an uppermost layer of the printed circuit board.

17. The semiconductor device according to claim 1, wherein the third insulation film equates to a solder resist layer.

18. A semiconductor device comprising:
a printed circuit board; and
a semiconductor chip mounted over the printed circuit board,
wherein the semiconductor chip includes:
a first insulation film;
a pad formed over the first insulation film;
a second insulation film formed over the first insulation film and including a first opening exposing a part of the pad; and
a pillar electrode formed over the pad exposed from the first opening,
wherein the printed circuit board includes:
a terminal; and
a third insulation film including a second opening exposing a part of the terminal,
wherein the second insulation film of the semiconductor chip includes a first principal surface facing the printed circuit board,
wherein the third insulation film of the printed circuit board includes a second principal surface facing the semiconductor chip,
wherein, in a plan view, the first opening of the second insulation film is inside a footprint of the pillar electrode and a part of the pillar electrode overlaps with the second insulation film,
wherein the pillar electrode of the semiconductor chip and the terminal of the printed circuit board are coupled to each other via a solder layer intervening between the pillar electrode and the terminal,
wherein a first thickness of the pillar electrode from the first principal surface is greater than or equal to half a second thickness of the solder layer from the second principal surface and is smaller than or equal to the second thickness,
wherein the sum of the first thickness and the second thickness is greater than or equal to 0.5 times a first diameter of the pillar electrode and is smaller than or equal to 0.8 times the first diameter,
wherein a second diameter of the first opening is greater than or equal to 0.4 times a first diameter of the pillar electrode and is smaller than or equal to 0.75 times the first diameter,
wherein the second insulation film has a laminate structure comprised of:
an inorganic insulation film formed on the first insulation film; and
a resin film, on which the pillar electrode is formed, formed on the inorganic insulation film without intervening wirings therebetween in a cross section view,
wherein the inorganic insulation film includes a third opening,
wherein the resin film includes a fourth opening,
wherein, in the plan view, the fourth opening is inside the third opening, and wherein the first opening of the second insulation film is the fourth opening of the resin film.

* * * * *